(12) United States Patent
Jin et al.

(10) Patent No.: US 11,581,357 B2
(45) Date of Patent: Feb. 14, 2023

(54) IMAGE SENSOR COMPRISING ENTANGLED PIXEL

(71) Applicant: Samsung Electronics Co., Ltd., Suwon-si (KR)

(72) Inventors: Younggu Jin, Suwon-si (KR); Youngchan Kim, Seongnam-si (KR); Taesub Jung, Hwaseong-si (KR); Yonghun Kwon, Hwaseong-si (KR); Moosup Lim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 384 days.

(21) Appl. No.: 16/778,122

(22) Filed: Jan. 31, 2020

(65) Prior Publication Data

US 2020/0403022 A1    Dec. 24, 2020

(30) Foreign Application Priority Data

Jun. 19, 2019  (KR) .................. 10-2019-0072853

(51) Int. Cl.
| | | |
|---|---|---|
| H01L 27/146 | (2006.01) |
| G01S 7/4865 | (2020.01) |
| G01B 11/22 | (2006.01) |
| G01S 17/894 | (2020.01) |

(52) U.S. Cl.
CPC ........ *H01L 27/14641* (2013.01); *G01B 11/22* (2013.01); *G01S 7/4865* (2013.01); *G01S 17/894* (2020.01); *H01L 27/1463* (2013.01); *H01L 27/14612* (2013.01)

(58) Field of Classification Search
None
See application file for complete search history.

(56) References Cited

U.S. PATENT DOCUMENTS

| | | | |
|---|---|---|---|
| 7,889,257 B2 | 2/2011 | Oggier et al. |
| 8,829,408 B2 | 9/2014 | Oggier et al. |
| 9,167,230 B2 | 10/2015 | Min et al. |
| 9,621,868 B2 | 4/2017 | Kim et al. |
| 9,762,890 B2 | 9/2017 | Fossum et al. |
| 11,088,185 B2 * | 8/2021 | Jin ................... H01L 27/14603 |
| 2011/0202310 A1 | 8/2011 | Min et al. |
| 2012/0062705 A1 | 3/2012 | Ovsiannikov et al. |
| 2016/0198141 A1 * | 7/2016 | Fettig ................. H04N 13/218 348/46 |
| 2018/0070030 A1 * | 3/2018 | Geurts ............... H04N 5/37452 |

(Continued)

FOREIGN PATENT DOCUMENTS

| | | |
|---|---|---|
| KR | 10-1710514 B1 | 2/2017 |
| KR | 10-1711061 B1 | 2/2017 |

*Primary Examiner* — Alexander G Ghyka
(74) *Attorney, Agent, or Firm* — Harness, Dickey & Pierce, P.L.C.

(57) ABSTRACT

A depth sensor includes a first pixel including a plurality of first photo transistors each receiving a first photo gate signal, a second pixel including a plurality of second photo transistors each receiving a second photo gate signal, a third pixel including a plurality of third photo transistors each receiving a third photo gate signal, a fourth pixel including a plurality of fourth photo transistors each receiving a fourth photo gate signal, and a photoelectric conversion element shared by first to fourth photo transistors of the plurality of first to fourth photo transistors.

13 Claims, 62 Drawing Sheets

(56) References Cited

U.S. PATENT DOCUMENTS

| | | |
|---|---|---|
| 2019/0227169 A1* | 7/2019 | Wong .................... G01S 17/894 |
| 2019/0296060 A1* | 9/2019 | Oh .................... H01L 27/14641 |
| 2020/0013811 A1 | 1/2020 | Jin et al. |
| 2020/0028017 A1* | 1/2020 | Imoto ................... H01L 31/101 |
| 2021/0199781 A1* | 7/2021 | Jin .......................... G01S 17/18 |
| 2021/0335868 A1* | 10/2021 | Park ................. H01L 27/14625 |

* cited by examiner

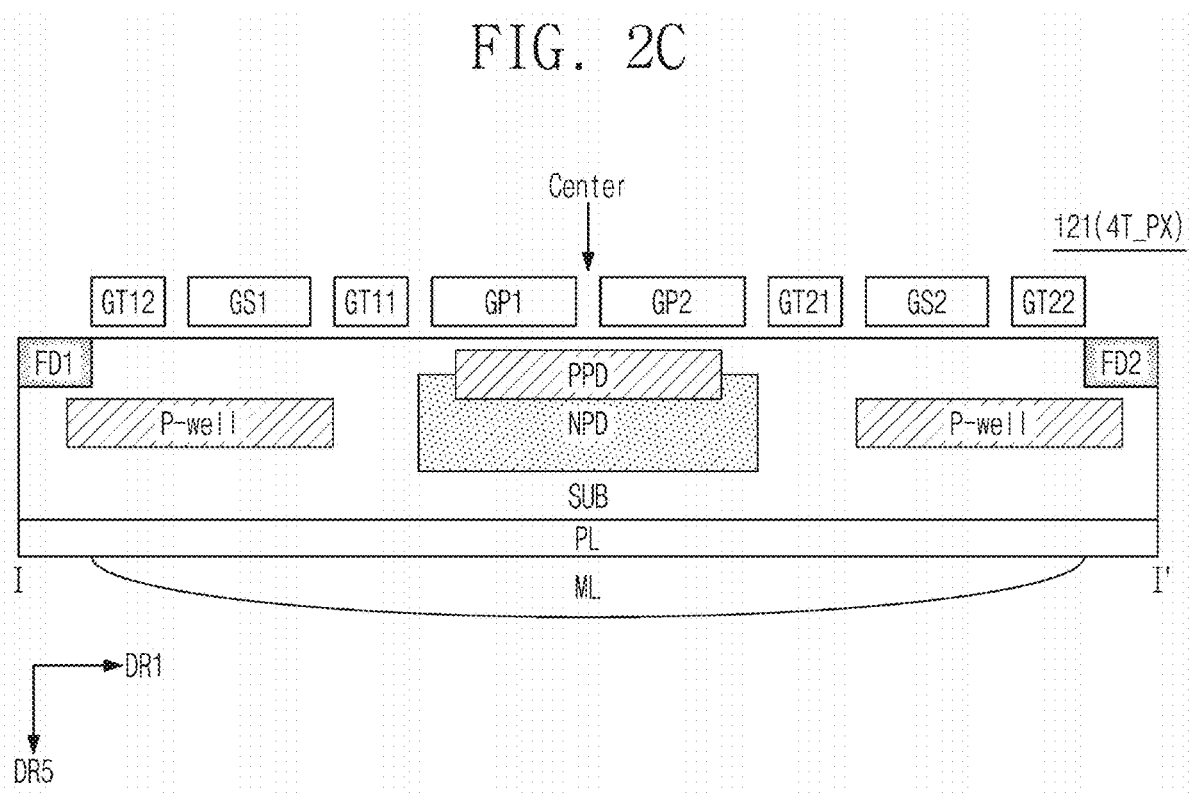

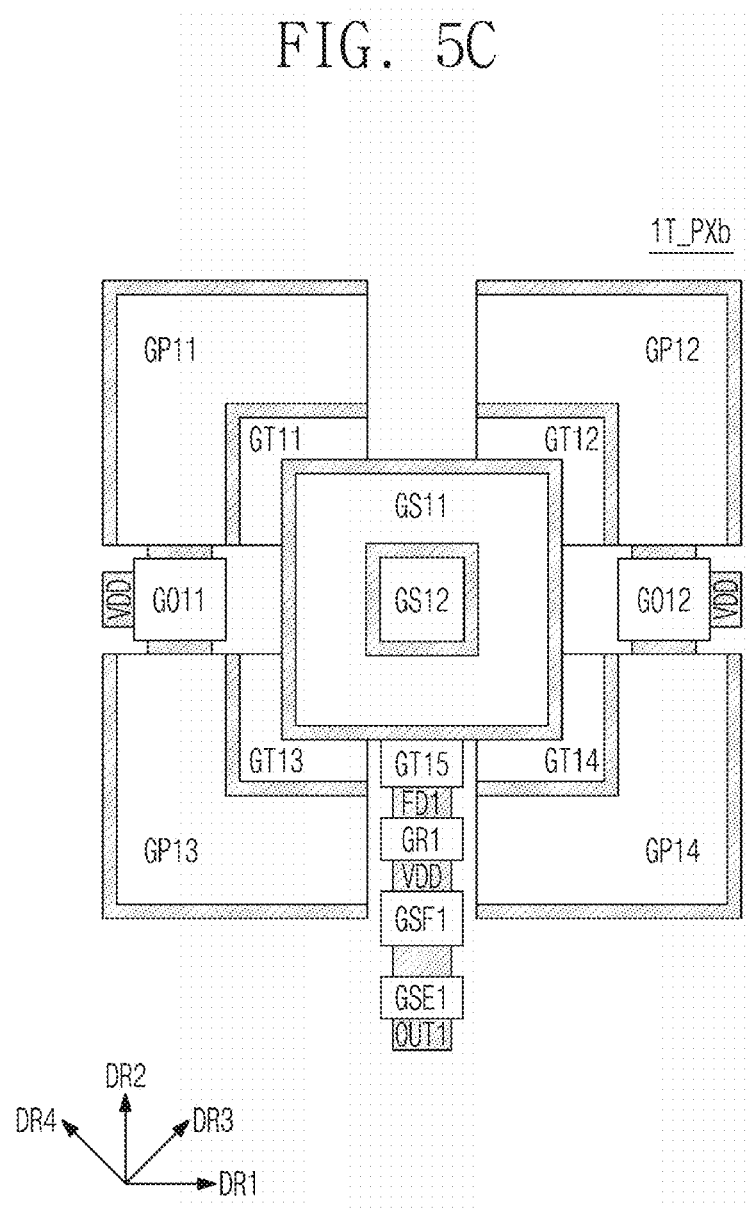

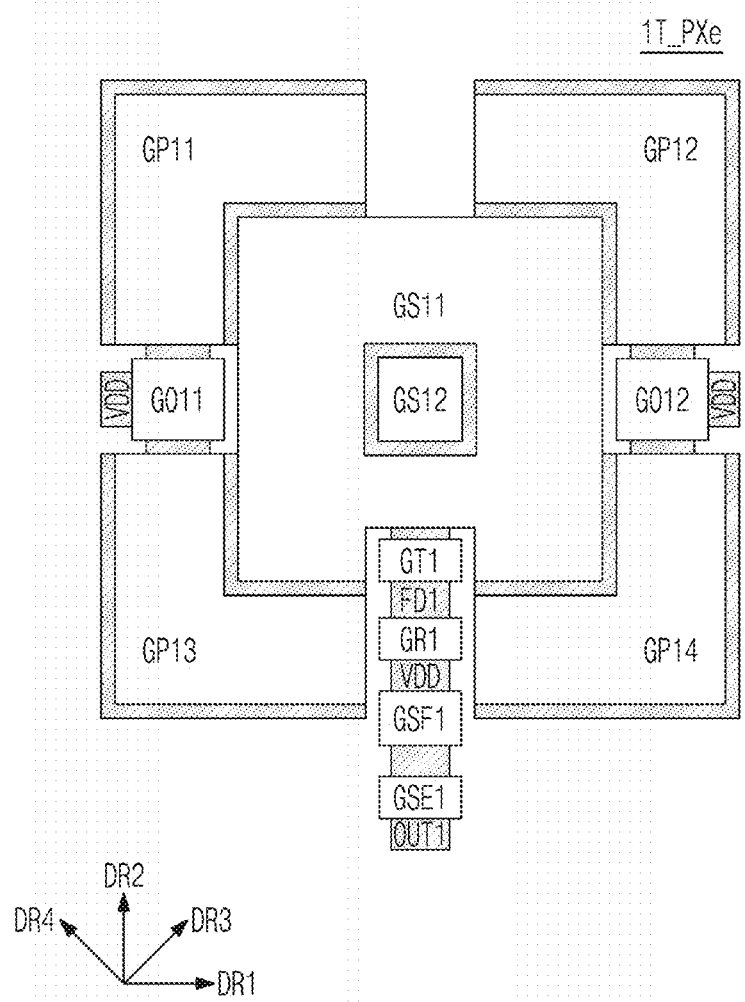

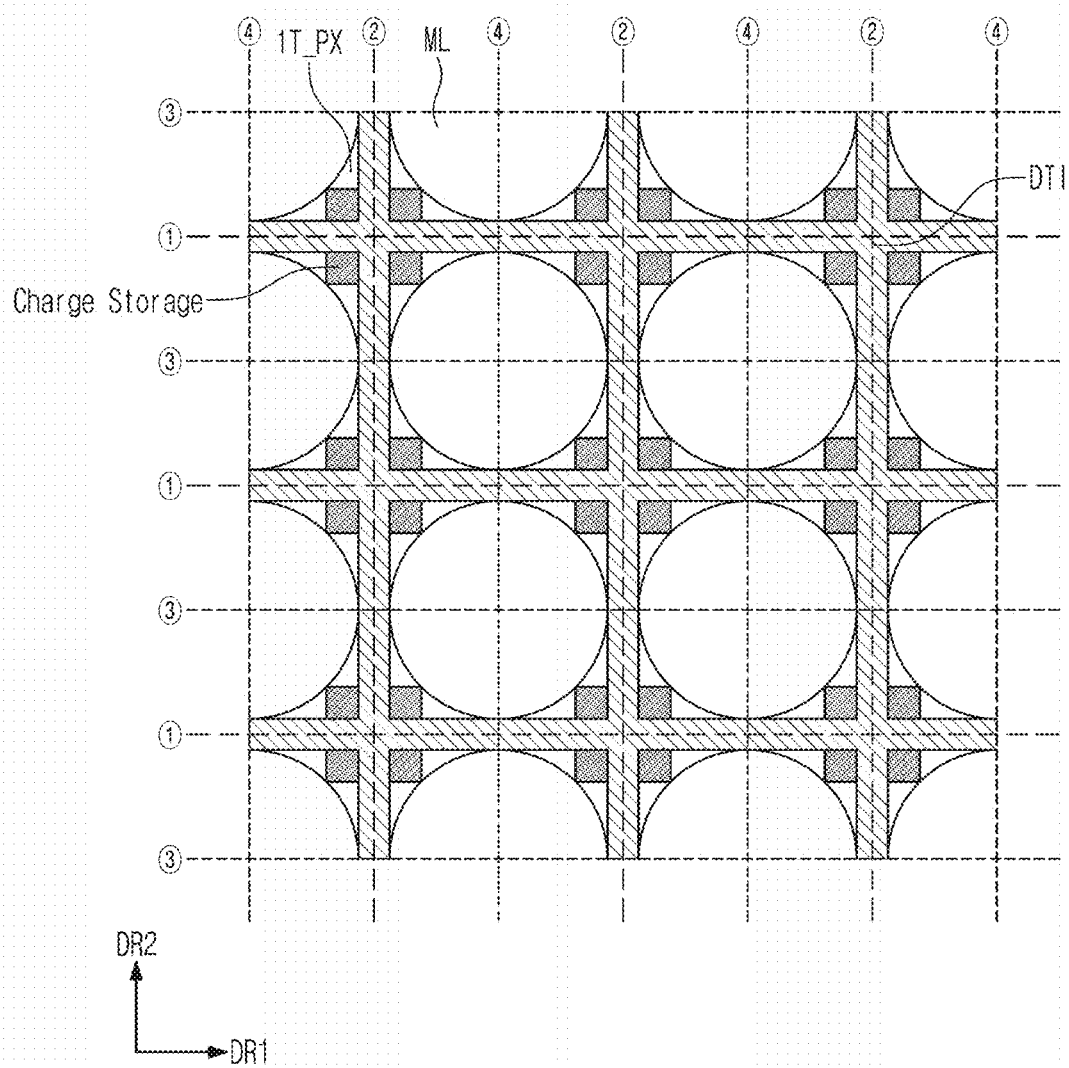

IMAGE SENSOR COMPRISING ENTANGLED PIXEL

CROSS-REFERENCE TO RELATED APPLICATION

This U.S. non-provisional application claims the benefit of priority under 35 U.S.C. § 119 to Korean Patent Application No. 10-2019-0072853 filed on Jun. 19, 2019, in the Korean Intellectual Property Office, the disclosure of which are incorporated by reference herein in its entirety.

BACKGROUND

Various example embodiments of the inventive concepts described herein relate to a depth sensor including an entangled pixel.

An electronic device may include multi-function sensors that calculate a distance between an image sensor and an object by using a captured image or recognizing an object, as well as an image sensor that captures an image of the outside for the purpose of displaying the image simply. Various electronic devices, such as a smartphone, may include a depth sensor.

A light signal may be emitted from a light source to an object, and a light signal may be reflected from the object. A depth sensor that is based on "time of flight" (ToF) may calculate a distance between the depth sensor and the object based on the reflected light signal. It is desired to reduce the size of each pixel of the depth sensor for the purpose of making a resolution of the depth sensor higher.

SUMMARY

Various example embodiments of the inventive concepts provide a depth sensor including an entangled pixel.

According to at least one example embodiment, a depth sensor may include a first pixel including a plurality of first photo transistors, each of the plurality of first photo transistors configured to receive a first photo gate signal, a second pixel including a plurality of second photo transistors, each of the plurality of second photo transistors configured to receive a second photo gate signal, a third pixel including a plurality of third photo transistors, each of the plurality of third photo transistors configured to receive a third photo gate signal, a fourth pixel including a plurality of fourth photo transistors, each of the plurality of fourth photo transistors configured to receive a fourth photo gate signal, and a first photoelectric conversion element configured to be shared by at least one first photo transistor of the plurality of first photo transistors, at least one second photo transistor of the plurality of second photo transistors, at least one third photo transistor of the plurality of third photo transistors, and at least one fourth photo transistor of the plurality of fourth photo transistors.

According to at least one example embodiment, a depth sensor may include at least one pixel. The at least one pixel may include a plurality of photo transistors each configured to receive a photo gate signal and integrate charges, a floating diffusion region configured to store the charges integrated by the plurality of photo transistors, and readout circuitry connected to the floating diffusion region.

According to at least one example embodiment, a depth sensor may include a first pixel including a first photo transistor and a second photo transistor, the first photo transistor and the second photo transistor each configured to receive a first photo gate signal, a second pixel including a third photo transistor and a fourth photo transistor, the third photo transistor and the fourth photo transistor each configured to receive a second photo gate signal, a third pixel including a fifth photo transistor and a sixth photo transistor, the fifth photo transistor and the sixth photo transistor each configured to receive a third photo gate signal, a first photoelectric conversion element configured to generate first charges corresponding to a received light signal, transfer the first charges to the second and third photo transistors, and be shared by the first and second pixels, and a second photoelectric conversion element configured to generate second charges corresponding to the received light signal, transfer the second charges to the fourth and fifth photo transistors, and be shared by the second and third pixels.

BRIEF DESCRIPTION OF THE FIGURES

The above and other objects and features of various example embodiments of the inventive concepts will become apparent by describing in detail example embodiments thereof with reference to the accompanying drawings.

FIGS. 2A to 2E illustrate circuit diagrams, layouts, and cross-sectional views of a pixel array of FIG. 1 according to some example embodiments.

DETAILED DESCRIPTION

Figure 1:
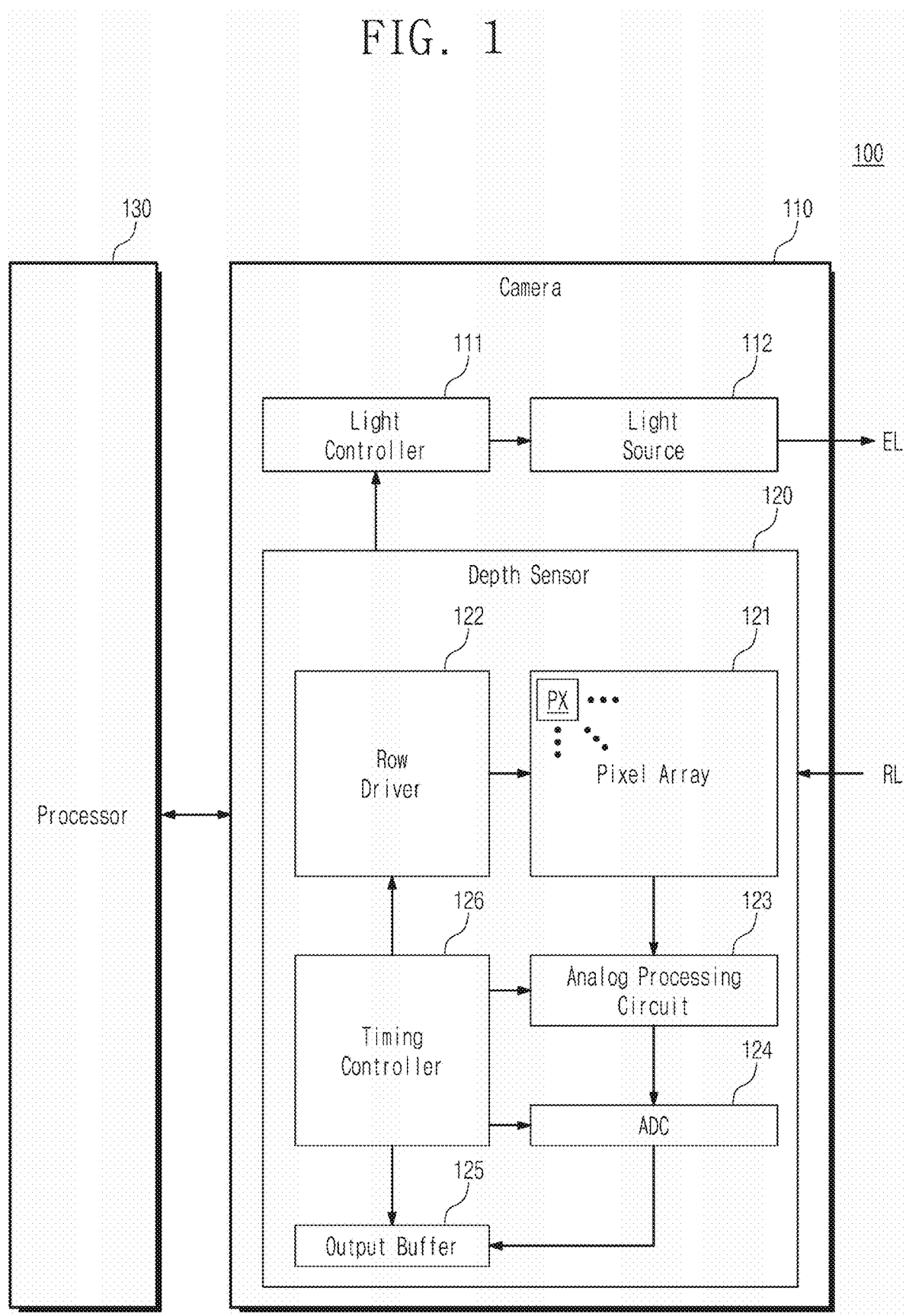
FIG. 1 illustrates a block diagram of an electronic device according to at least one example embodiment of the inventive concepts.

FIG. 1 illustrates a block diagram of an electronic device according to at least one example embodiment of the inventive concepts. An electronic device 100 may be also referred to as a "computer system", an "electronic system", an "image detecting system", and/or a "distance detecting system," etc., but is not limited thereto. For example, the electronic device 100 may be a smartphone, a tablet, a digital camera, a wearable device, a virtual reality device and/or an augmented reality device, a mobile device, etc. The electronic device 100 may include at least one camera 110 and at least one processor 130, etc.

The camera 110 may emit a light signal EL to an object based on time of flight (ToF) technology, may sense a light signal RL reflected from the object, and may sense a distance between the electronic device 100 and the object. The camera 110 may include a light controller 111, a light source 112, and/or a depth sensor 120, but is not limited thereto. The light controller 111 may control the light source 112 under the control of the depth sensor 120 and/or the processor 130. The light controller 111 may modulate the light signal EL to be emitted or output from the light source 112, and then the light source 112 may emit the light signal EL modulated by the light controller 111. For example, the modulated light signal EL may have the shape of a square wave (a pulse) or a sine wave, and the light signal EL may be an infrared, a microwave, a light wave (e.g., visible light), an ultrasonic wave, etc. For example, the light source 112 may include a light emitting diode (LED), a laser diode (LD), and/or an organic light emitting diode (OLED), etc. The depth sensor 120 may be also referred to as an "image sensor" or a "TOF sensor". The depth sensor 120 may include a pixel array 121, a row driver 122, an analog processing circuit 123, an analog-to-digital converter 124, an output buffer 125, and/or a timing controller 126, but is not limited thereto.

The pixel array 121 may include pixels PX arranged along a row direction and a column direction. The pixel array 121 may be implemented on a silicon substrate or a semiconductor substrate. The pixels PX may convert the light signal RL reflected from (e.g., reflected off of, or received from) an object into an electrical signal. Due to a distance between the electronic device 100 and the object, the light signal RL incident onto the pixel array 121 (e.g., the light signal RL received by the pixel array 121) may be delayed with respect to the light signal EL output by (e.g., emitted by) the light source 112. There may be a time difference between the light signals RL and EL due to the distance traveled by the light signal RL. In other words, there may be a time difference between the time that the light signal EL is generated, transmitted, and/or emitted by the light source 112, and a time that the light signal RL is sensed, received, incident onto, etc., the pixel array 121. The pixels PX may integrate, store, transmit, remove, and/or discharge charges based on control signals provided from the row driver 122. The pixel PX may be also referred to as a "ToF pixel(s)".

The row driver 122 may control the pixel array 121 under the control of the timing controller 126. The row driver 122 may transmit control signals to the pixels PX. For example, the control signals may be signals OG, PG, TG, SG, RG, SEL, and DG (numerals skipped) illustrated in FIGS. 2A to 15, but are not limited thereto. The row driver 122 may control all of the pixels PX of the pixel array 121 at the same time in a global mode or may control the pixels PX of the pixel array 121 in the unit of row(s) of pixels in a rolling mode.

The analog processing circuit 123 may receive, sample, and/or hold an output signal (also referred to as an "image signal" or a "depth signal") output from the pixel array 121. The analog processing circuit 123 may control output lines that are connected to the pixels PX of the pixel array 121 and extend in the column direction. The analog processing circuit 123 may perform a correlated double sampling (CDS) operation on the output signal and may remove a noise included in the output signal.

The analog-to-digital converter 124 may convert the output signal (e.g., analog signal) processed by the analog processing circuit 123 into a digital signal. The analog-to-digital converter 124 may generate image data (and/or depth data) by using the digital signal. The analog-to-digital converter 124 may provide the image data to the output buffer 125. For example, the analog-to-digital converter 124 may be included or integrated in the analog processing circuit 123, but is not limited thereto. The output buffer 125 may store the image data transmitted from the analog-to-digital converter 124. The output buffer 125 may output the image data to the processor 130.

The timing controller 126 may control the components 121 to 125 of the depth sensor 120. The timing controller 126 may control the light controller 111 under control of the processor 130. For example, the timing controller 126 may control the row driver 122 based on modulation information and/or phase information of the light signal EL to be output from the light source 112. The row driver 122 may transmit, to the pixel PX, a first modulation signal PG, the phase of which is the same as, or different, from a phase of the light signal EL, and a second modulation signal PG, the phase of which is different from the phase of the first modulation signal PG, under the control of the timing controller 126. The depth sensor 120 may generate first image data by using the first modulation signal PG, may generate second image data by using the second modulation signal PG, and may transmit the first and second image data to the processor 130. According to some example embodiments, the number of modulation signals may be 2 or more.

The processor 130 may control the camera 110. The processor 130 may control the light controller 111 and the light source 112 so as to output the light signal EL. The processor 130 may allow the depth sensor 120 to sense the light signal RL and to generate the first and second image data. The processor 130 may calculate a distance (e.g., a TOF value) between the electronic device 100 and an object and/or distances between the electronic device 100 and various points on the object, a shape of the object, a movement speed of the object, and the like, based on the first and second image data. For example, the processor 130 may calculate a delay time of the light signal RL to the light signal EL based on image data that the depth sensor 120 generates by using two or more modulation signals, the phases of which are the same as, or different, from the phase of the light signal EL. The processor 130 may include an image signal processor (ISP) (not illustrated) for processing image data transmitted from the depth sensor 120. The processor 130 may be also referred to as a "host" or a "camera controller," etc., but is not limited thereto. For example, the processor 130 may be implemented to be independent of the camera 110 as illustrated in FIG. 1. For another example, the processor 130 may be integrated in the camera 110 or the depth sensor 120, etc.

Figure 2A:
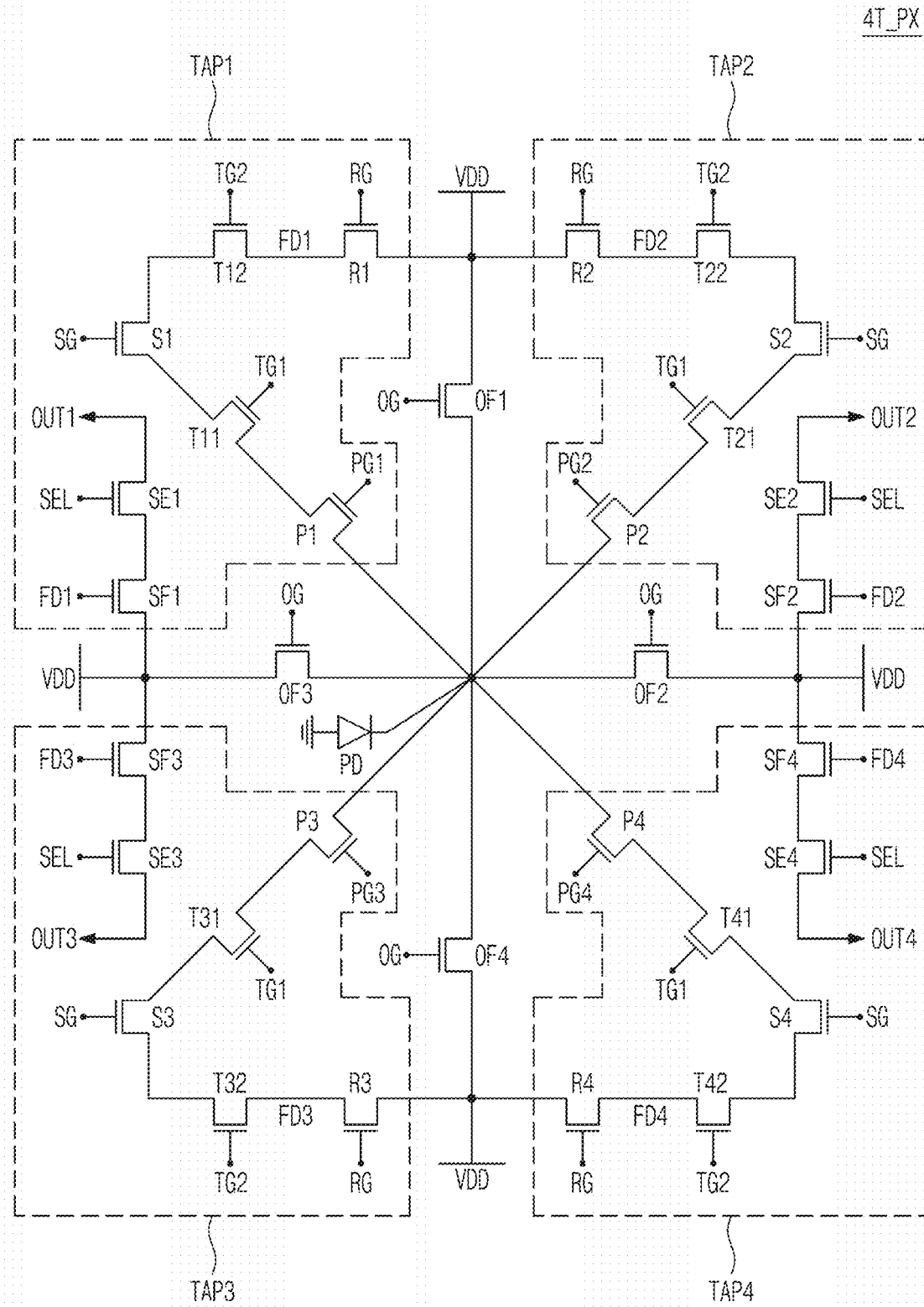

FIG. 2A illustrates a circuit diagram of a pixel of FIG. 1 according to at least one example embodiment. A pixel 4T_PX may include a photoelectric conversion element PD, taps TAP1 to TAP4, and/or overflow transistors OF1 to OF4, etc., but the example embodiments are not limited thereto, and there may be a greater or lesser number of components within the pixel. A photo diode, a photo transistor, a photo gate, a pinned photo diode, etc., or a combination thereof may be used as the photoelectric conversion element PD. Below, a photo diode will be described as an example of the photoelectric conversion element PD, but the example embodiments are not limited thereto. The photoelectric conversion element PD may generate and accumulate charges corresponding to the light signal RL. The charges generated by the photoelectric conversion element PD may be distributed into photo transistors P1 to P4, etc. The amounts of charges stored by the photo transistors P1 to P4 may be determined depending on the phase differences between photo gate signals PG1 to PG4 and the light signal EL. For example, the photoelectric conversion element PD may be implemented in a substrate where the pixel array 121 is implemented, so as to overlap with the photo transistors P1 to P4 in a plan view. Referring to FIG. 2A, the photoelectric conversion element PD may be connected between the first ends of the photo transistors P1 to P4 and a power supply voltage GND. The photoelectric conversion element PD may be shared by a plurality of taps (e.g., 4 in FIG. 2A, but not limited thereto) of one pixel 4T_PX.

The tap TAP1 may include the photo transistor P1, a transfer (transmission) transistor T11, a storage transistor S1, a transfer transistor T12, a floating diffusion region FD1, a reset transistor R1, a source follower transistor SF1, and/or a selection transistor SE1, etc., but is not limited thereto. The first end (e.g., a drain or a source) of the photo transistor P1 may be connected to the photoelectric conversion element PD and the first ends of the overflow transistors OF1 to OF4.

The photo transistor P1 may integrate charges based on a photo gate signal PG1. Charges may be generated by the light signal RL incident onto the pixel 4T_PX, e.g., charges are generated when the light signal RL is received by the pixel 4T_PX, etc. The photo gate signal PG1 may be a modulation signal, the phase of which is the same as, or different, from a phase of the light signal EL described with reference to FIG. 1. The photo gate signal PG1 may be activated (or enabled) during an integration period (or interval) in which the light signal EL is emitted from the light source 112 and the light signal RL is incident onto the pixel array 121 and may be deactivated (or disabled) in the remaining time other than the integration period.

The transfer transistor T11 may be connected between a second end of the photo transistor P1 and a first end of the storage transistor S1. The transfer transistor T11 may electrically connect the second end of the photo transistor P1 to the first end of the storage transistor S1 during the integration period based on a transfer gate signal TG1 so that charges integrated by the photo transistor P1 are transferred (e.g., transmitted) to the storage transistor S1, and may limit and/or prevent the charges integrated by the photo transistor P1 from being transferred to the storage transistor S1 during the remaining time other than the integration period based on the transfer gate signal TG1.

The storage transistor S1 may be connected between the transfer transistors T11 and T12 and may store charges integrated by the photo transistor P1 based on a storage gate signal SG. For example, the charges integrated by the photo transistor P1 may not be immediately transferred to the floating diffusion region FD1.

The transfer transistor T12 may be connected between a second end of the storage transistor S1 and the floating diffusion region FD1. The transfer transistor T12 may transfer the charges stored by the storage transistor S1 to the floating diffusion region FD1 based on a transfer gate signal TG2.

The reset transistor R1 may be connected between the floating diffusion region FD1 and a power supply voltage VDD. The reset transistor R1 may electrically connect the floating diffusion region FD1 to the power supply voltage VDD based on a reset gate signal RG. The reset transistor R1 may drive a voltage level of the floating diffusion region FD1 to the power supply voltage VDD based on the reset gate signal RG and may remove, or discharge, charges stored in the floating diffusion region FD1. The source follower transistor SF1 may be connected between the power supply voltage VDD and the selection transistor SE1. A gate electrode of the source follower transistor SF1 may be connected to the floating diffusion region FD1. The source follower transistor SF1 may output an output signal OUT1 based on a voltage level of the floating diffusion region FD1. The selection transistor SE1 may be connected between the source follower transistor SF1 and an output line (not illustrated). The selection transistor SE1 may output the output signal OUT1 to the output line based on a selection signal SEL. The transistors R1, SE1, and SF1 may constitute a readout circuit (e.g., readout circuitry, at least one readout circuit, etc.), but the readout circuit is not limited thereto.

Configurations and operations of the taps TAP2 to TAP4 may be substantially the same as the configuration and the operation of the tap TAP1 except that photo gate signals PG2 to PG4 are respectively applied to the taps TAP2 to TAP4. The photo gate signals PG1 to PG4 may be activated during the integration period, and may be deactivated in the remaining time other than the integration period. The photo gate signal PG1 may be a modulation signal, the phase of which is the same as, or different, from a phase of the light signal EL described with reference to FIG. 1. Phases of the photo gate signals PG1 to PG4 may be different (refer to FIG. 2D). The taps TAP1 to TAP4 may output the output signals OUT1 to OUT4 based on the photo gate signals PG1 to PG4. For example, a voltage level difference between the output signals OUT1 to OUT4 may indicate a distance between the electronic device 100 and an object.

The overflow transistors OF1 to OF4 may be connected to the power supply voltage VDD. In the remaining time other than the integration period (e.g., the time period that is not the integration period), the photoelectric conversion element PD and/or the photo transistors P1 to P4 may integrate charges due to an external light. Based on an overflow gate signal OG, the overflow transistors OF1 to OF4 may remove charges integrated by the photoelectric conversion element PD and/or the photo transistors P1 to P4, or may discharge the integrated charges to the power supply voltage VDD, in the remaining time other than the integration period.

An example embodiment is illustrated in FIG. 2A as all the transistors of the pixel 4T_PX are implemented with NMOS transistors, but the transistors of the pixel 4T_PX may be implemented with PMOS transistors or a combination of NMOS transistors and PMOS transistors. The kind (e.g., type) of the transistors used in the pixel 4T_PX is not limited to the example illustrated in FIG. 2A.

Figure 2B:
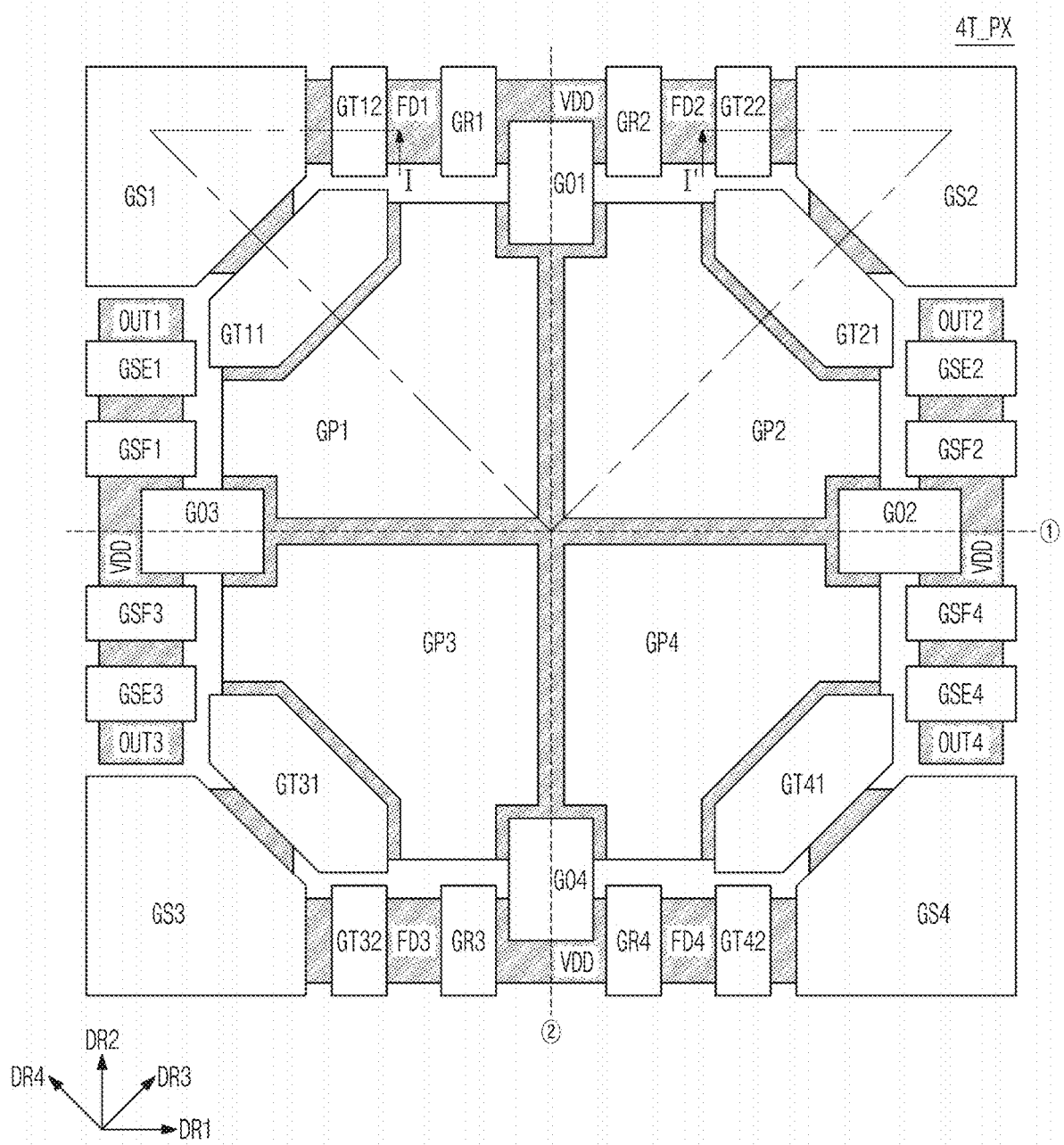

FIG. 2B illustrates a layout of a pixel of FIG. 2A according to at least one example embodiment. In the following drawings including FIG. 2B, a direction DR1 and a direction DR2 may be perpendicular to each other. The directions DR1 and DR2 may be perpendicular to a direction that faces the pixel array 121 in a plan view. For example, the directions DR1 and DR2 may correspond to the row direction and the column direction in which the pixels 4T_PX of the pixel array 121 are arranged. For example, the directions DR1 and DR2 may correspond to the column direction and the row direction in which the pixels 4T_PX of the pixel array 121 are arranged. A direction DR3 may indicate a direction between the directions DR1 and DR2, and a direction DR4 may be perpendicular to the direction DR3. The directions DR3 and DR4 may be perpendicular to a direction that faces the pixel array 121 in a plan view.

Drains or sources of the transistors P1 to P4, T11 to T41, S1 to S4, T12 to T42, R1 to R4, SF1 to SF4, and SE1 to SE4, and the floating diffusion regions FD1 to FD4 may be formed or disposed in shading regions of FIG. 2B, but the example embodiments are not limited thereto. Gate electrodes of the transistors P1 to P4, T11 to T41, S1 to S4, T12 to T42, R1 to R4, SF1 to SF4, and SE1 to SE4 may be disposed in regions between the shading regions of FIG. 2B, but the example embodiments are not limited thereto.

According to at least one example embodiment, a region of the pixel 4T_PX may be divided into a central region including the center of the pixel 4T_PX and a boundary region adjacent to another pixel. According to the at least one example embodiment, gate electrodes GP1 to GP4 of the photo transistors P1 to P4 may be disposed adjacent to each other in the central region, and gate electrodes GT11 to GT41 of the transfer transistors T11 to T41 may be disposed adjacent to the respective gate electrodes GP1 to GP4 along the direction DR3 or the direction DR4, but the example embodiments are not limited thereto. Gate electrodes GS1 to GS4 of the storage transistors S1 to S4 may be disposed adjacent to the respective gate electrodes GT11 to GT41 along the direction DR3 or the direction DR4, gate electrodes GT12 to GT42 of the transfer transistors T12 to T42 may be respectively interposed (disposed) between the gate electrodes GS1 to GS4 and the floating diffusion regions FD1 to FD4 along the direction DR1, and gate electrodes GR1 to GR4 of the reset transistors R1 to R4 may be disposed adjacent to the respective floating diffusion regions FD1 to FD4 along the direction DR1, but the example embodiments are not limited thereto.

Additionally, according to the at least one example embodiment, gate electrodes GSF1 to GSF4 of the source follower transistors SF1 to SF4 may be disposed adjacent to the respective gate electrodes GP1 to GP4 along the direction DR1, etc. Although not illustrated in FIG. 2B, metal wires electrically connecting the floating diffusion regions FD1 to FD4 to the gate electrodes GSF1 to GSF4 may be disposed on/above the pixel 4T_PX. Gate electrodes GSE1 to GSE4 of the selection transistors SE1 to SE4 may be disposed adjacent to the respective gate electrodes GSF1 to GSF4 along the direction DR2.

An imaginary line ① may be parallel to the direction DR1, and an imaginary line ② may be parallel to the direction DR2. In a plan view, an intersection of the imaginary lines ① and ② may be the center of the pixel 4T_PX. According to at least one example embodiment, the region of the pixel 4T_PX may be divided into quadrants, each of which is bounded by the imaginary lines ① and ②. The taps TAP1 to TAP4 of the pixel 4T_PX may be respectively disposed in the quadrants. For example, the taps TAP1 and TAP2 may be symmetrical with respect to the imaginary line ②. The taps TAP3 and TAP4 may be symmetrical with respect to the imaginary line ②. The taps TAP1 and TAP3 may be symmetrical with respect to the imaginary line ①. The taps TAP2 and TAP4 may be symmetrical with respect to the imaginary line ①. The taps TAP1 and TAP4 may be symmetrical with respect to the center of the pixel 4T_PX. The taps TAP2 and TAP3 may be symmetrical with respect to the center of the pixel 4T_PX. However, the example embodiments are not limited thereto, and a different number of taps may be included in the pixel, and/or the taps may be arranged in a different manner.

FIG. 2C illustrates a cross-sectional view of a pixel taken along a line I-I' of FIG. 2B according to at least one example embodiment. A direction DR5 may correspond to a direction that faces the pixel array 121 including the pixel 4T_PX in a plan view. The pixel array 121 may be implemented at a substrate SUB. For example, the substrate SUB may be a P-type epitaxial layer, but is not limited thereto. A planarization layer PL may be formed on the substrate SUB along the direction DR5. For example, the planarization layer PL may be a transparent layer, etc. A micro lens layer including a plurality of micro lenses ML may be formed on the planarization layer PL along the direction DR5. The micro lens layer may condense the light signal RL incident onto a back surface of the substrate SUB and may provide the light signal RL to the substrate SUB. For example, the pixel array 121 may be implemented in a back side illumination (BSI) structure in which a light signal is received through the back surface. Referring to FIG. 2C, in a plan view, the center of one micro lens ML and the center of one pixel 4T_PX may be aligned. The gate electrodes GT12, GS1, GT11, GP1, GP2, GT21, GS2, and GT22 may be formed on the substrate SUB along the direction DR5.

The substrate SUB may include a light detecting region in which the photoelectric conversion element PD is implemented. For example, the light detecting region may include an N-type photo diode (NPD) region being an N-type impurity region and a P-type photo diode (PPD) region being a P-type impurity region. The photoelectric conversion element PD of the light detecting region may integrate charges, and may transfer the charges (e.g., the PD may transfer the integrated charges) to the storage transistors S1 and S2 based on voltage levels of the photo gate signals PG1 and PG2 applied to the gate electrodes GP1 and GP2. For example, the photoelectric conversion element PD may overlap the photo transistors P1 and P2 in a plan view, but is not limited thereto.

The substrate SUB may include P-well regions disposed between the photoelectric conversion element PD and the floating diffusion regions FD1 and FD2 in a plan view. The P-well regions may operate as a barrier that limits and/or prevents charges from being directly transferred to the storage transistors S1 and S2 or the floating diffusion regions FD1 and FD2. For example, the P-well regions may overlap the storage transistors S1 and S2 or the floating diffusion regions FD1 and FD2 in a plan view. The substrate SUB may further include the floating diffusion regions FD1 and FD2. For example, the floating diffusion regions FD1 and FD2 may be n-type impurity regions and may be referred to as "floating diffusion nodes," are not limited thereto.

Figure 2D:
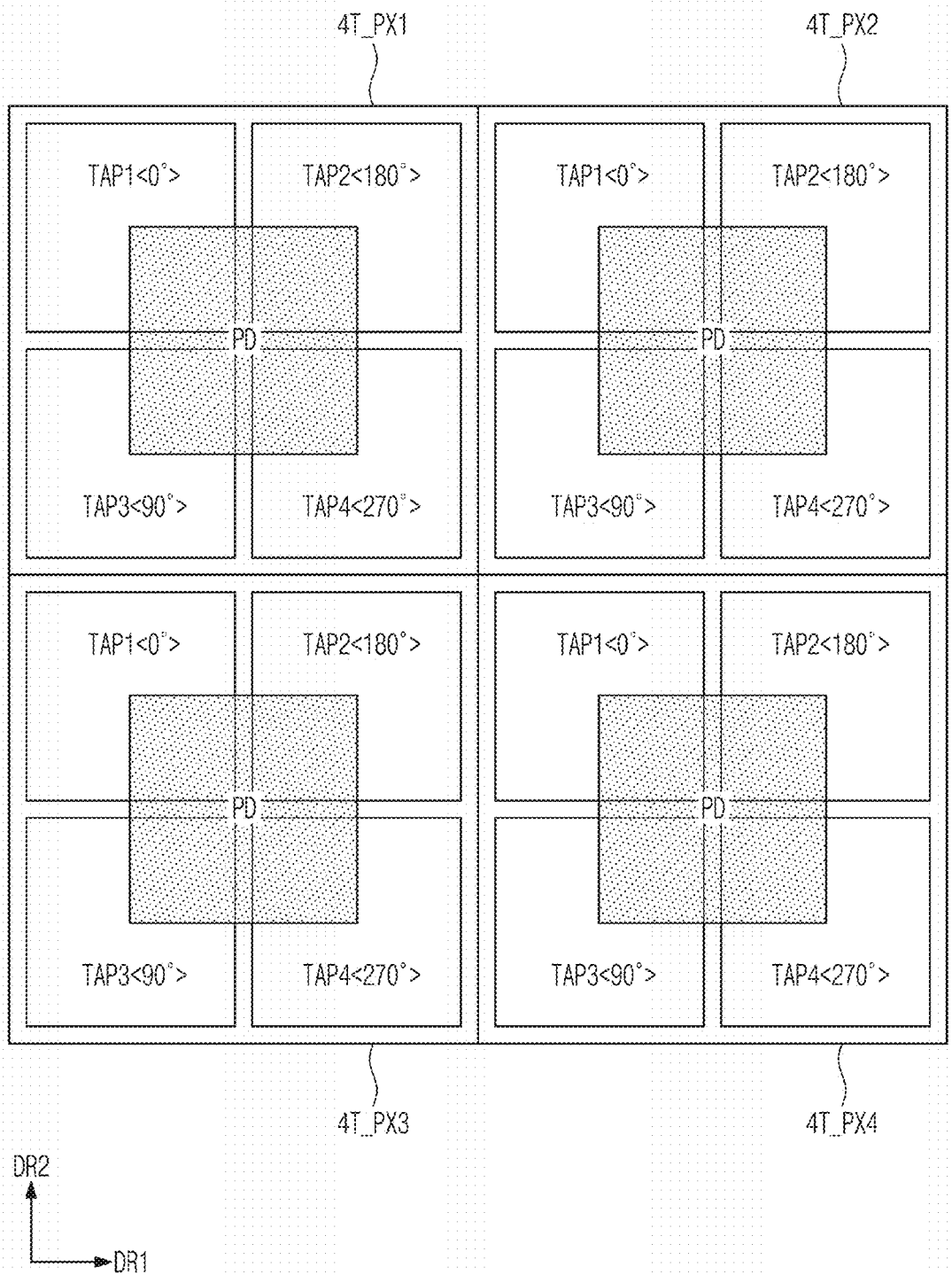
Figure 2E:
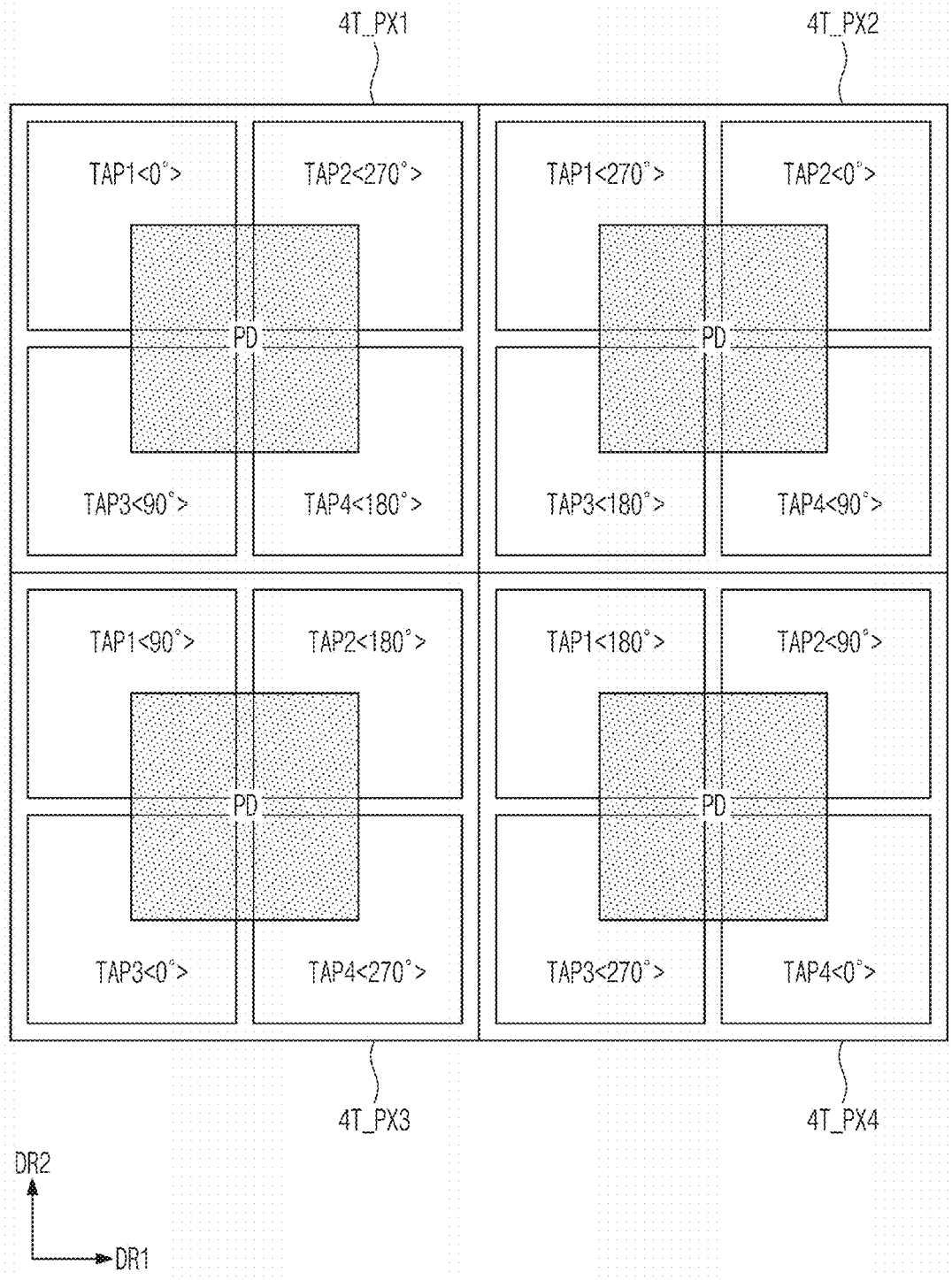

FIGS. 2D and 2E illustrate a pixel array of FIG. 1 according to some example embodiments. In at least one example embodiment, there is illustrated the pixel array 121 including four pixels 4T_PX1 to 4T_PX4 arranged along the directions DR1 and DR2, but the example embodiments are not limited thereto. Each of the pixels 4T_PX1 to 4T_PX4 may be a pixel 4T_PX. The number of pixels 4T_PX is only an example. In each of the pixels 4T_PX1 to 4T_PX4, four taps TAP1 to TAP4 and the photoelectric conversion element PD (a light detecting region marked by the shading) are illustrated in FIGS. 2D and 2E in a plan view, and the remaining components (or elements) are not illustrated. The photo transistors P1 to P4 may be respectively disposed in regions where the photoelectric conversion element PD and the taps TAP1 to TAP4 overlap each other in a plan view.

Referring to FIG. 2D, according to at least one example embodiment, the photo gate signal PG1 has a phase difference of 0 degree with respect to the light signal EL and may be applied to the gate electrodes GP1 of the photo transistors P1 in the taps TAP1 of the pixels 4T_PX1 to 4T_PX4. A photo gate signal PG3 having a phase difference of 90 degrees with respect to the light signal EL may be applied to the gate electrodes GP3 of the photo transistors P3 in the taps TAP3 of the pixels 4T_PX1 to 4T_PX4. A photo gate signal PG2 having a phase difference of 180 degrees with respect to the light signal EL may be applied to the gate electrodes GP2 of the photo transistors P2 in the taps TAP2 of the pixels 4T_PX1 to 4T_PX4. A photo gate signal PG4 having a phase difference of 270 degrees with respect to the light signal EL may be applied to the gate electrodes GP4 of the photo transistors P4 in the taps TAP4 of the pixels 4T_PX1 to 4T_PX4. However, the example embodiments are not limited thereto and other configurations of photo gate signals, including different phase difference settings, photo transistors, taps (e.g., number of taps), and/or pixels (e.g., number of pixels) may be used.

Referring to FIG. 2E, according to at least one example embodiment, the photo gate signals PG1 having phase differences of 0 degree, 270 degrees, 90 degrees, and 180 degrees with respect to the light signal EL may be respectively applied to the gate electrodes GP1 of the photo transistors P1 in the taps TAP1 of the pixels 4T_PX1 to 4T_PX4. The photo gate signals PG2 having phase differences of 270 degrees, 0 degree, 180 degrees, and 90 degrees with respect to the light signal EL may be respectively applied to the gate electrodes GP2 of the photo transistors P2 in the taps TAP2 of the pixels 4T_PX1 to 4T_PX4. The photo gate signals PG3 having phase differences of 90 degrees, 180 degree, 0 degrees, and 270 degrees with respect to the light signal EL may be respectively applied to the gate electrodes GP3 of the photo transistors P3 in the taps TAP3 of the pixels 4T_PX1 to 4T_PX4. The photo gate signals PG4 having phase differences of 180 degrees, 90 degree, 270 degrees, and 0 degrees with respect to the light signal EL may be respectively applied to the gate electrodes GP4 of the photo transistors P4 in the taps TAP4 of the pixels 4T_PX1 to 4T_PX4. However, the example embodiments are not limited thereto and other configurations of photo gate signals, including different phase difference settings, photo transistors, taps (e.g., number of taps), and/or pixels (e.g., number of pixels) may be used.

The taps TAP1 of the pixels 4T_PX1 to 4T_PX4 of FIG. 2D may output the output signals OUT1 having only phase information of 0 degree (the remaining taps TAP2 to TAP4 operating in a similar manner to the tap TAP1), but are not limited thereto. The taps TAP1 of the pixels 4T_PX1 to 4T_PX4 of FIG. 2E may output the output signals OUT1 having all phase information of 0 degree, 270 degrees, 90 degrees, and 180 degrees (the remaining taps TAP2 to TAP4 operating in a similar manner to the tap TAP1), but not limited thereto. A fixed pattern noise (FPN) of the pixel array 121 of FIG. 2E may be lower than the FPN of the pixel array 121 of FIG. 2D.

Figure 3A:
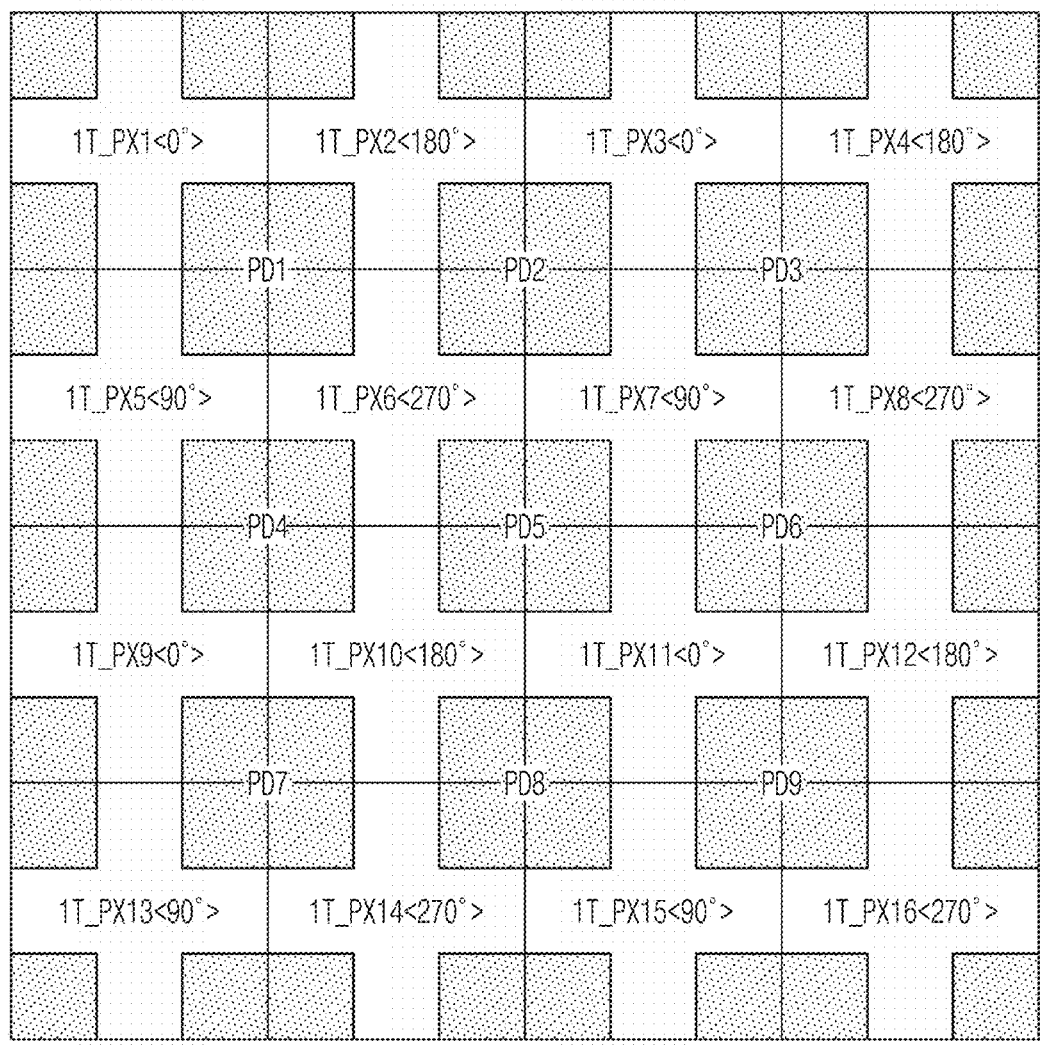
FIGS. 3A to 3C illustrate a pixel array of FIG. 1 according to some example embodiments.
Figure 3B:
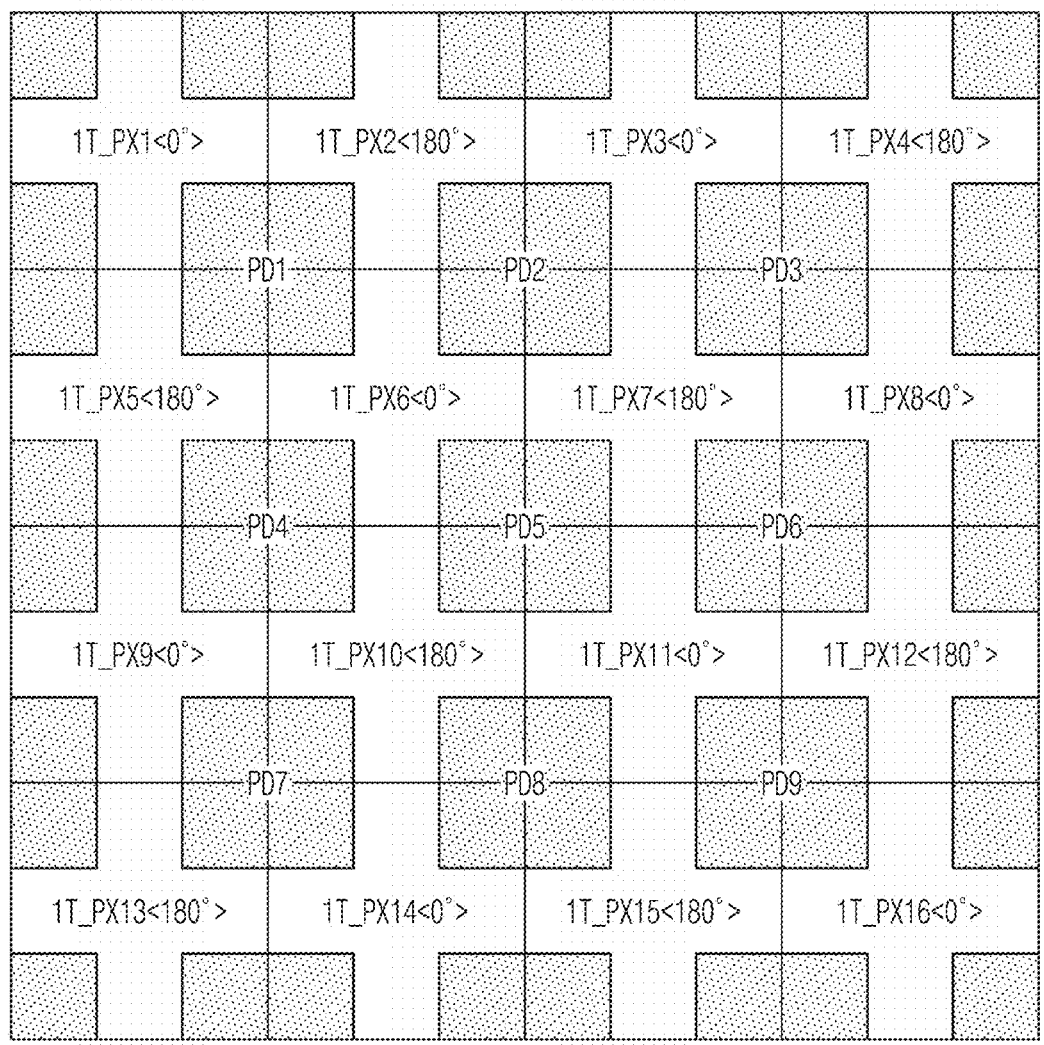
Figure 3C:
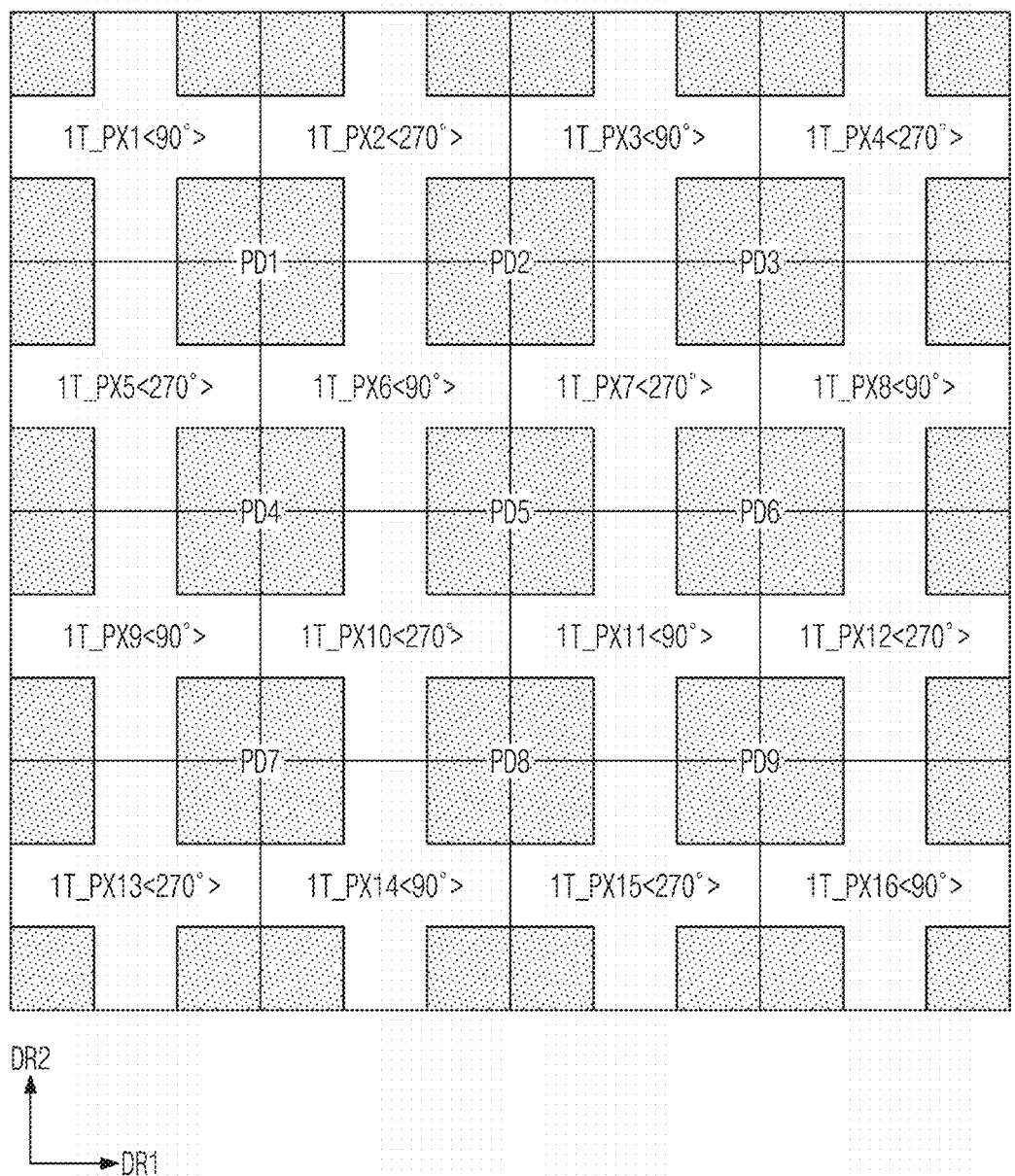

FIGS. 3A to 3C illustrate a pixel array of FIG. 1 according to some example embodiments. A pixel array 221 of FIGS. 3A to 3C may be the pixel array 121 of FIG. 1, but may be different from the pixel array 121 of FIGS. 2A and 2B, but the example embodiments are not limited thereto.

The pixel array 221 may include 16 pixels 1T_PX1 to 1T_PX16 arranged along the directions DR1 and DR2, but is not limited thereto. The number of pixels 1T_PX (a number being omitted) is only an example, and may be a greater or lesser number. The above-described pixel 4T_PX includes 4 taps TAP1 to TAP4 and one photoelectric conversion element PD. The pixel 1T_PX may include only one tap. The pixel 1T_PX may include 4 photoelectric conversion elements PD shared by other pixels 1T_PX. However, the example embodiments are not limited thereto. Referring back to FIGS. 3A to 3C, the pixel 1T_PX6 may include 4 photoelectric conversion elements PD1, PD2, PD4, and PD5 (the remaining pixels being similar to the pixel 1T_PX6). The photoelectric conversion element PD1 may be shared by the pixels 1T_PX1, 1T_PX2, 1T_PX5, and 1T_PX6, etc., e.g., the pixels adjacent to each other. As in the photoelectric conversion element PD1, the photoelectric conversion elements PD2 to PD9 may be shared by the pixels 1T_PX. The pixels 1T_PX1 to 1T_PX16 may share the photoelectric conversion elements PD1 to PD9, and the pixel 1T_PX may be referred to as an "entangled pixel". Light detecting regions where the photoelectric conversion elements PD1 to PD9 are implemented are shaded.

Referring to FIG. 3A, the photo gate signal PG1 (refer to FIG. 4B) having a phase difference of 0 degree with respect to the light signal EL may be applied to the pixels 1T_PX1, 1T_PX3, 1T_PX9, and 1T_PX11, but are not limited thereto. The pixels 1T_PX1, 1T_PX3, 1T_PX9, and 1T_PX11 may output the output signals OUT1 (refer to FIG. 4B) having phase information of 0 degree, but are not limited thereto. The photo gate signal PG3 (refer to FIG. 4B) having a phase difference of 90 degrees with respect to the light signal EL may be applied to the pixels 1T_PX5, 1T_PX7, 1T_PX13, and 1T_PX15, but are not limited thereto. The pixels 1T_PX5, 1T_PX7, 1T_PX13, and 1T_PX15 may output the output signals OUT3 (refer to FIG. 4B) having phase information of 90 degree, but are not limited thereto. The photo gate signal PG2 (refer to FIG. 4B) having a phase difference of 180 degrees with respect to the light signal EL may be applied to the pixels 1T_PX2, 1T_PX4, 1T_PX10, and 1T_PX12, but are not limited thereto. The pixels 1T_PX2, 1T_PX4, 1T_PX10, and 1T_PX12 may output the output signals OUT2 (refer to FIG. 4B) having phase information of 180 degree, but are not limited thereto. The photo gate signal PG4 (refer to FIG. 4B) having a phase difference of 270 degrees with respect to the light signal EL may be applied to the pixels 1T_PX6, 1T_PX8, 1T_PX14, and 1T_PX16, etc. The pixels 1T_PX6, 1T_PX8, 1T_PX14, and 1T_PX16 may output the output signals OUT4 (refer to FIG. 4B) having phase information of 270 degree, but are not limited thereto. The pixel array 221 of FIG. 3A may output the output signals OUT1 to OUT4 having phase information of 0 degree, 90 degrees, 180 degrees, and 270 degrees through one sampling operation, but are not limited thereto.

Referring to FIG. 3B, the photo gate signals PG1 and PG4 having a phase difference of 0 degree with respect to the light signal EL may be applied to pixels 1T_PX1, 1T_PX3, 1T_PX6, 1T_PX8, 1T_PX9, 1T_PX11, 1T_PX14, and 1T_PX16, etc. The pixels 1T_PX1, 1T_PX3, 1T_PX6, 1T_PX8, 1T_PX9, 1T_PX11, 1T_PX14, and 1T_PX16 may output the output signals OUT1 and OUT4 having phase information of 0 degree, but are not limited thereto. The photo gate signals PG2 and PG3 having a phase difference of 180 degrees with respect to the light signal EL may be applied to pixels 1T_PX2, 1T_PX4, 1T_PX5, 1T_PX7, 1T_PX10, 1T_PX12, 1T_PX13, and 1T_PX15, etc. The pixels 1T_PX2, 1T_PX4, 1T_PX5, 1T_PX7, 1T_PX10, 1T_PX12, 1T_PX13, and 1T_PX15 may output the output signals OUT2 and OUT3 having phase information of 180 degrees, but are not limited thereto.

Referring to FIG. 3C, phase differences of photo gate signals to be applied to the pixels 1T_PX1 to 1T_PX16 may be changed or shuffled. The pixels 1T_PX1, 1T_PX3, 1T_PX6, 1T_PX8, 1T_PX9, 1T_PX11, 1T_PX14, and 1T_PX16 may output the output signals OUT1 and OUT4 having phase information of 90 degrees, etc. The pixels 1T_PX2, 1T_PX4, 1T_PX5, 1T_PX7, 1T_PX10, 1T_PX12, 1T_PX13, and 1T_PX15 may output the output signals OUT2 and OUT3 having phase information of 270 degrees, etc. The pixel array 221 of FIGS. 3B and 3C may output the output signals OUT1 to OUT4 having phase information of 0 degree, 90 degrees, 180 degrees, and 270 degrees by performing a sampling operation twice, but are not limited thereto.

Figure 4A:
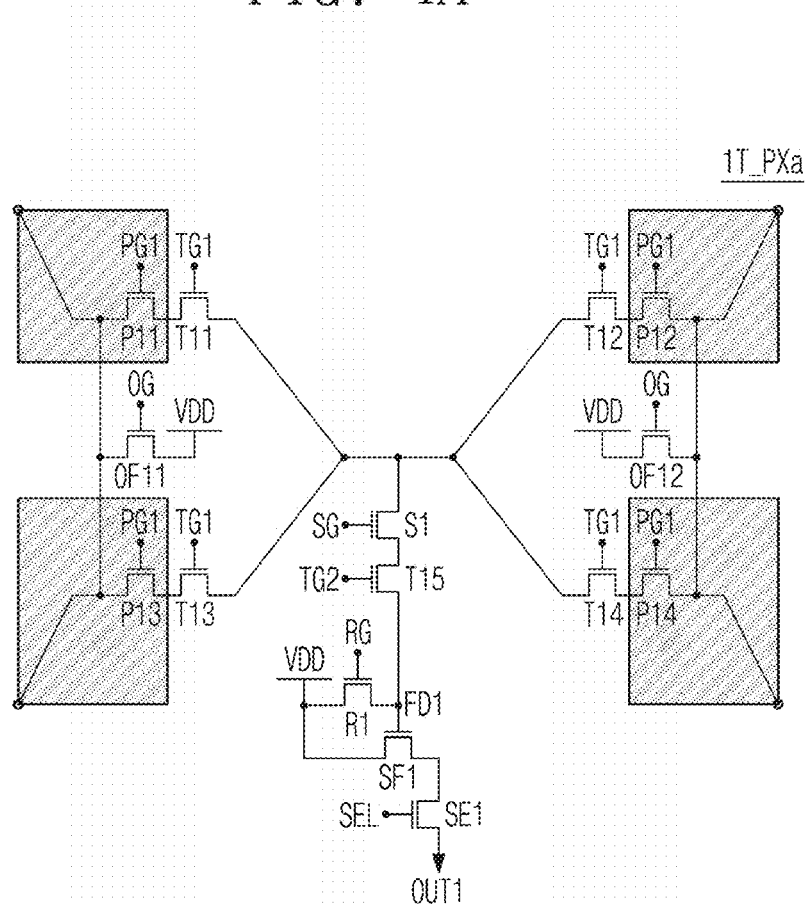
FIGS. 4A to 14C illustrate circuit diagrams, layouts, and cross-sectional views of a pixel array of FIG. 1 according to some example embodiments.

FIG. 4A illustrates a circuit diagram of a pixel of FIGS. 3A to 3C according to some example embodiments. A pixel 1T_PXa may be the pixel 1T_PX of the pixel array 221. A description will be focused on differences between the pixel 1T_PXa and the pixel 4T_PX. The pixel 1T_PXa may include photo transistors P11 to P14, transfer transistors T11 to T14, the storage transistor S1, a transfer transistor T15, the floating diffusion region FD1, the reset transistor R1, the source follower transistor SF1, the selection transistor SE1, and/or overflow transistors OF11 and OF12, etc., but is not limited thereto.

The pixel 1T_PXa may include 4 photoelectric conversion elements PD shared by other pixels, but the example embodiments are not limited thereto. For example, in the case where the pixel 1T_PXa is the pixel 1T_PX6 of FIGS. 3A to 3C, the pixel 1T_PXa may include the photoelectric conversion element PD1 shared by the pixels 1T_PX6, 1T_PX1, 1T_PX2, and 1T_PX5, the photoelectric conversion element PD2 shared by the pixels 1T_PX6, 1T_PX2, 1T_PX3, and 1T_PX7, the photoelectric conversion element PD4 shared by the pixels 1T_PX6, 1T_PX5, 1T_PX9, and 1T_PX10, and the photoelectric conversion element PD5 shared by the pixels 1T_PX6, 1T_PX7, 1T_PX10, and 1T_PX11, but is not limited thereto.

The photo transistors P11 to P14 may respectively receive the same photo gate signal PG1. Shading regions of the photo transistors P11 to P14 may correspond to portions of shading regions of FIGS. 3A to 3C, but are not limited thereto. In the case where the pixel 1T_PXa is the pixel 1T_PX6 of FIGS. 3A to 3C, the photo transistors P11 to P14 may integrate charges integrated by the photoelectric conversion elements PD1, PD2, PD4, and PD5, based on the same photo gate signal PG1. First ends of the photo transistors P11 to P14 may be respectively connected to first ends of the transfer transistors T11 to T14.

The transfer transistors T11 to T14 may be respectively connected between the first ends of the photo transistors P11 to P14 and a first end of the storage transistor S1. The operation of the transfer transistors T11 to T14 may be substantially the same as the operation of the transfer transistor T11 of the pixel 4T_PX, except that the transfer transistors T11 to T14 are connected in common to the storage transistor S1, but are not limited thereto.

The storage transistor S1 may be connected between the second ends of the transfer transistors T11 to T14 and a first end of the transfer transistor T15. The storage transistor S1 may store all of the charges integrated by the photo transistors P11 to P14 using the same photo gate signal PG1, based on the storage gate signal SG, but is not limited thereto.

Unlike the example illustrated in FIG. 4A, the pixel 1T_PXa may include storage diodes connected between one end of the transfer transistors T11 to T15 and the power supply voltage GND or VDD, instead of the storage transistor S1. Unlike the example illustrated in FIG. 4A, the pixel 1T_PXa may further include a storage diode that is implemented in the substrate SUB where the pixel array 221 is implemented, so as to overlap with the storage transistor S1 in a plan view. The storage diode may also store charges integrated by the photo transistors P11 to P14, but is not limited thereto.

An operation of the transfer transistor T15 may be substantially the same as the operation of the transfer transistor T12 of the pixel 4T_PX. The reset transistor R1, the source follower transistor SF1, and/or the selection transistor SE1, etc., may constitute (configure) a readout circuit, but is not limited thereto and may include a greater or lesser number of constituent elements. An operation of the readout circuit of the pixel 1T_PXa may be substantially the same as the operation of the readout circuit of the pixel 4T_PX. Operations of the overflow transistors OF11 and OF12 may be substantially the same as the operations of the overflow transistors OF1 to OF4 of the pixel 4T_PX.

Figure 4B:
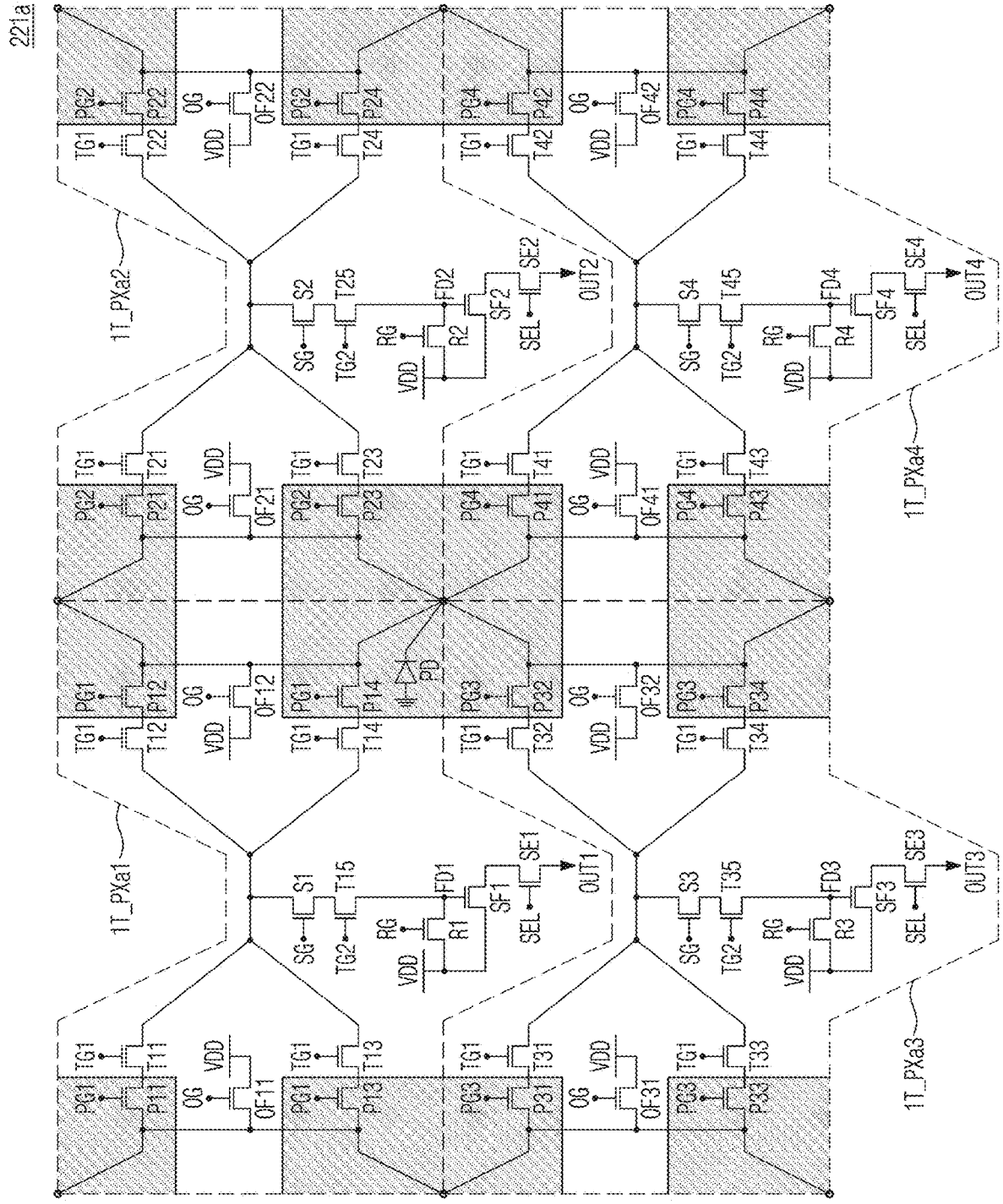

FIG. 4B illustrates a circuit diagram of a pixel array of FIGS. 3A to 3C according to some example embodiments. Each of pixels 1T_PXa1 to 1T_PXa4 of a pixel array 221a may be the pixel 1T_PXa of FIG. 4A, but are not limited thereto. Transistors of the pixels 1T_PXa1 to 1T_PXa4 are illustrated in FIG. 4B as having reference numerals based on a pixel number. For example, the pixels 1T_PXa1 to 1T_PXa4 may correspond to the pixels 1T_PX6, 1T_PX7, 1T_PX10, and 1T_PX11 of FIGS. 3A to 3C, but are not limited thereto. The photoelectric conversion element PD may correspond to the photoelectric conversion element PD5 of FIGS. 3A to 3C, but are not limited thereto.

The photoelectric conversion element PD may be shared by the pixels 1T_PXa1 to 1T_PXa4. Charges integrated by the photoelectric conversion element PD may be distributed to the pixels 1T_PXa1 to 1T_PXa4 by the photo gate signals PG1 to PG4. In the case of FIG. 3A, phases of the photo gate signals PG1 to PG4 may be different. In the case of FIGS. 3B and 3C, phases of the photo gate signals PG1 and PG4 may be the same, phases of the photo gate signals PG2 and PG3 may be the same, and the phases of the photo gate signals PG1 and PG4 may be different from the phases of the photo gate signals PG2 and PG3, but the example embodiments are not limited thereto. A phase of the photo gate signal PG1 may be different from at least one of phases of the photo gate signals PG2 to PG4. The pixels 1T_PXa1 to 1T_PXa4 sharing one photoelectric conversion element PD may output the output signals OUT1 to OUT4 based on the photo gate signals PG1 to PG4, respectively. The number of pixels sharing one photoelectric conversion element PD is not limited to the example illustrated in FIG. 4B.

Figure 4C:
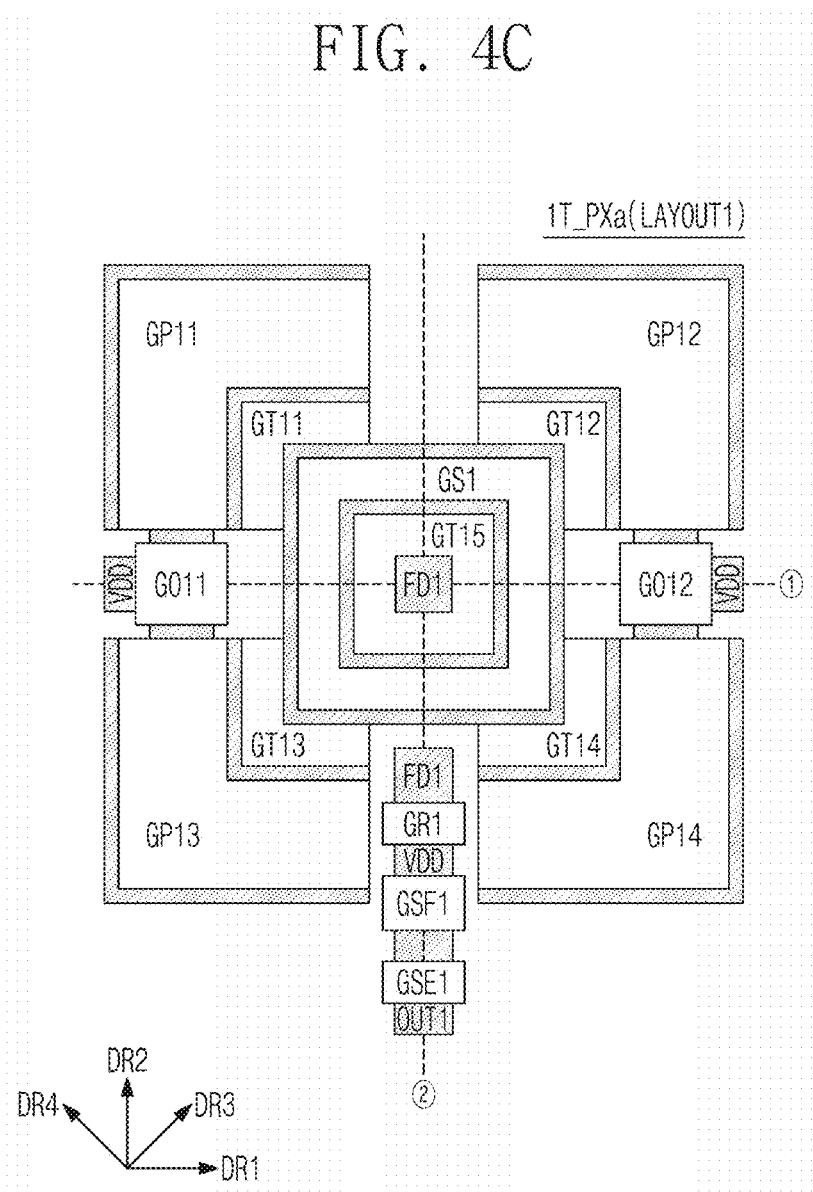

FIG. 4C illustrates a layout of a pixel of FIG. 4A, according to at least one example embodiment. Drains or sources of the transistors P11 to P14, T11 to T14, S1, T15, R1, SF1, SE1, OF11, and OF12 and the floating diffusion region FD1 of the pixel 1T_PXa may be formed or disposed in shading regions of FIG. 4C. Gate electrodes of the transistors P11 to P14, T11 to T14, S1, T15, R1, SF1, SE1, OF11, and OF12 of the pixel 1T_PXa may be disposed in regions between the shading regions of FIG. 4C.

A region of the pixel 1T_PXa may be divided into a central region including the center of the pixel 1T_PXa and a boundary region adjacent to another pixel. The floating diffusion region FD1 may be disposed in the central region. A gate electrode GT15 of the transfer transistor T15 may be disposed in the central region and may be formed in the shape of a ring surrounding the floating diffusion region FD1 in a plan view. A gate electrode GS1 of the storage transistor S1 may be disposed in the central region and may be formed in the shape of a ring surrounding the floating diffusion region FD1 and the gate electrode GT15 in a plan view. However, the example embodiments are not limited thereto, and the pixel 1T_PX may have a different arrangement.

Each of gate electrodes GT11 to GT14 of the transfer transistors T11 to T41 may be disposed in a boundary region (or a peripheral area) adjacent to the gate electrode GS1 along the direction DR3 or the direction DR4. Gate electrodes GP11 to GP14 of the photo transistors P11 to P14 may be disposed in the boundary region adjacent to the respective gate electrodes GT11 to GT14 along the direction DR3 or the direction DR4. The photo transistors P11 to P14 may be respectively disposed in the four corner regions included in the boundary region.

The imaginary line ① may be parallel to the direction DR1, and the imaginary line ② may be parallel to the direction DR2. In a plan view, an intersection of the imaginary lines ① and ② may be the center of the pixel 1T_PXa. The gate electrodes GP11 and GP13 may be symmetrical with respect to the imaginary line ①. The gate electrodes GP12 and GP14 may be symmetrical with respect to the imaginary line ①. The gate electrodes GP11 and GP12 may be symmetrical with respect to the imaginary line ②. The gate electrodes GP13 and GP14 may be symmetrical with respect to the imaginary line ②. The gate electrodes GP11 and GP14 may be symmetrical with respect to the center of the pixel 1T_PXa. The gate electrodes GP12 and GP13 may be symmetrical with respect to the center of the pixel 1T_PXa. However, the example embodiments are not limited to the above arrangement.

A gate electrode GO11 of the overflow transistor OF11 may be interposed (disposed, arranged, etc.) between the gate electrodes GP11 and GP13. A gate electrode GO12 of the overflow transistor OF12 may be interposed between the gate electrodes GP12 and GP14. The gate electrodes GR1, GSF1, and GSE1 of the transistors R1, SF1, and SE1 may be interposed between the gate electrodes GP13 and GP14. The gate electrode GR1 may be disposed adjacent to the floating diffusion region FD1 along the direction DR2. The gate electrode GSF1 may be disposed adjacent to the gate electrode GR1 along the direction DR2. The gate electrode GSE1 may be disposed adjacent to the gate electrode GSF1 along the direction DR2. The transistors OF11, OF12, R1, SF1, and SE1 may be disposed in any regions between the photo transistors P11 to P14. However, the example embodiments are not limited to the above arrangement.

A metal wire connecting the floating diffusion regions FD1 may be further disposed on/above the pixel 1T_PXa, but is not limited thereto. A metal wire connecting the gate electrode GSF1 to the floating diffusion regions FD1 may be further disposed on/above the pixel 1T_PXa, etc.

As an example, the pixel 1T_PXa may include charge transfer paths that are respectively formed from the gate electrodes GP11 to GP14 to the floating diffusion region FD1 along the direction DR3 or the direction DR4. The above-described pixel 4T_PX may include charge transfer paths that are respectively formed from the gate electrodes GP1 to GP4 to the floating diffusion regions FD1 to FD4 along the directions DR1, DR3, and DR4. The charge transfer path of the pixel 1T_PXa from the gate electrode GP11 to the floating diffusion region FD1 is formed in a straight line along the direction DR4 and is not formed along any other direction, but is not limited thereto. The charge transfer path of the pixel 4T_PX from the gate electrode GP1 to the floating diffusion region FD1 is formed along two directions DR4 and DR1 and is not formed in a straight line, but is not limited thereto. A charge transfer path of the pixel 1T_PXa may be shorter than a charge transfer path of the pixel 4T_PX, and a charge transfer efficiency of the pixel 1T_PXa may be higher than a charge transfer efficiency of the pixel 4T_PX.

Figure 4D:
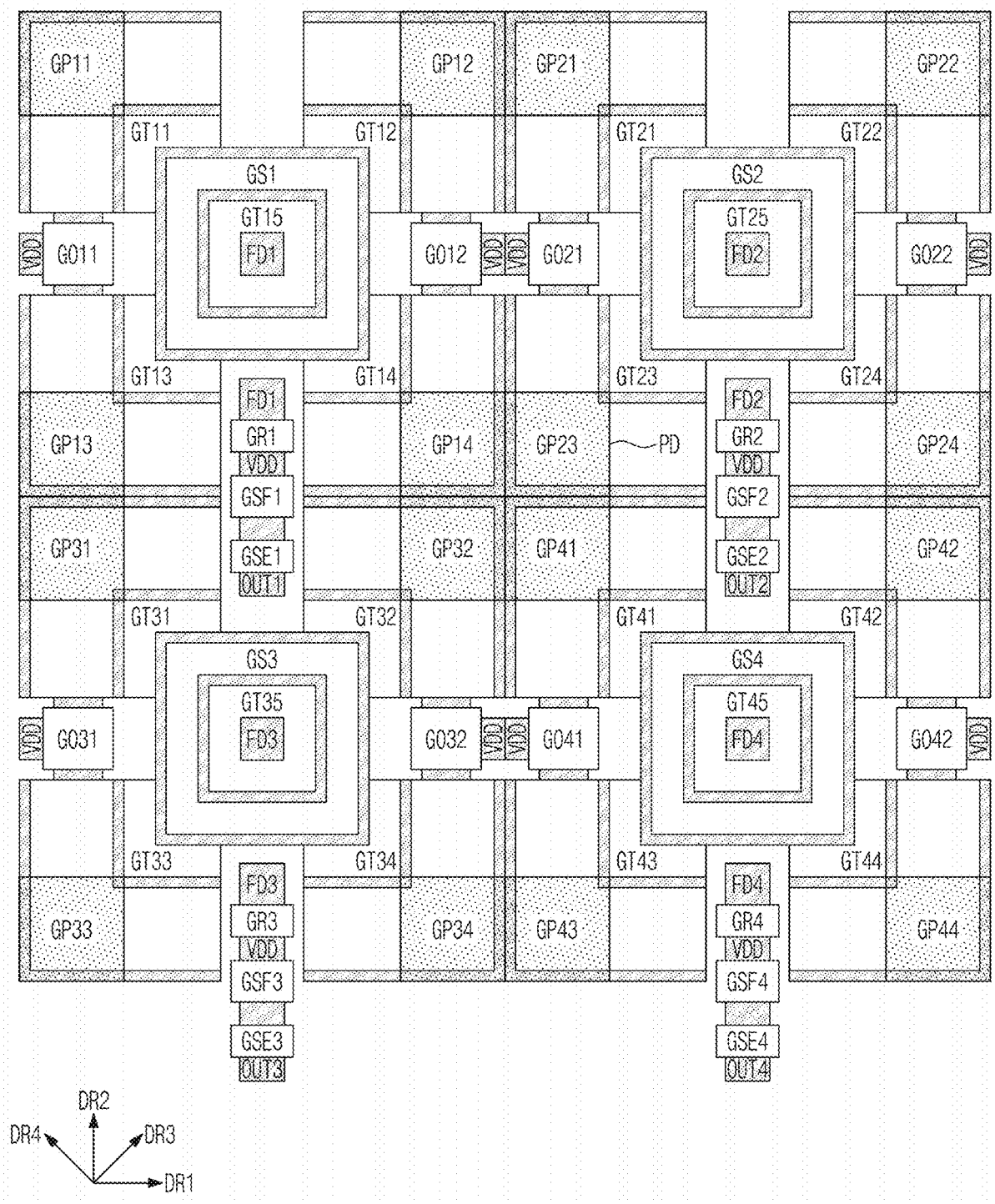

FIG. 4D illustrates a layout of a pixel array of FIG. 4B, according to at least one example embodiment. Each of the layouts of the pixels 1T_PXa1 to 1T_PXa4 of the pixel array 221a may be substantially the same as the layout LAYOUT1 of the pixel 1T_PXa of FIG. 4C, but are not limited thereto. The layout of the pixel 1T_PXa may be repeatedly disposed along the directions DR1 and DR2. In FIGS. 4D, 4F, 5D, 6D, 7D, 7F, 8D, 9D, 10D, 11D, 12D, 12F, 12H, and 12J, shading regions overlapping the gate electrodes GP11 to GP14, GP21 to GP24, GP31 to GP34, and GP41 to GP44 in a plan view may correspond to the light detecting regions FIGS. 3A to 3C, but are not limited thereto.

Figure 4E:
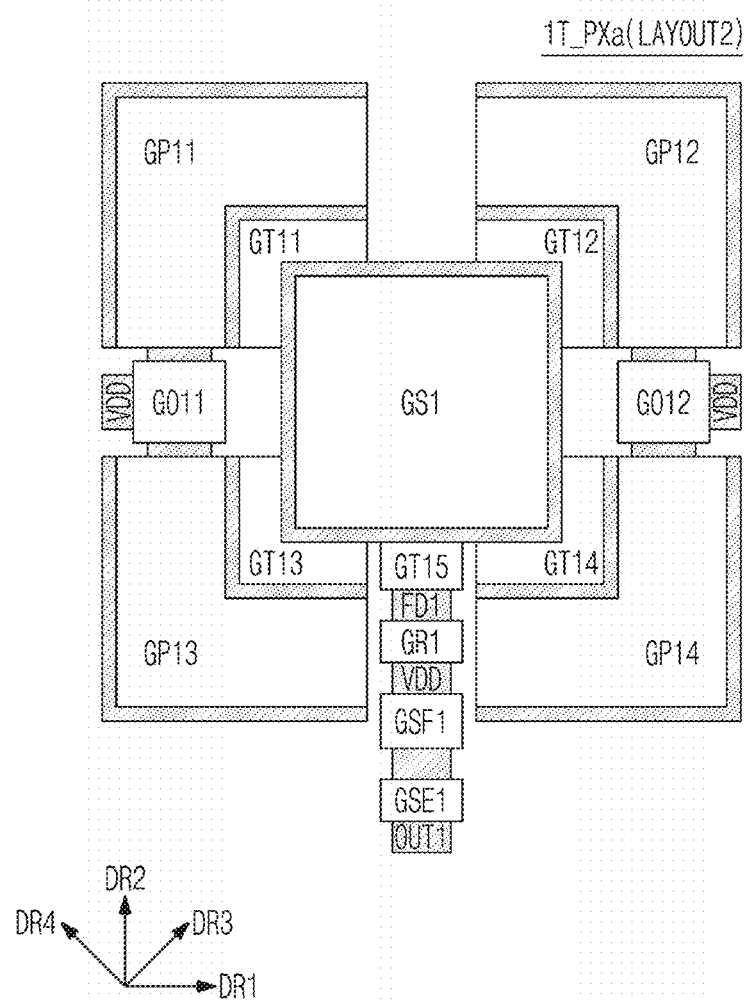
Figure 4F:
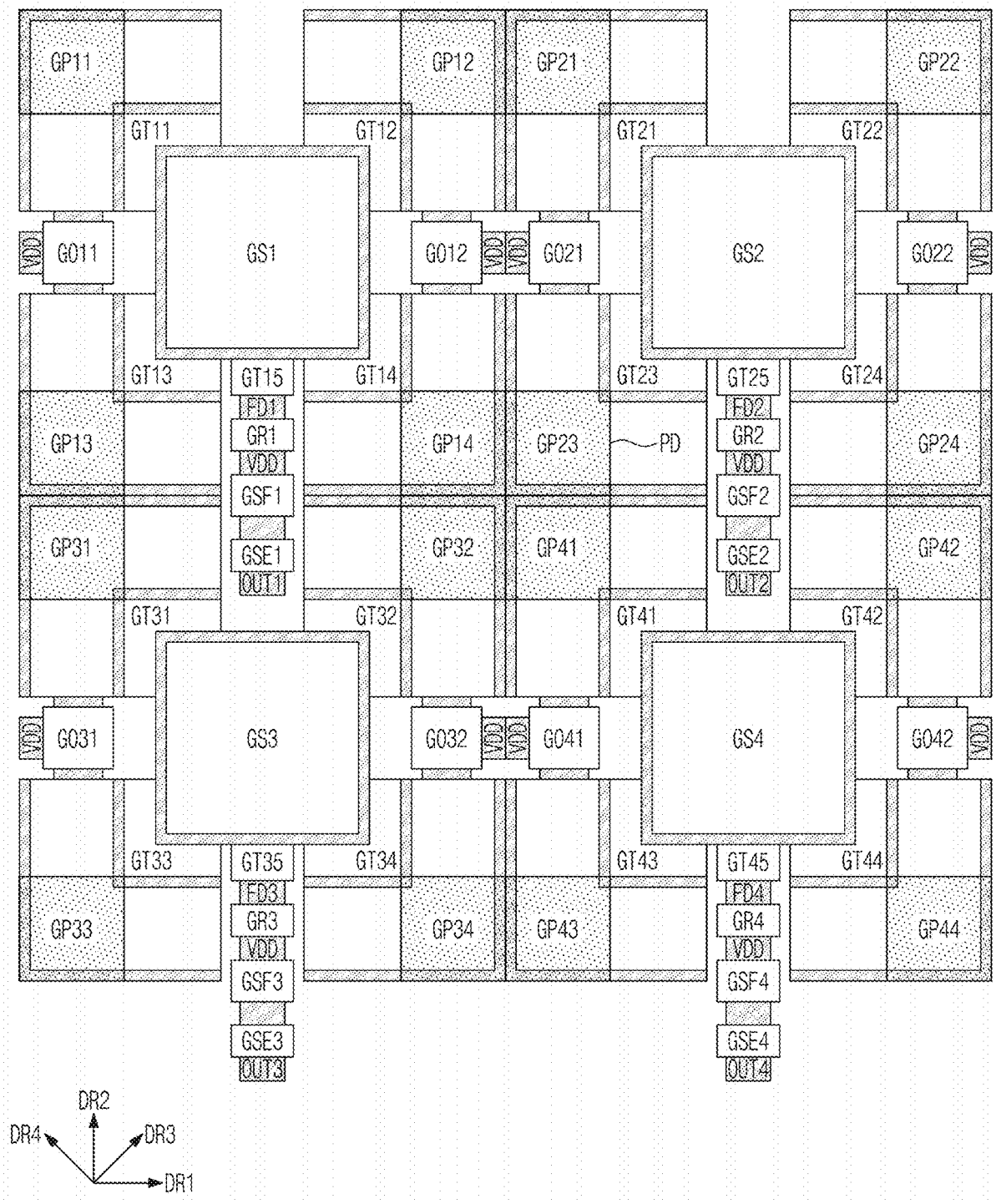

FIG. 4E illustrates a layout of a pixel of FIG. 4A, according to another example embodiment. A description will be focused on the differences between a layout LAYOUT2 of FIG. 4E and the layout LAYOUT1 of FIG. 4C. The floating diffusion region FD1 may not be disposed on the center of the pixel 1T_PXa in FIG. 4E, but the gate electrode GS1 may be disposed on the center of the pixel 1T_PXa. The area of the gate electrode GS1 of FIG. 4E may be larger than the area of the gate electrode GS1 of FIG. 4C, but is not limited thereto, and a full well capacity (FWC) of the storage transistor S1 may increase. The gate electrode GT15 may be interposed between the floating diffusion region FD1 and the gate electrode GS1 along the direction DR2. FIG. 4F illustrates a layout of a pixel array of FIG. 4B, according to another example embodiment. Each of the layouts of the pixels 1T_PXa1 to 1T_PXa4 of the pixel array 221a may be substantially the same as the layout LAYOUT2 of the pixel 1T_PXa of FIG. 4E, but is not limited thereto.

Figure 5A:
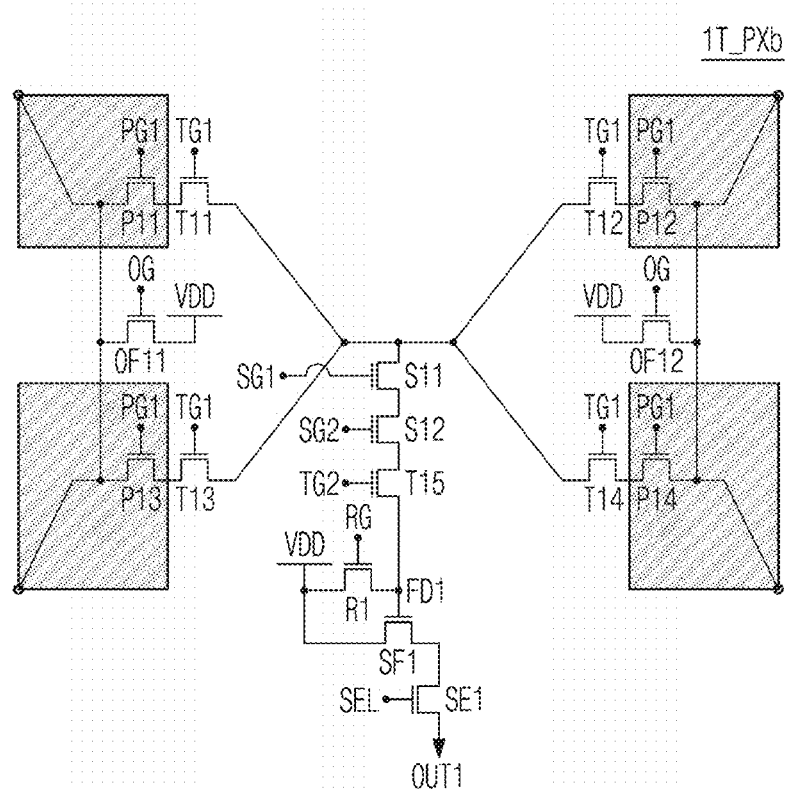

FIG. 5A illustrates a circuit diagram of a pixel of FIGS. 3A to 3C according to some example embodiments. A pixel 1T_PXb may be the pixel 1T_PX of the pixel array 221, but is not limited thereto. A description will be focused on a difference between the pixel 1T_PXb and the pixel 1T_PXa.

For example, the operation of a storage transistor S11 may be substantially the same as the operation of the storage transistor S1 of the pixel 1T_PXa, but is not limited thereto. A storage gate signal SG1 may be substantially the same as the storage gate signal SG described above, but is not limited thereto. The pixel 1T_PXb may further include a storage transistor S12 that is connected between the storage transistor S11 and the transfer transistor T15. Based on a storage gate signal SG2 having a voltage level higher or lower than (e.g., not equal to) a voltage level of the storage gate signal SG1, the storage transistor S12 may store charges transmitted from the storage transistor S11, and may transfer the charges to the floating diffusion region FD1 through the transfer transistor T15. Charge transfer between the storage transistor S11 and the floating diffusion region FD1 may be improved by using the storage transistor S12.

As another example, the operation of the storage transistor S12 may be substantially the same as the operation of the storage transistor S1 of the pixel 1T_PXa, but is not limited thereto. The storage gate signal SG2 may be substantially the same as the storage gate signal SG described above. The pixel 1T_PXb may further include the storage transistor S11 between the first ends of the transfer transistors T11 to T14 and a first end of the storage transistor S12. Based on the storage gate signal SG1 having a voltage level higher or lower than (e.g., not equal to) a voltage level of the storage gate signal SG2, the storage transistor S11 may store charges transmitted from the photo transistors P11 to P14 through the transfer transistors T11 to T14, and may transfer the charges to the storage transistor S12. Charge transfer between the photo transistors P11 to P14 and the storage transistor S12 may be improved by using the storage transistor S11.

Figure 5B:
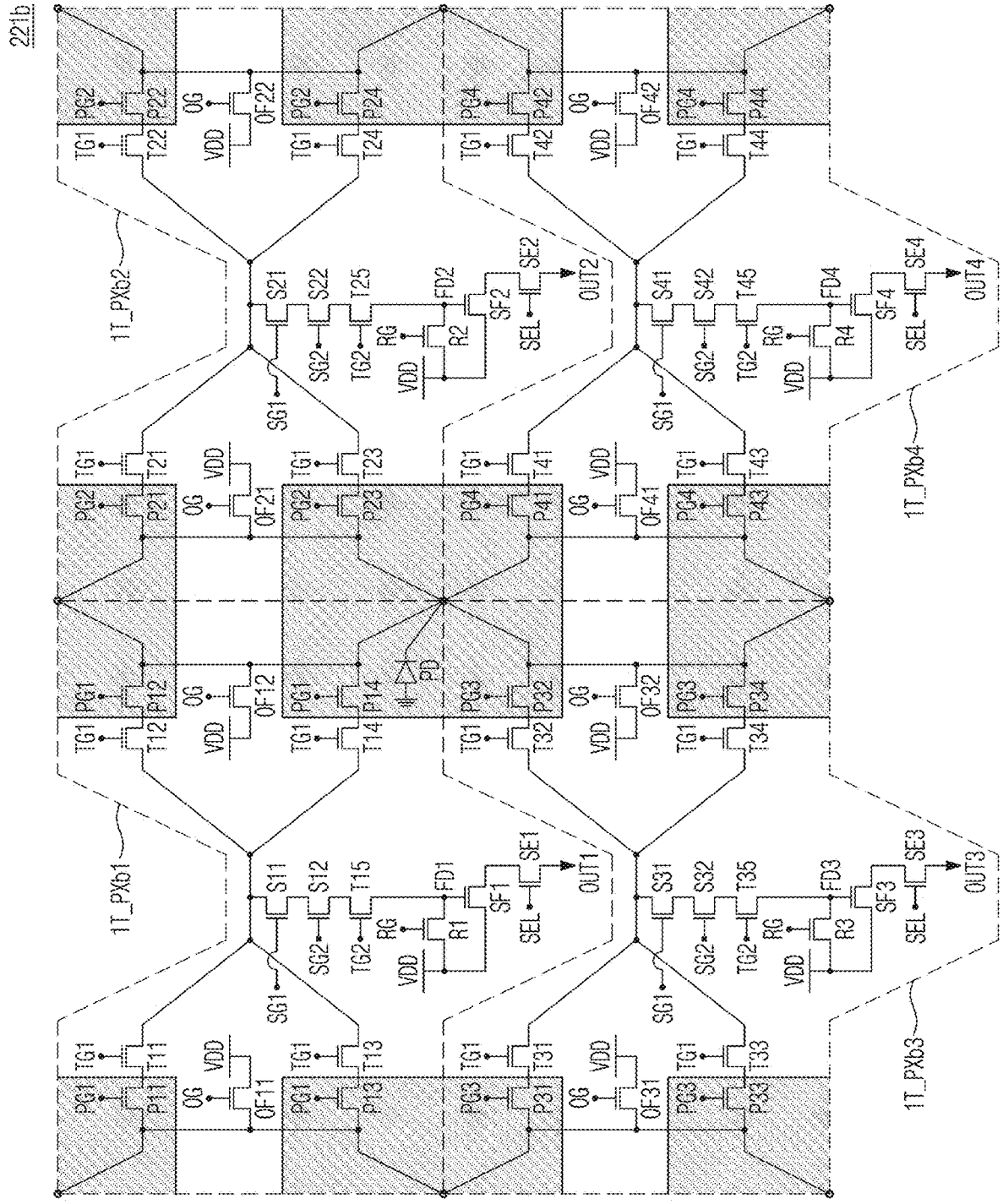

FIG. 5B illustrates a circuit diagram of a pixel array including a pixel of FIG. 5A according to at least one example embodiment. A pixel array 221b may include pixels 1T_PXb1 to 1T_PXb4 and may operate to be similar to the pixel array 221a, but are not limited thereto.

Figure 5D:
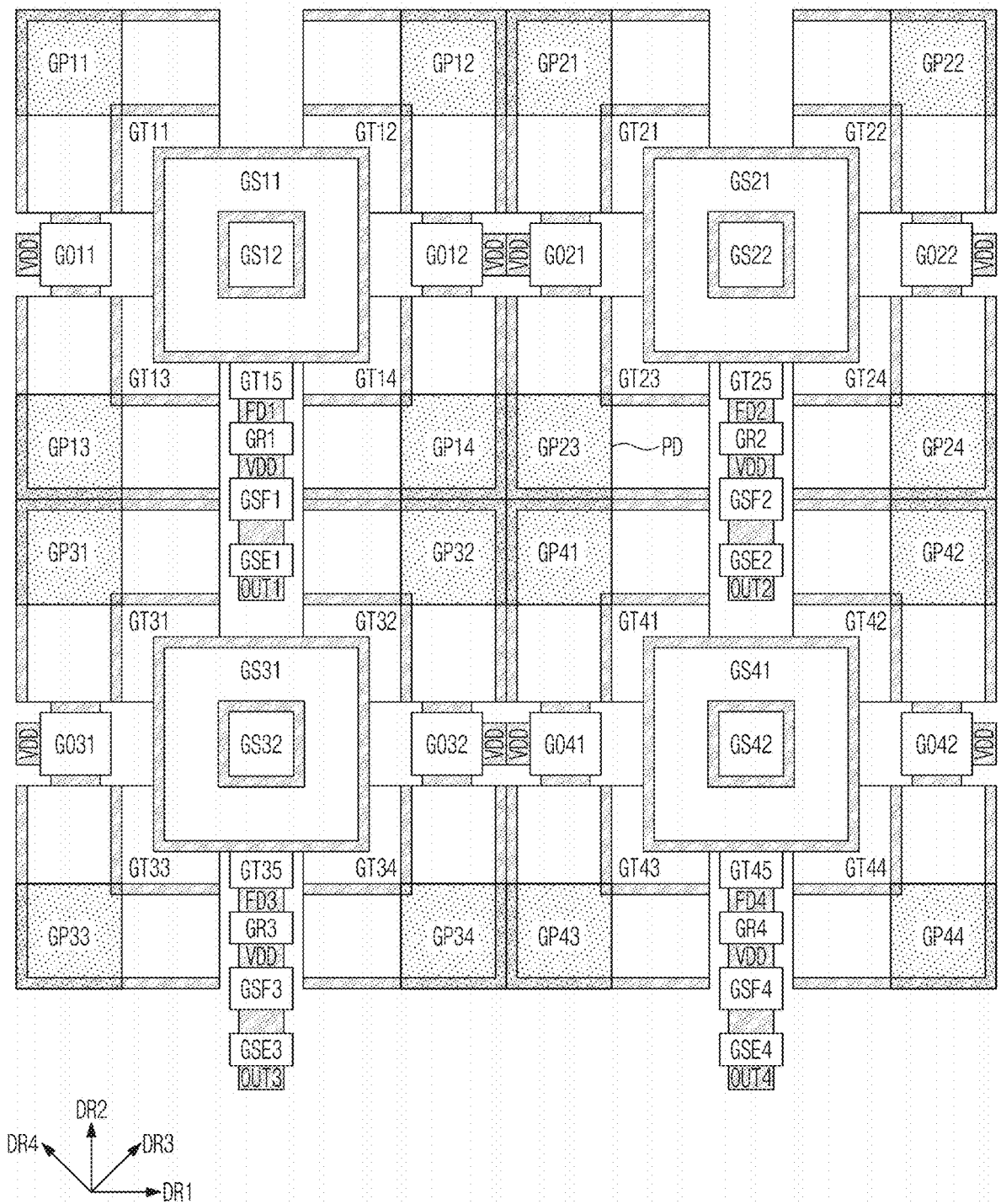

FIG. 5C illustrates a layout of a pixel of FIG. 5A according to at least one example embodiment. A description will be focused on the differences between a layout of the pixel 1T_PXb and the layout of the pixel 1T_PXa of FIG. 4E. A gate electrode GS12 of the storage transistor S12 may be disposed in the central region of the pixel 1T_PXb as seen in FIG. 5C. A gate electrode GS11 of the storage transistor S11 may be disposed in the central region of the pixel 1T_PXb and may be formed in the shape of a ring surrounding the gate electrode GS12 in a plan view of FIG. 5C. FIG. 5D illustrates a layout of a pixel array of FIG. 5B according to at least one example embodiment. Each of layouts of the pixels 1T_PXb1 to 1T_PXb4 of the pixel array 221b may be substantially the same as the layout of the pixel 1T_PXb of FIG. 5C, but is not limited thereto.

Figure 6A:
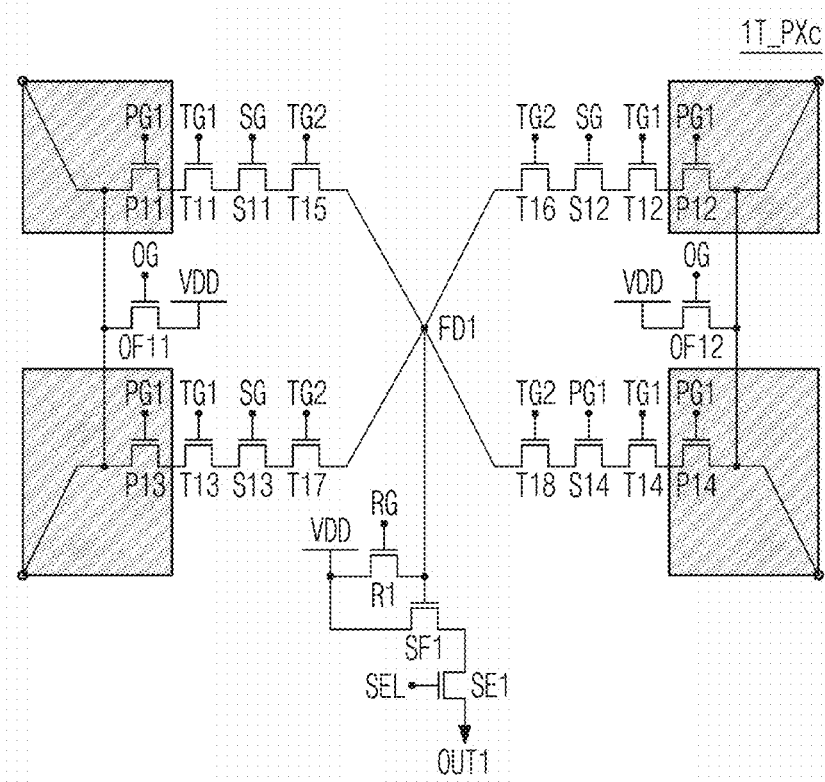

FIG. 6A illustrates a circuit diagram of a pixel of FIGS. 3A to 3C according to some example embodiments. A pixel 1T_PXc may be the pixel 1T_PX of the pixel array 221. A description will be focused on the differences between the pixel 1T_PXc and the pixel 1T_PXa.

The pixel 1T_PXc may include the storage transistor S11 connected between the transfer transistors T11 and T15, the storage transistor S12 connected between the transfer transistors T12 and T16, a storage transistor S13 connected between the transfer transistors T13 and T17, and/or a storage transistor S14 connected between the transfer transistors T14 and T18, etc. The storage transistor S1 of the pixel 1T_PXa may be distributed (or divided) into the storage transistors S11 to S14 of the pixel 1T_PXc. The operation of the storage transistors S11 to S14 may be similar to the operation of the storage transistor S1 of the pixel 1T_PXa. The pixel 1T_PXc may include the transfer transistors T15 to T18 connected between the storage transistors S11 to S14 and the floating diffusion region FD1, respectively. The transfer transistor T15 of the pixel 1T_PXa may be distributed into the transfer transistors T15 to T18 of the pixel 1T_PXc. Operation of the transfer transistors T15 to T18 may be similar to the operation of the transfer transistor T15 of the pixel 1T_PXa.

Figure 6B:
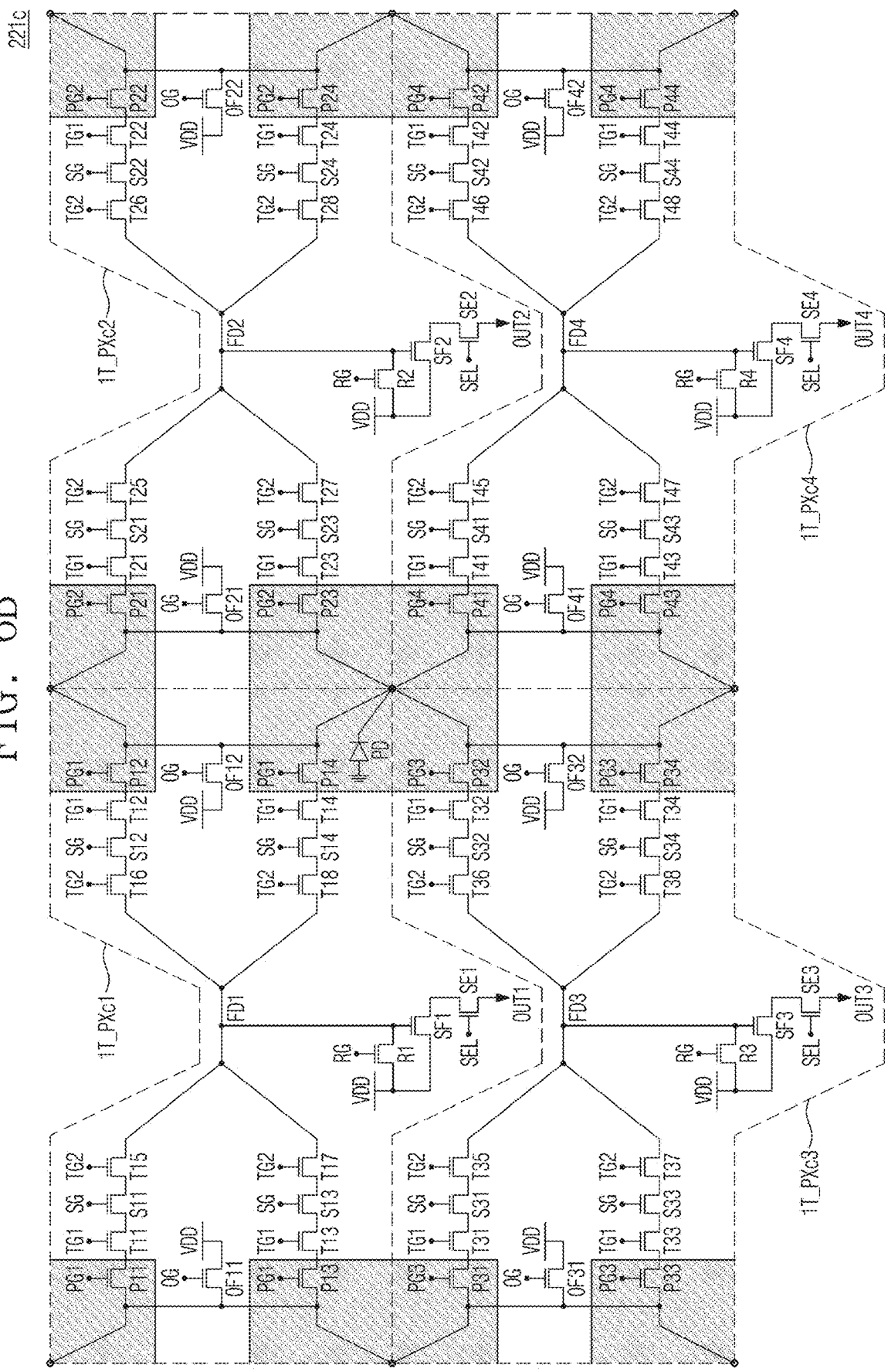
Figure 6C:
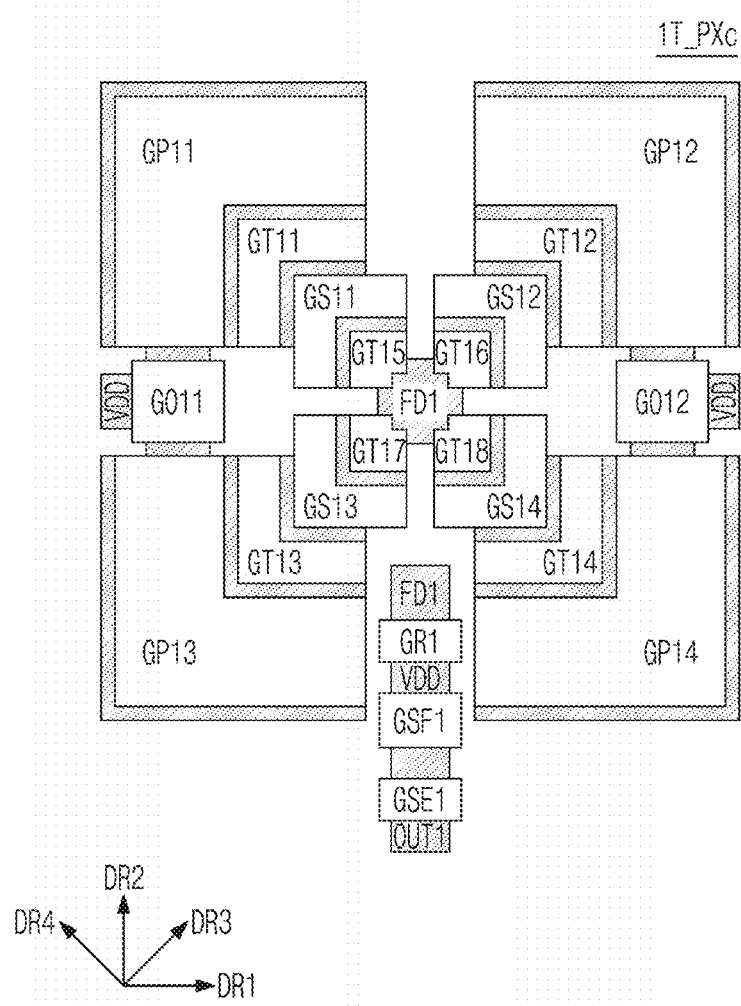

FIG. 6B illustrates a circuit diagram of a pixel array including a pixel of FIG. 6A according to at least one example embodiment. A pixel array 221c may include a plurality of pixels, e.g., 1T_PXc1 to 1T_PXc4, and may operate in a similar manner as the pixel array 221a. FIG. 6C illustrates a layout of a pixel of FIG. 6A according to at least one example embodiment. A description will be focused on the differences between a layout of the pixel 1T_PXc and the layout of the pixel 1T_PXa of FIG. 4C. The gate electrode GS1 of the pixel 1T_PXa may be divided into the gate electrodes GS11 to GS14 of the pixel 1T_PXc. The gate electrode GT15 of the pixel 1T_PXa may be divided into the gate electrodes GT15 to GT18 of the pixel 1T_PXc. The gate electrodes GS11 and GT15 may be disposed between the gate electrode GT11 and the floating diffusion region FD1 along the direction DR4. The gate electrodes GS12 and GT16 may be disposed between the gate electrode GT12 and the floating diffusion region FD1 along the direction DR3. The gate electrodes GS13 and GT17 may be disposed between the gate electrode GT13 and the floating diffusion region FD1 along the direction DR3. The gate electrodes GS14 and GT18 may be disposed between the gate electrode GT14 and the floating diffusion region FD1 along the direction DR4.

Figure 6D:
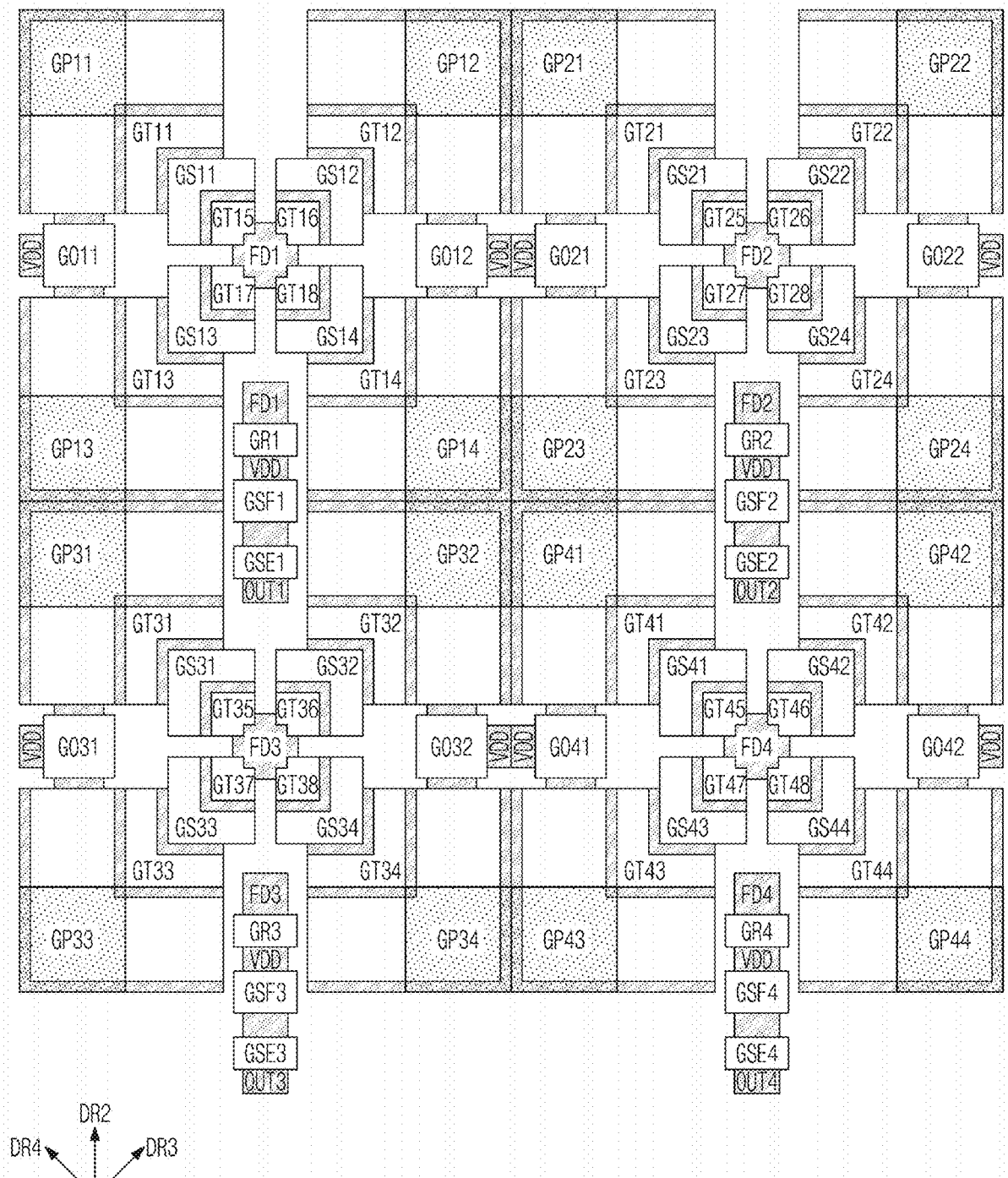

FIG. 6D illustrates a layout of a pixel array of FIG. 6B according to at least one example embodiment. Each of the layouts of the pixels 1T_PXc1 to 1T_PXc4 of the pixel array 221c may be substantially the same as the layout of the pixel 1T_PXc of FIG. 6C, but are not limited thereto.

Figure 7A:
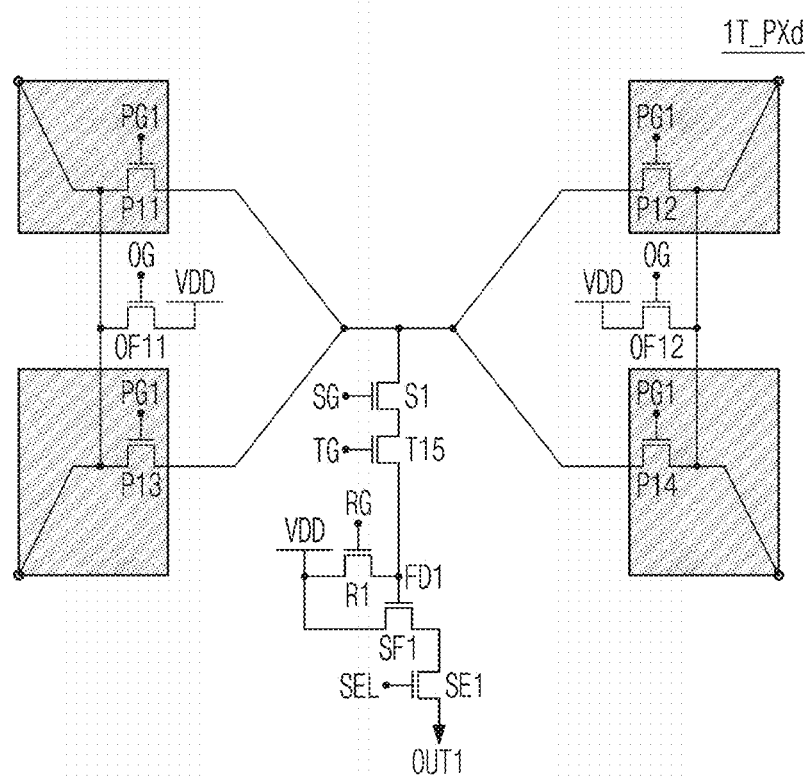

FIG. 7A illustrates a circuit diagram of a pixel of FIGS. 3A to 3C according to some example embodiments. A pixel 1T_PXd may be the pixel 1T_PX of the pixel array 221. A description will be focused on differences between the pixel 1T_PXd and the pixel 1T_PXa. The transfer transistors T11 to T14 of the pixel 1T_PXa may be integrated into the storage transistor S1 of the pixel 1T_PXd. The storage transistor S1 may be directly connected to the photo transistors P11 to P14, and may store charges integrated by the photo transistors P11 to P14 based on the storage gate signal SG. The transfer gate signal TG may be substantially the same as the transfer gate signal TG2 of FIG. 4A, but is not limited thereto.

Figure 7B:
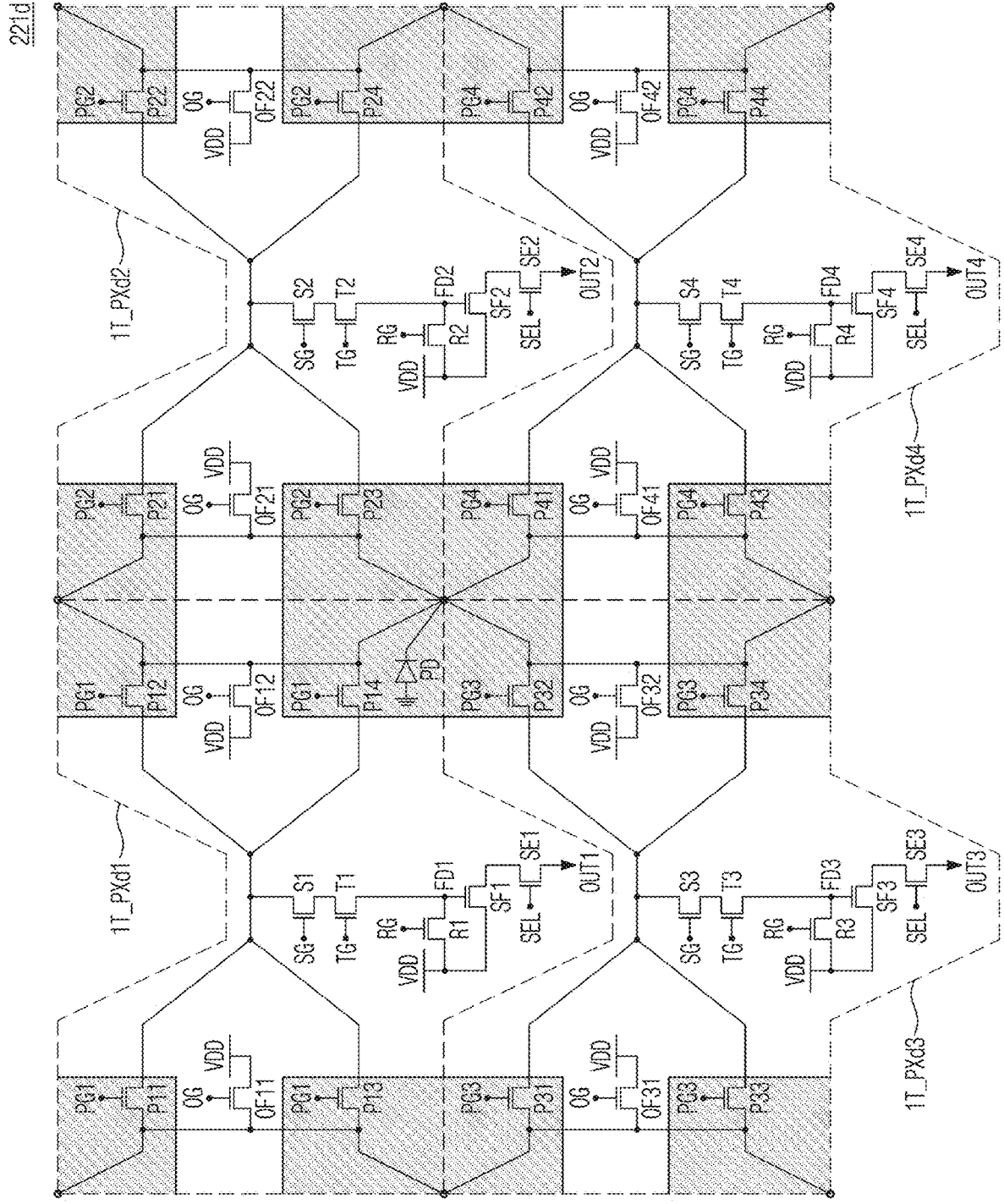
Figure 7C:
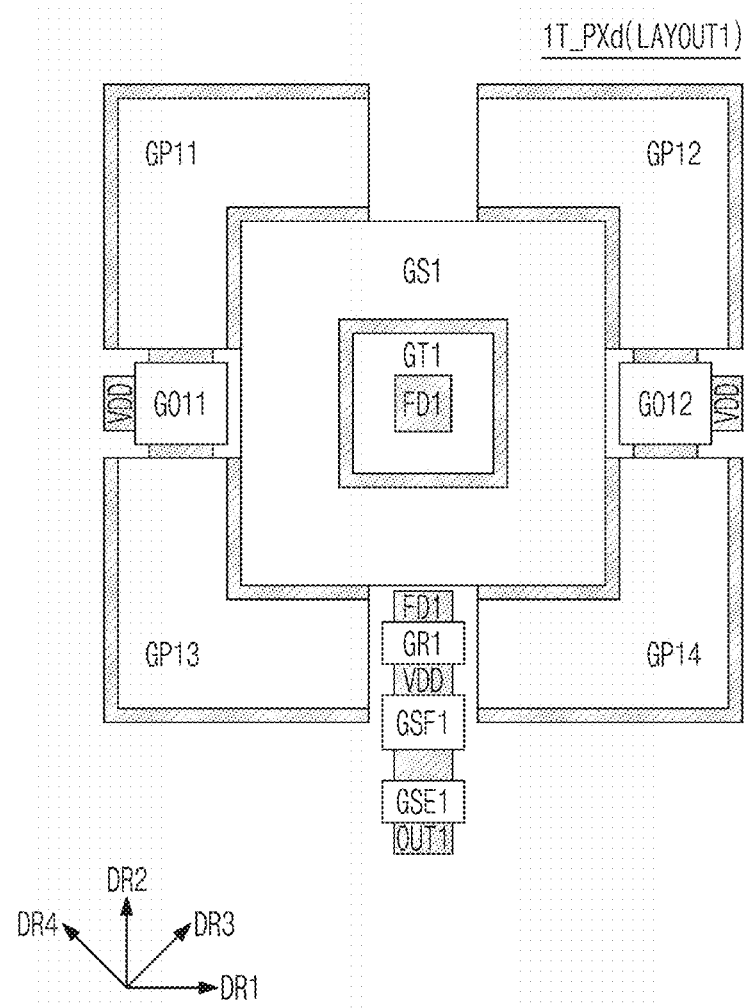
Figure 7D:
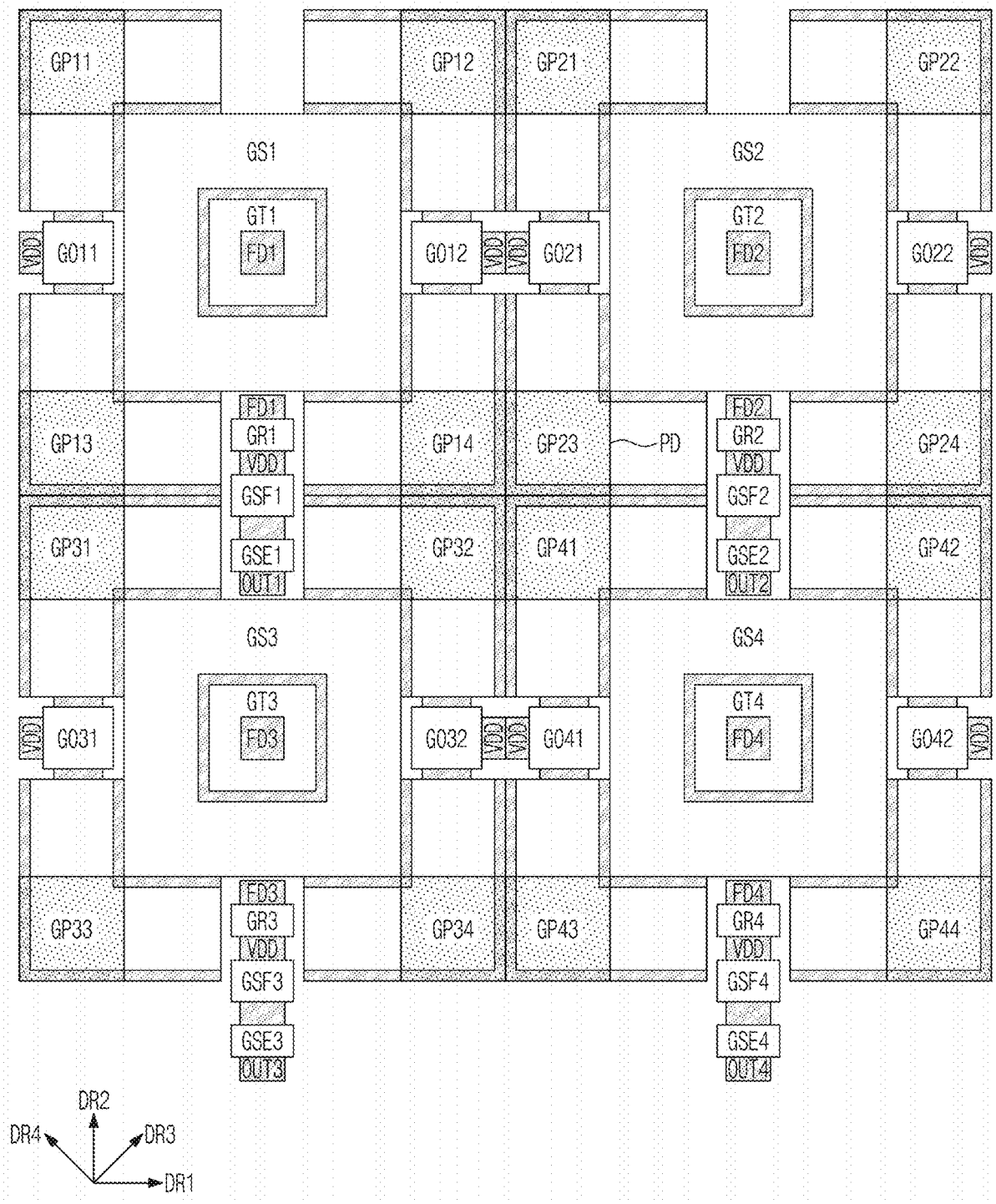
Figure 7E:
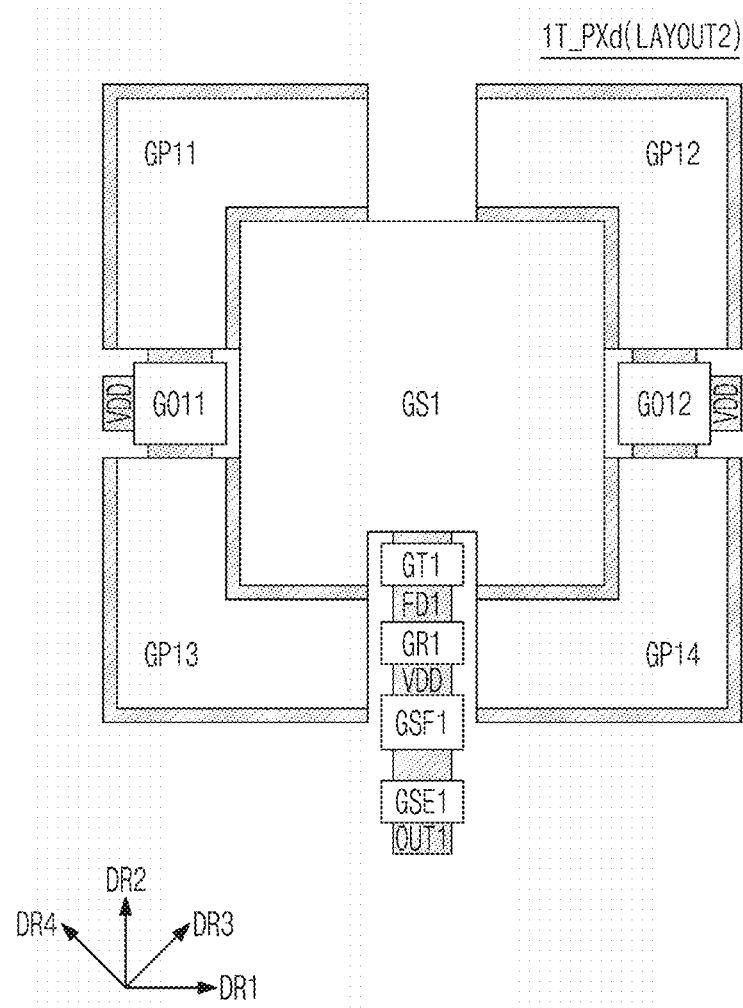
Figure 7F:
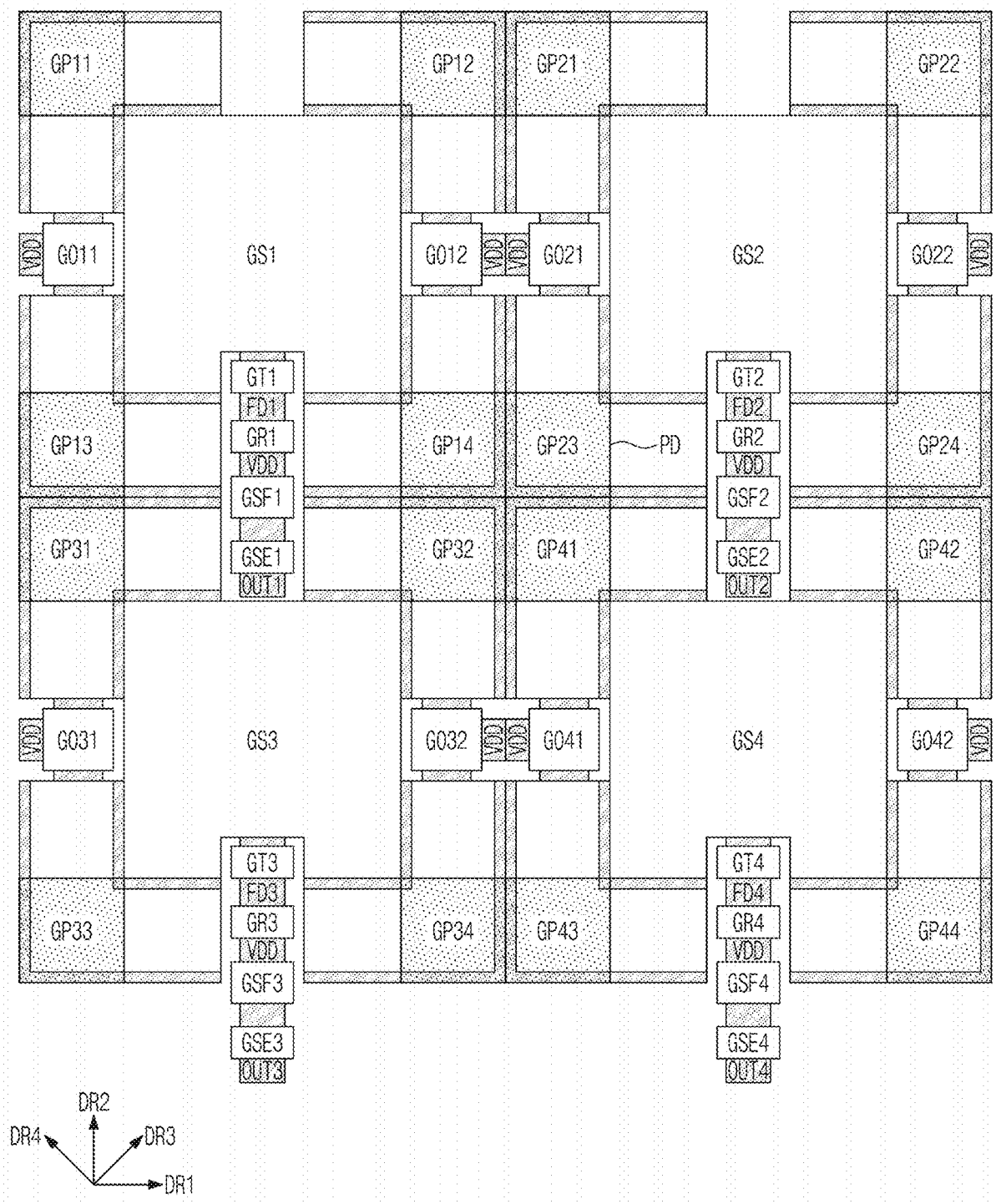

FIG. 7B illustrates a circuit diagram of a pixel array including a pixel of FIG. 7A according to at least one example embodiment. A pixel array 221d may include a plurality of pixels, such as 1T_PXd1 to 1T_PXd4, and may operate in a similar manner as the pixel array 221a, but is not limited thereto. FIGS. 7C and 7E illustrate layouts of a pixel of FIG. 7A according to some example embodiments. A description will be focused on a difference between a layout LAYOUT1 of the pixel 1T_PXd (e.g., FIG. 7C) and the layout LAYOUT1 of the pixel 1T_PXa (e.g., FIG. 4C) and a difference between a layout LAYOUT2 of the pixel 1T_PXd (e.g., FIG. 7E) and the layout LAYOUT2 of the pixel 1T_PXa (e.g., FIG. 4E). The plurality of gate electrodes GT11 to GT14 of the pixel 1T_PXa may be integrated into the gate electrode GS1 of the pixel 1T_PXd. The gate electrode GT1 of the transfer transistor T11 of the pixel 1T_PXd may be implemented to be the same as the gate electrode GT15 of the pixel 1T_PXa. FIGS. 7D and 7F illustrate layouts of a pixel array of FIG. 7B according to some example embodiments. Each of the layouts of the pixels 1T_PXd1 to 1T_PXd4 of the pixel array 221d of FIG. 7D may be substantially the same as the layout of the pixel 1T_PXd of FIG. 7C, but are not limited thereto. Each of the layouts of the pixels 1T_PXd1 to 1T_PXd4 of the pixel array 221d of FIG. 7F may be substantially the same as the layout of the pixel 1T_PXd of FIG. 7E, but are not limited thereto.

Figure 8A:
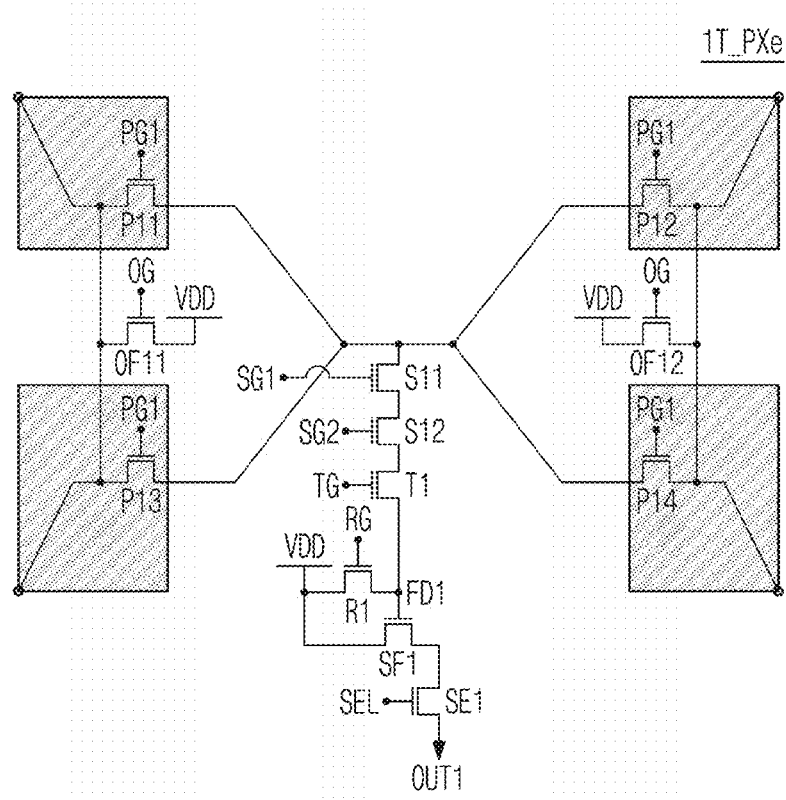

FIG. 8A illustrates a circuit diagram of a pixel of FIGS. 3A to 3C according to some example embodiments. A pixel 1T_PXe may be the pixel 1T_PX of the pixel array 221, but is not limited thereto. A description will be focused on differences between the pixel 1T_PXe and the pixel 1T_PXb. The transfer transistors T11 to T14 of the pixel 1T_PXb may be integrated into the storage transistor S11 of the pixel 1T_PXe. The storage transistor S11 may be directly connected to the photo transistors P11 to P14, and may store charges integrated by the photo transistors P11 to P14 based on the storage gate signal SG1. The transfer gate signal TG may be substantially the same as the transfer gate signal TG2 of the pixel 1T_PXb, but is not limited thereto.

Figure 8B:
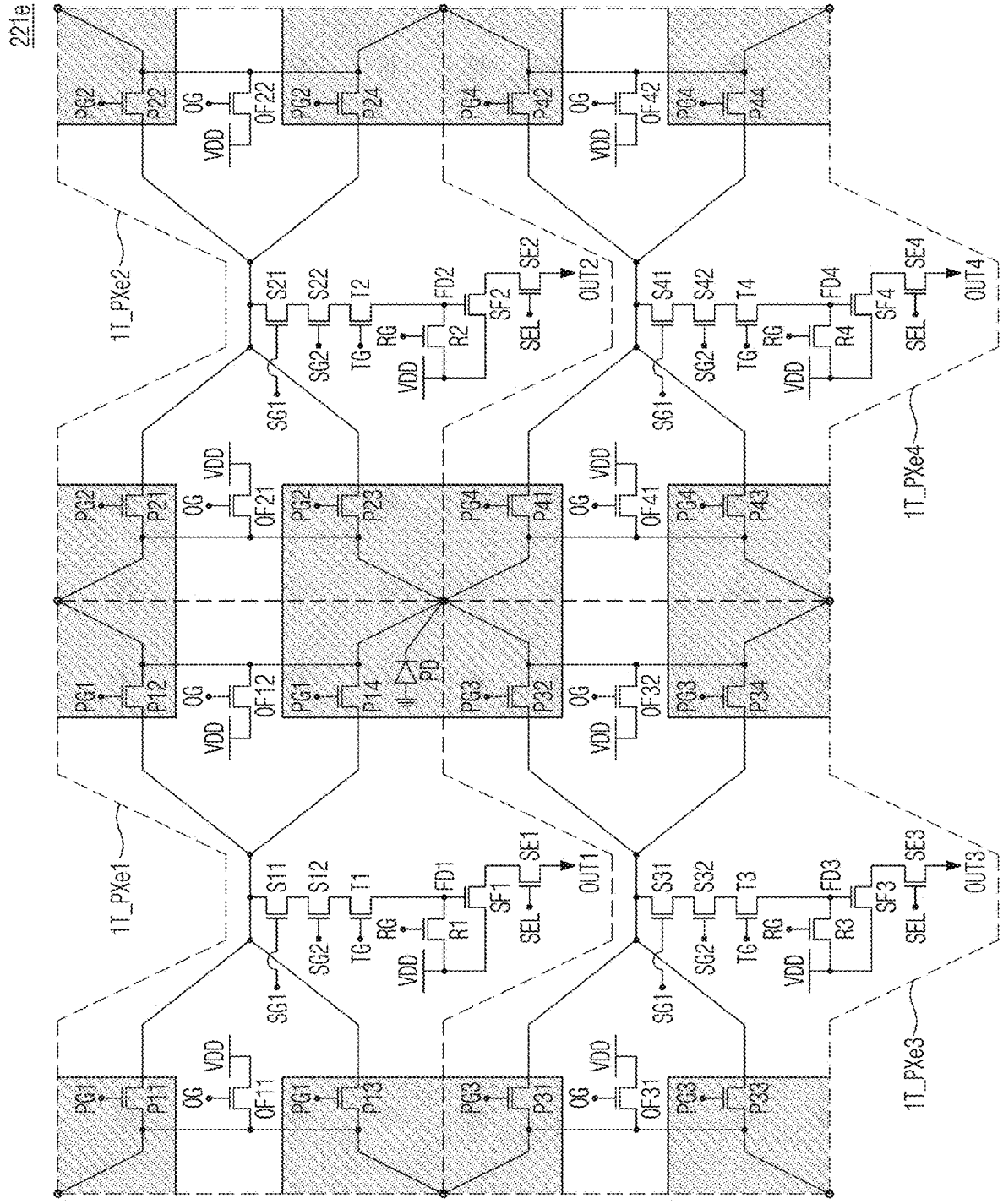
Figure 8D:
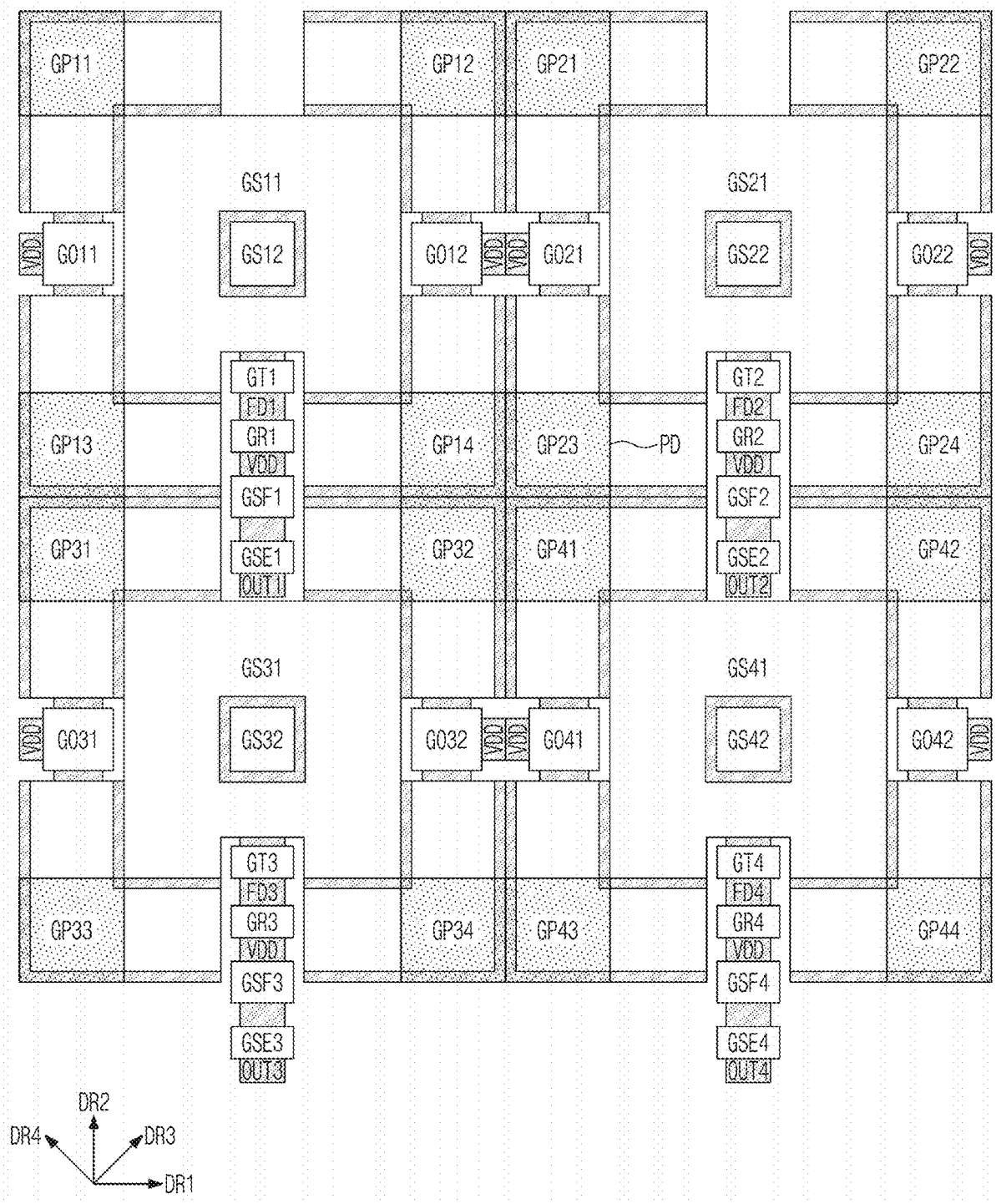

FIG. 8B illustrates a circuit diagram of a pixel array including a pixel of FIG. 8A according to at least one example embodiment. A pixel array 221e may include a plurality of pixels, such as 1T_PXe1 to 1T_PXe4, and may operate in a similar manner to the pixel array 221b. FIG. 8C illustrates a layout of a pixel of FIG. 8A according to at least one example embodiment. A description will be focused on the differences between a layout of the pixel 1T_PXe and the layout of the pixel 1T_PXb. The gate electrodes GT11 to GT14 of the pixel 1T_PXb may be integrated into the gate electrode GS11 of the pixel 1T_PXe. The gate electrode GT1 of the transfer transistor T1 of the pixel 1T_PXe may be implemented to be the same as the gate electrode GT15 of the pixel 1T_PXb, but is not limited thereto. FIG. 8D illustrates a layout of a pixel array of FIG. 8B according to at least one example embodiment. Each of the layouts of the pixels 1T_PXe1 to 1T_PXe4 of the pixel array 221e may be substantially the same as the layout of the pixel 1T_PXe of FIG. 8C, but are not limited thereto.

Figure 9A:
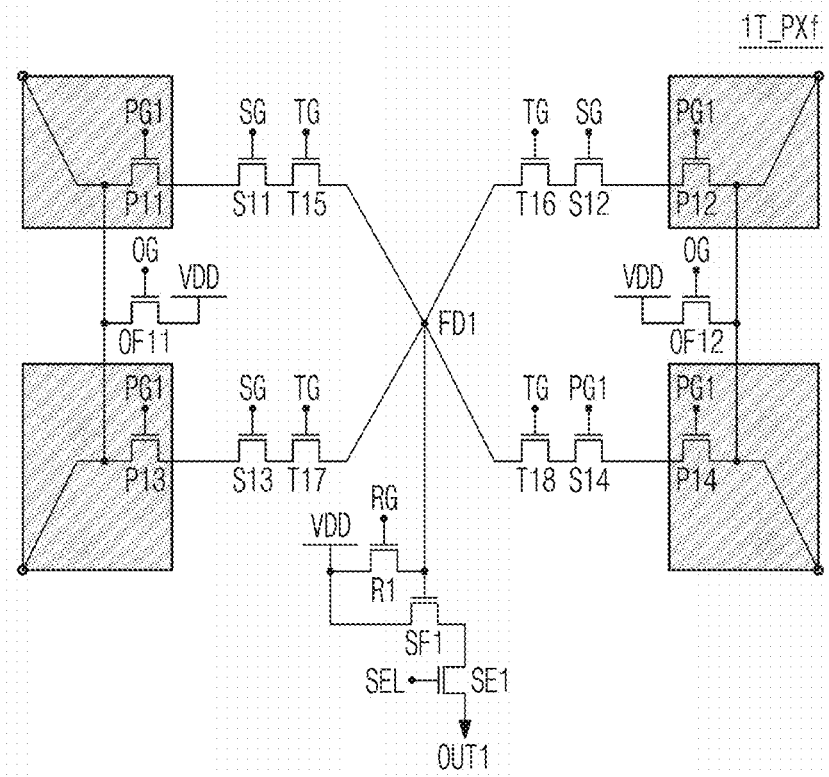

FIG. 9A illustrates a circuit diagram of a pixel of FIGS. 3A to 3C according to some example embodiments. A pixel 1T_PXf may be the pixel 1T_PX of the pixel array 221, but is not limited thereto. A description will be focused on the differences between the pixel 1T_PXf and the pixel 1T_PXc. The transfer transistors T11 to T14 of the pixel 1T_PXc may be integrated into the storage transistors S11 to S14 of the pixel 1T_PXf. The storage transistors S11 to S14 may be respectively connected to the photo transistors P11 to P14, and may store charges integrated by the photo transistors P11 to P14 based on the storage gate signal SG. The transfer gate signal TG may be substantially the same as the transfer gate signal TG2 of the pixel 1T_PXc, but is not limited thereto.

Figure 9B:
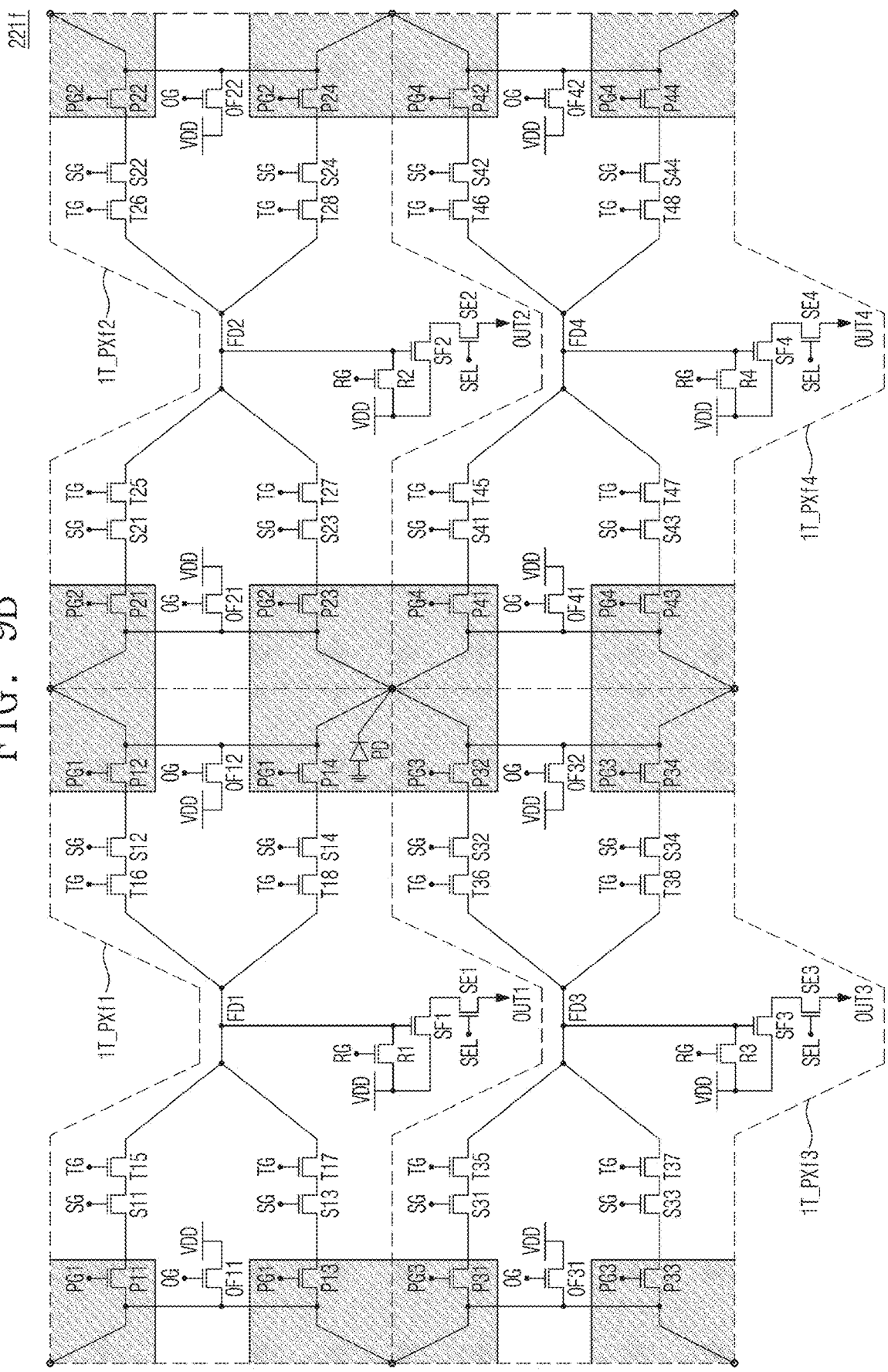
Figure 9C:
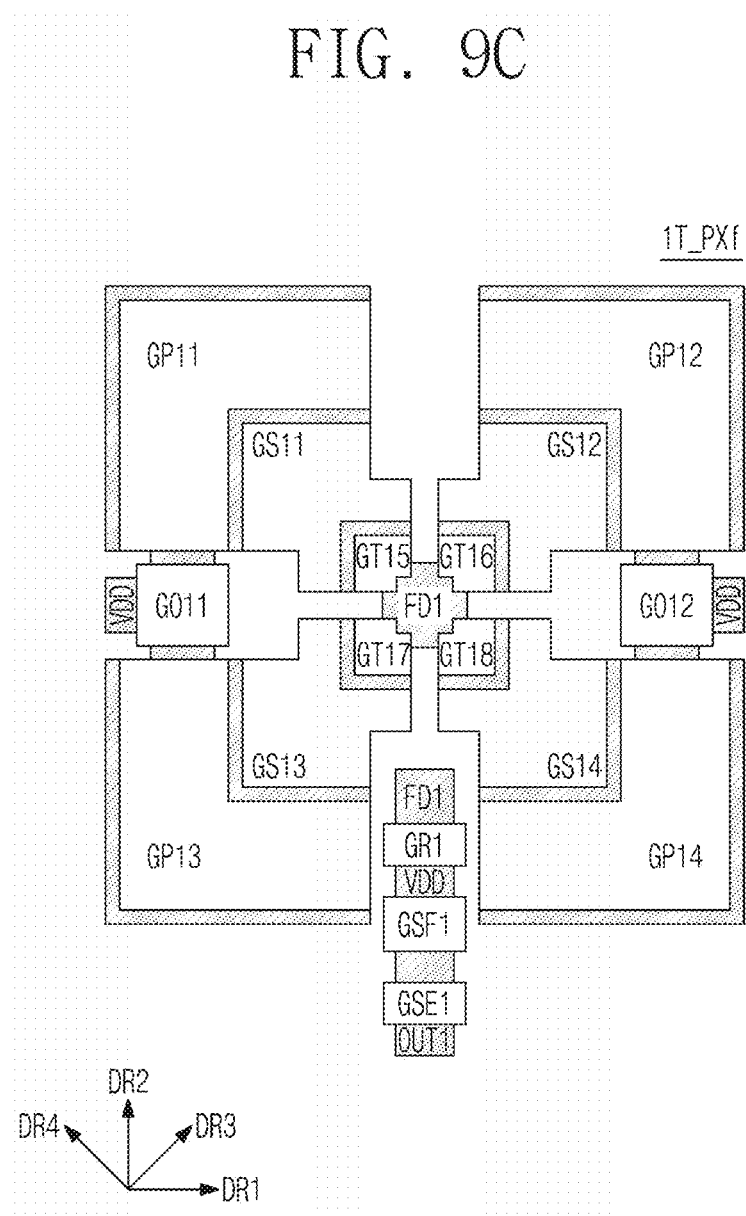
Figure 9D:
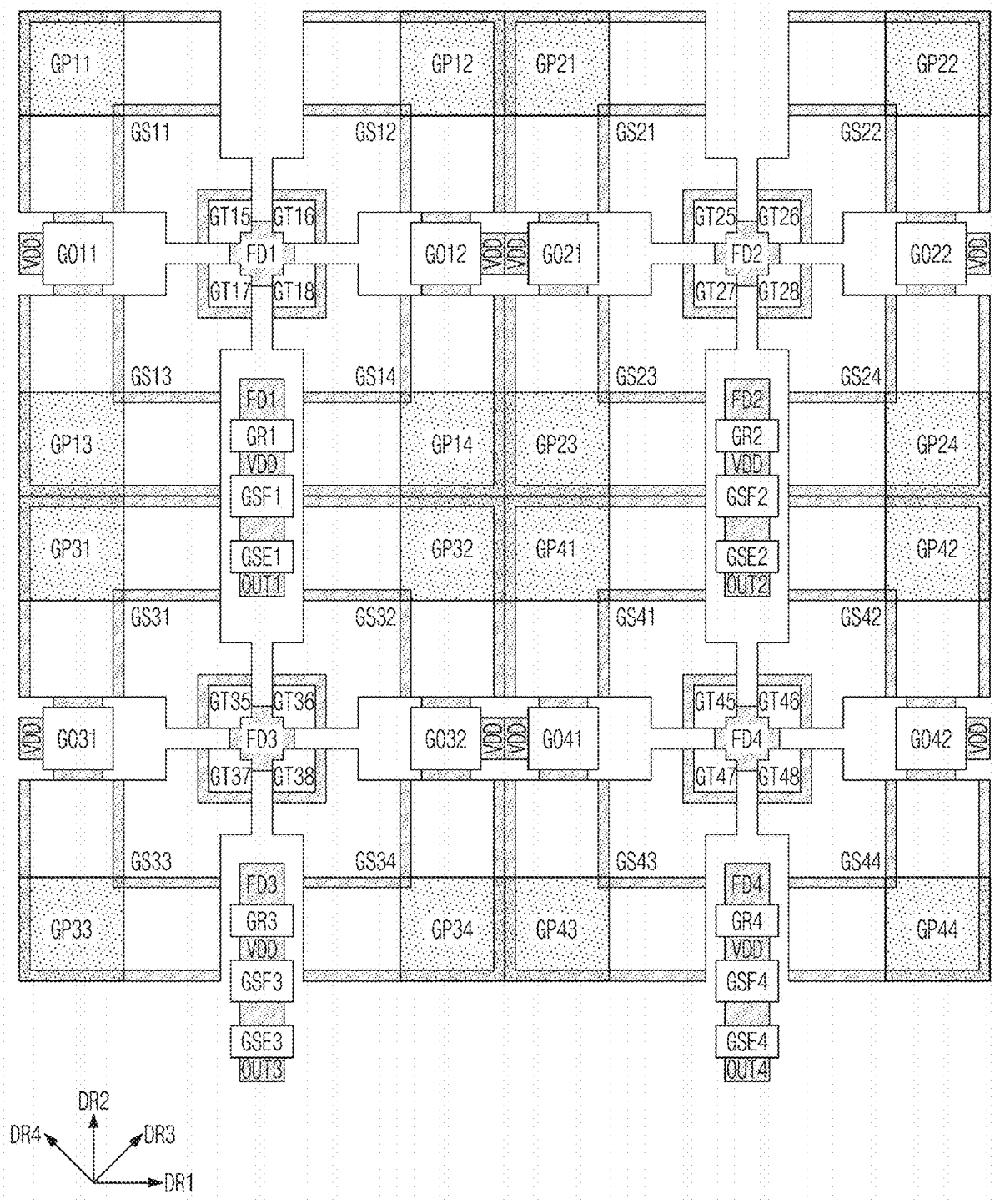

FIG. 9B illustrates a circuit diagram of a pixel array including a pixel of FIG. 9A according to at least one example embodiment. A pixel array 221f may include a plurality of pixels, such as 1T_PXf1 to 1T_PXf4, and may operate in a similar manner to the pixel array 221c. FIG. 9C illustrates a layout of a pixel of FIG. 9A according to at least one example embodiment. A description will be focused on the differences between a layout of the pixel 1T_PXf and the layout of the pixel 1T_PXc. The gate electrodes GT11 to GT14 of the pixel 1T_PXc may be respectively integrated into the gate electrodes GS11 to GS14 of the pixel 1T_PXf. FIG. 9D illustrates a layout of a pixel array of FIG. 9B according to at least one example embodiment. Each of the layers of the layouts 1T_PXf1 to 1T_PXf4 of the pixel array 221f may be substantially the same as the layout of the pixel 1T_PXf of FIG. 9C, but are not limited thereto.

Figure 10A:
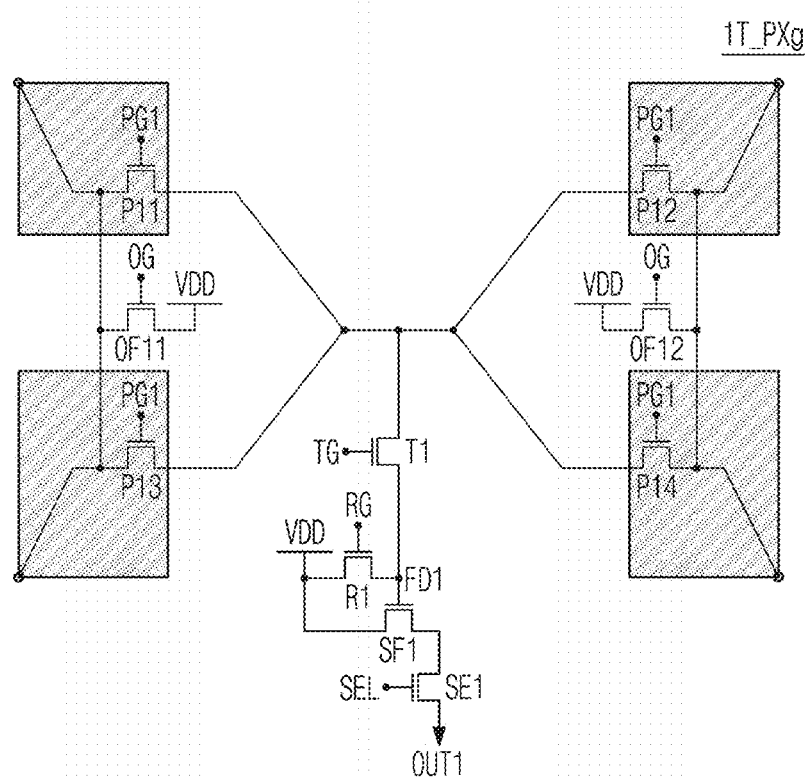

FIG. 10A illustrates a circuit diagram of a pixel of FIGS. 3A to 3C according to some example embodiments. A pixel 1T_PXg may be the pixel 1T_PX of the pixel array 221, but is not limited thereto. A description will be focused on the differences between the pixel 1T_PXg and the pixel 1T_PXa. The pixel 1T_PXg may not include the transfer transistors T11 to T14 and the storage transistor S1 of the pixel 1T_PXa. The transfer transistor T1 may be connected between first ends of the photo transistors P11 to P14 and the floating diffusion region FD1. The transfer transistor T1 may transfer charges integrated by the photo transistors P11 to P14 to the floating diffusion region FD1 based on the transfer gate signal TG.

Figure 10B:
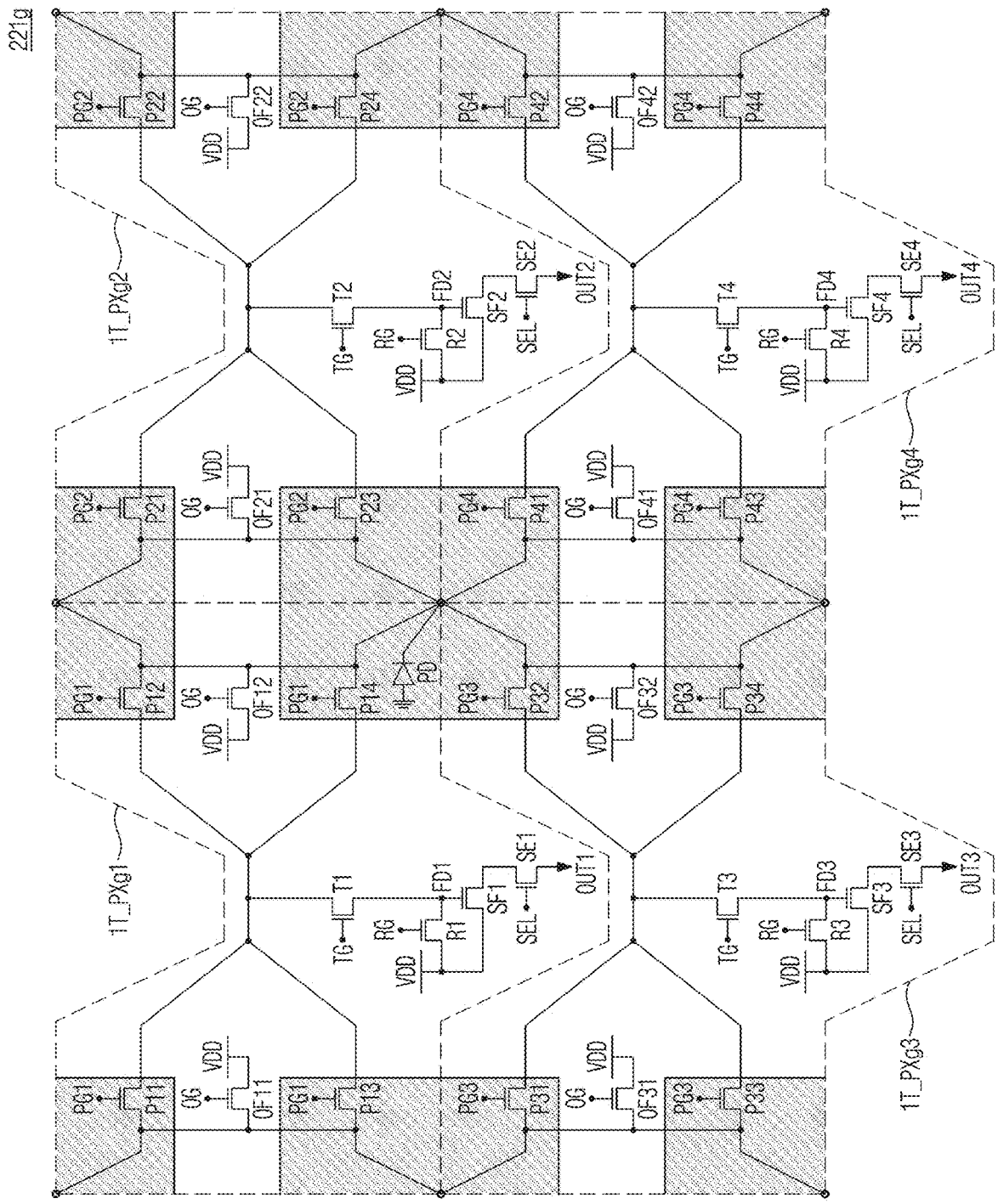
Figure 10C:
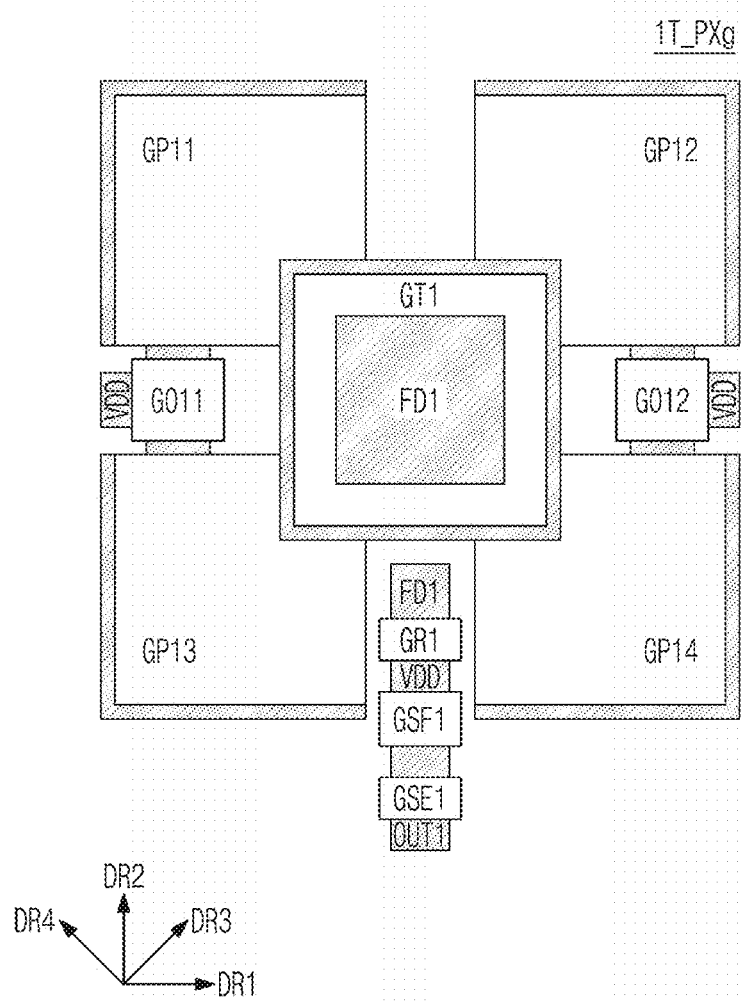
Figure 10D:
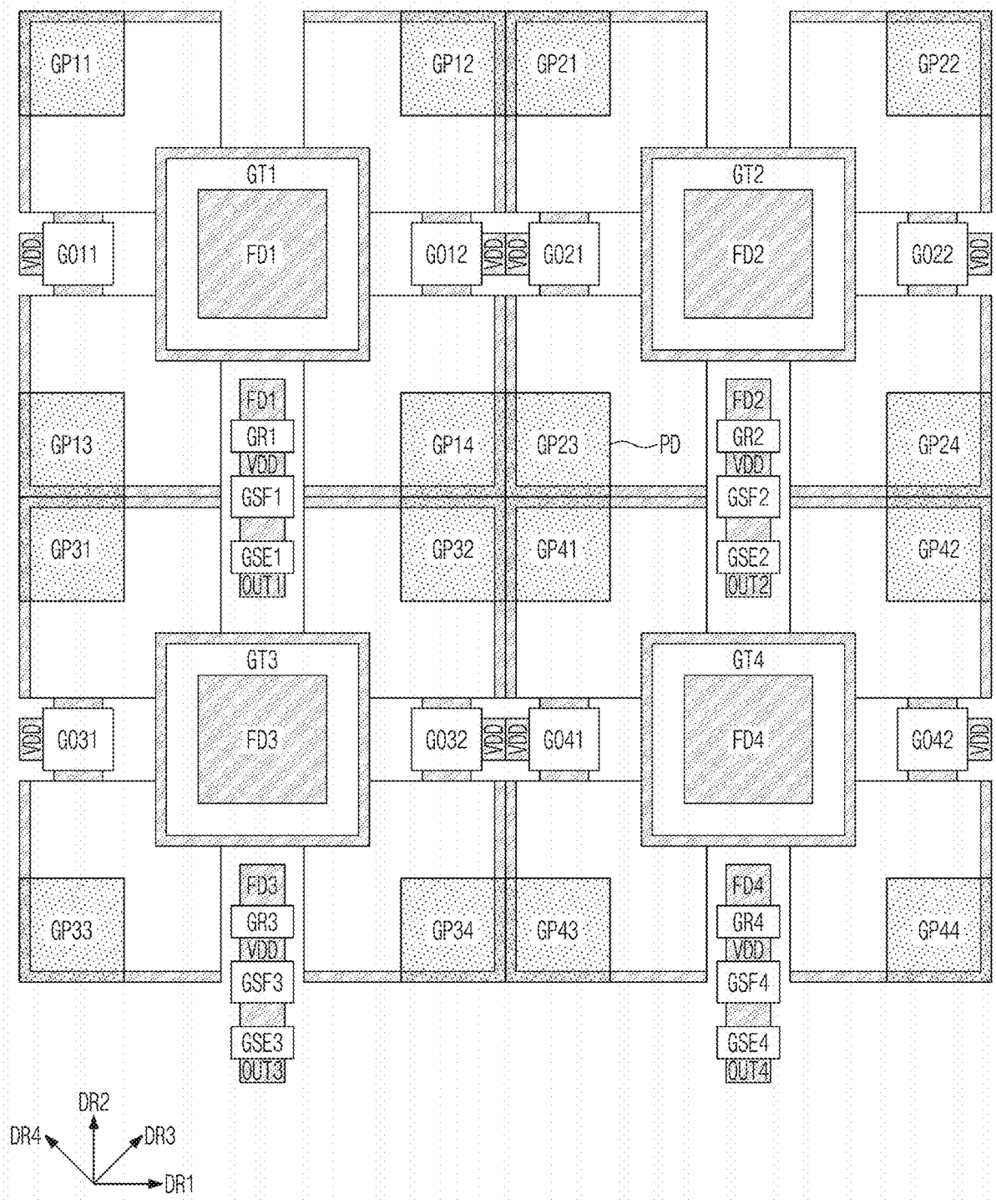

FIG. 10B illustrates a circuit diagram of a pixel array including a pixel of FIG. 10A according to at least one example embodiment. A pixel array 221g may include a plurality of pixels, such as 1T_PXg1 to 1T_PXg4, and may operate in a similar manner to the pixel array 221a. FIG. 10C illustrates a layout of a pixel of FIG. 10A according to at least one example embodiment. A description will be focused on the differences between a layout of the pixel 1T_PXg of FIG. 10C and the layout of the pixel 1T_PXa of FIG. 4C. The gate electrodes GT11 to GT14 of the pixel 1T_PXa may be respectively integrated into the gate electrodes GP11 to GP14. The layout of the pixel 1T_PXg may not include the gate electrode GS1 of the pixel 1T_PXa. FIG. 10D illustrates a layout of a pixel array of FIG. 10B according to at least one example embodiment. Each of the layers of the layouts 1T_PXg1 to 1T_PXg4 of the pixel array 221g may be substantially the same as the layout of the pixel 1T_PXg of FIG. 10C, but are not limited thereto.

Figure 11A:
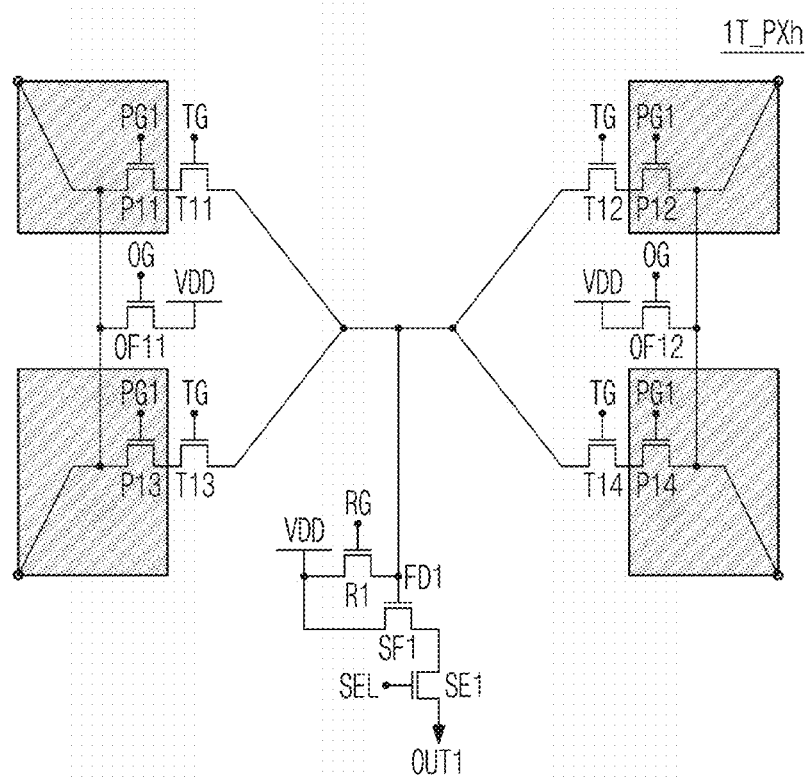

FIG. 11A illustrates a circuit diagram of a pixel of FIGS. 3A to 3C according to some example embodiments. A pixel 1T_PXh may be the pixel 1T_PX of the pixel array 221, but are not limited thereto. A description will be focused on the differences between the pixel 1T_PXh and the pixel 1T_PXg. The pixel 1T_PXh may include the transfer transistors T11 to T14 that operate similar to the transfer transistor T1 of the pixel 1T_PXg and are respectively connected between the photo transistors P11 to P14 and the floating diffusion region FD1. The transfer transistor T1 of the pixel 1T_PXg may be distributed into the transfer transistors T11 to T14 of the pixel 1T_PXh.

Figure 11B:
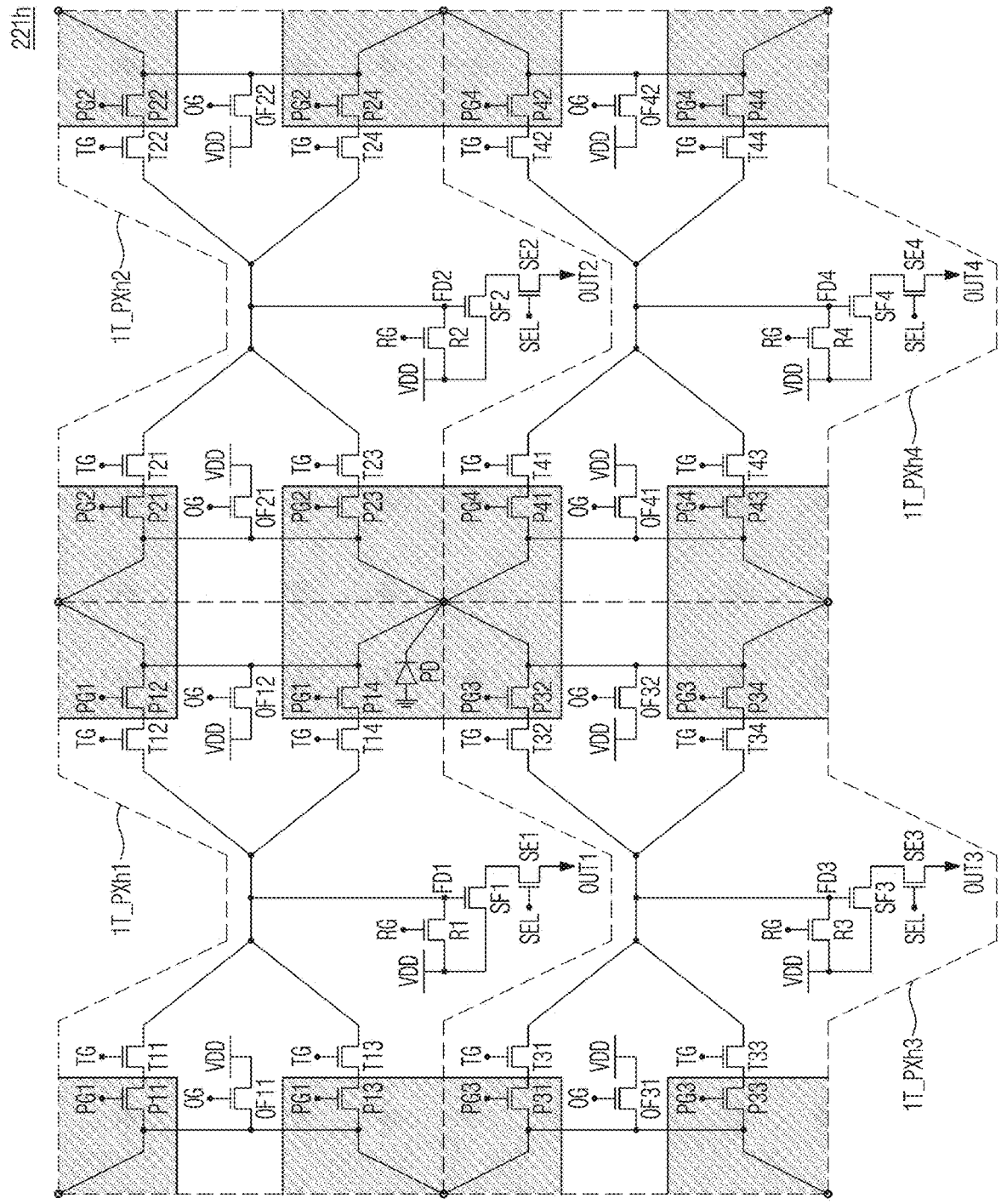
Figure 11C:
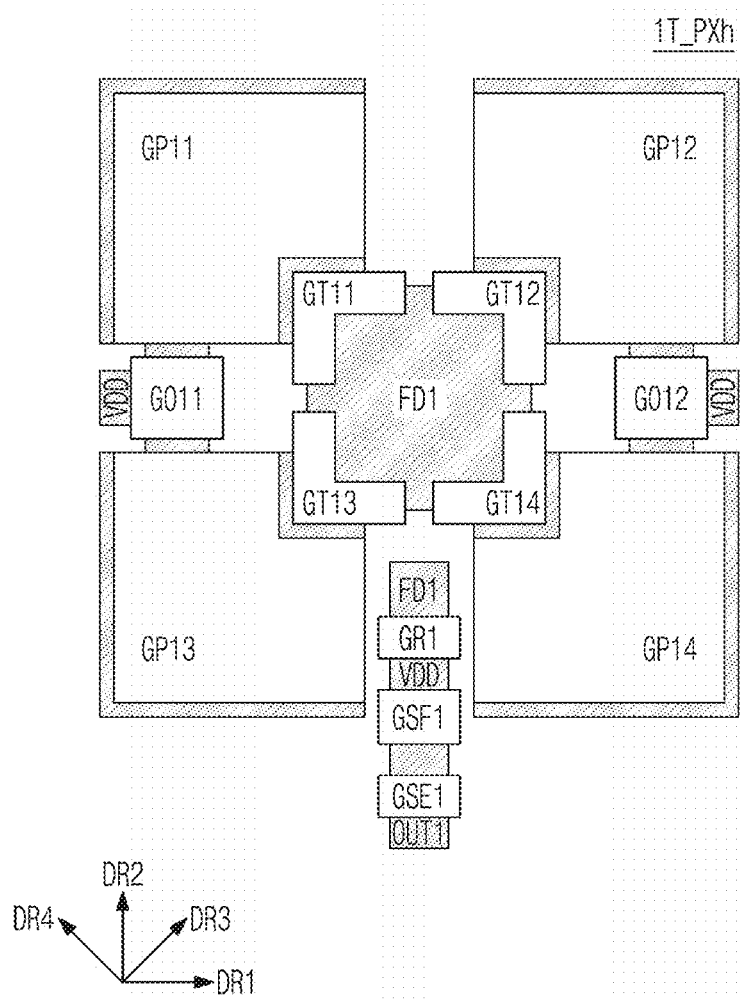
Figure 11D:
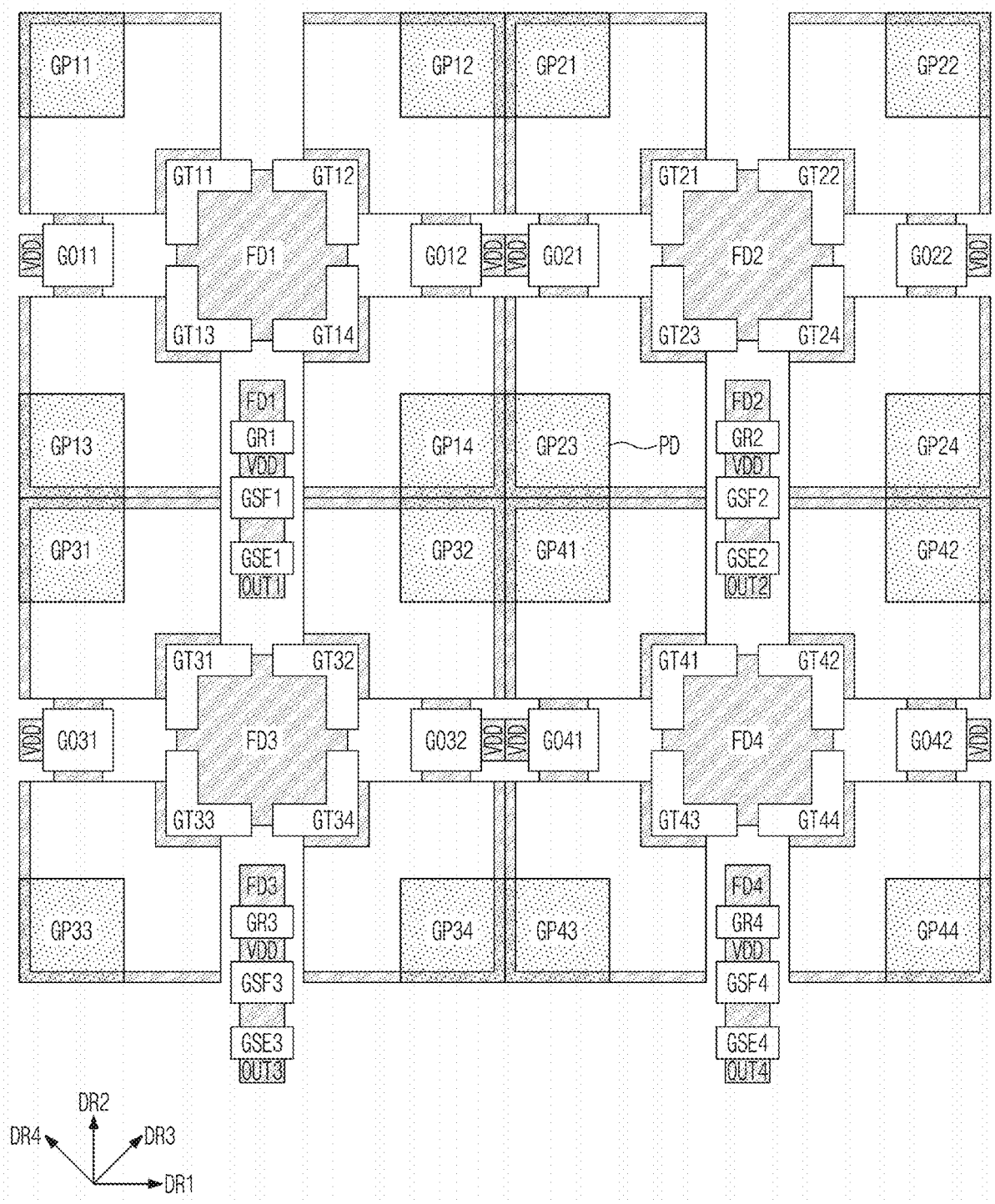

FIG. 11B illustrates a circuit diagram of a pixel array including a pixel of FIG. 11A according to at least one example embodiment. A pixel array 221h may include a plurality of pixels, such as 1T_PXh1 to 1T_PXh4, and may operate in a similar manner to the pixel array 221g. FIG. 11C illustrates a layout of a pixel of FIG. 11A according to at least one example embodiment. A description will be focused on the differences between a layout of the pixel 1T_PXh of FIG. 11C and the layout of the pixel 1T_PXg of FIG. 10C. The gate electrode GT1 of the pixel 1T_PXg may be divided into the gate electrodes GT11 to GT14 of the pixel 1T_PXh. The gate electrodes GT11 and GT14 may be respectively disposed between the gate electrode GP11 and the floating diffusion region FD1, and between the gate electrode GP14 and the floating diffusion region FD1 along the direction DR4. The gate electrodes GT12 and GT13 may be respectively disposed between the gate electrode GP12 and the floating diffusion region FD1, and between the gate electrode GP13 and the floating diffusion region FD1 along the direction DR3. FIG. 11D illustrates a layout of a pixel array of FIG. 11B according to at least one example embodiment. Each of the layouts of the pixels 1T_PXh1 to 1T_PXh4 of the pixel array 221h may be substantially the same as the layout of the pixel 1T_PXh of FIG. 11C, but are not limited thereto.

Figure 12A:
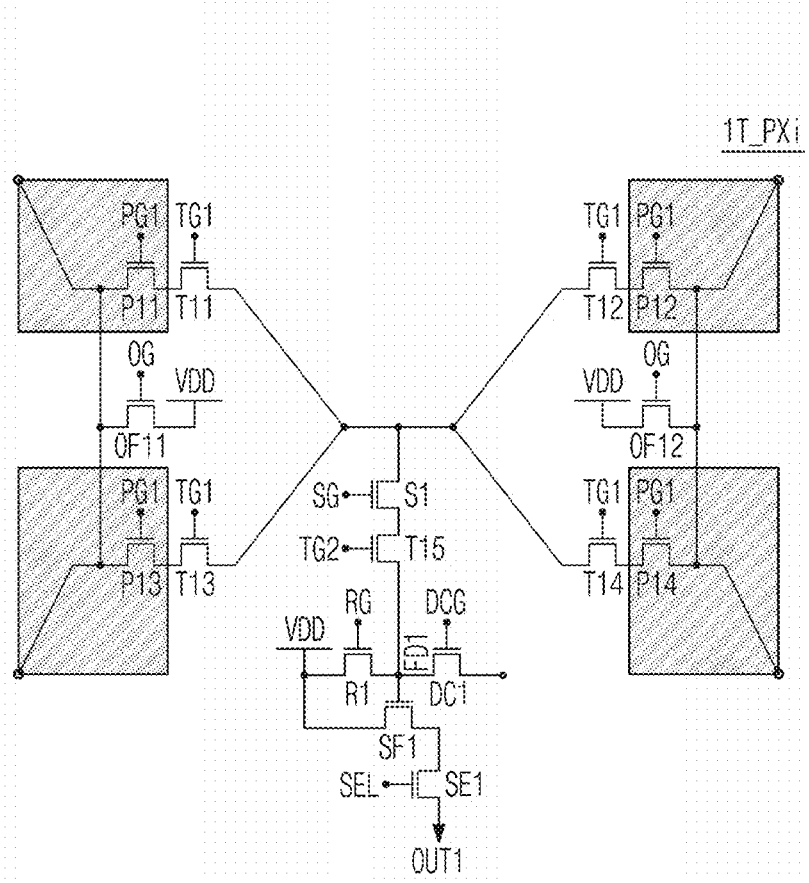

FIG. 12A illustrates a circuit diagram of a pixel of FIGS. 3A to 3C according to some example embodiments. A pixel 1T_PXi may be the pixel 1T_PX of the pixel array 221, but is not limited thereto. A description will be focused on the differences between the pixel 1T_PXi and the pixel 1T_PXa. The pixel 1T_PXi may further include a dual conversion transistor DC1 connected to the floating diffusion region FD1. The dual conversion transistor DC1 may change (convert) or adjust a capacitance of the floating diffusion region FD1, that is, the FWC, based on a dual conversion gate signal DG. For example, the dual conversion transistor DC1 may operate as a MOS capacitor, but is not limited thereto. The dual conversion transistor DC1 may be connected between the floating diffusion region FD1 and the power supply voltage GND or VDD, or between the floating diffusion region FD1 and the reset transistor R1, etc. As another example, the dual conversion transistor DC1 may operate as a switch, and the pixel 1T_PXi may further include a capacitor (not illustrated) connected between the dual conversion transistor DC1 and the power supply voltage GND or VDD, etc.

Figure 12B:
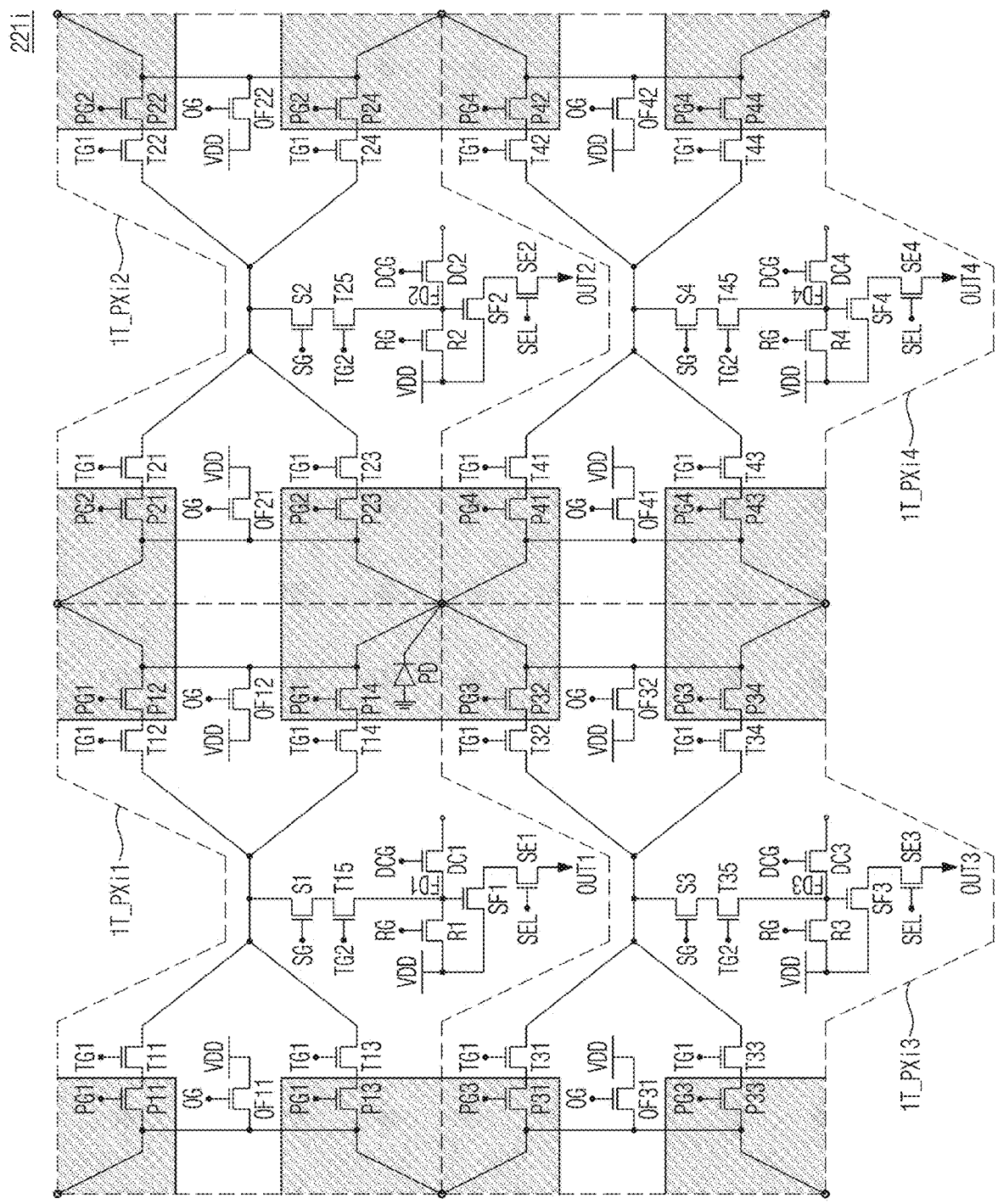
Figure 12C:
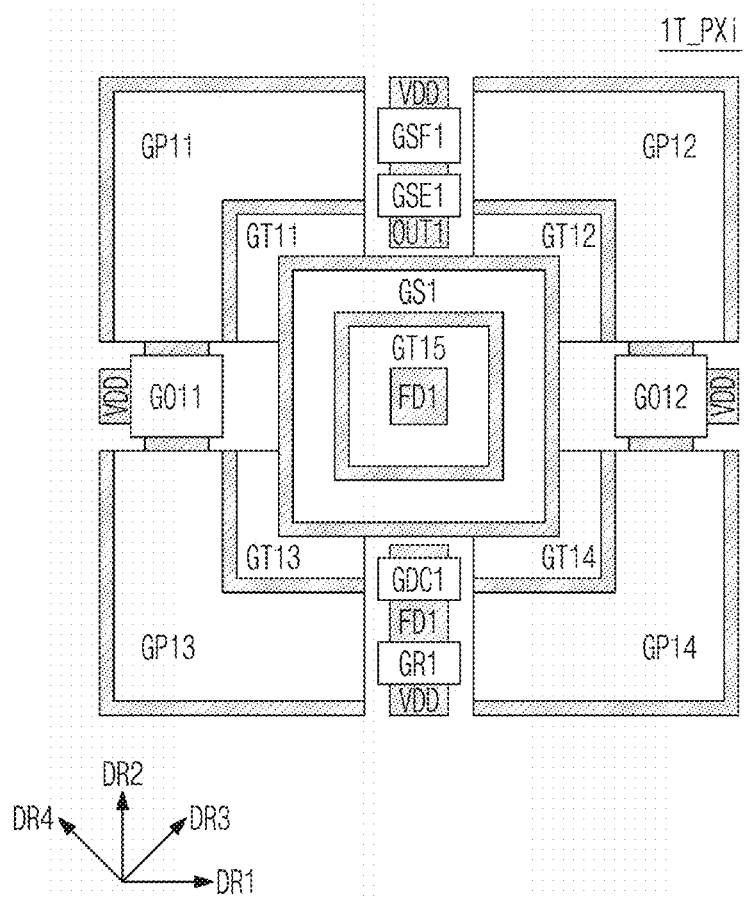
Figure 12D:
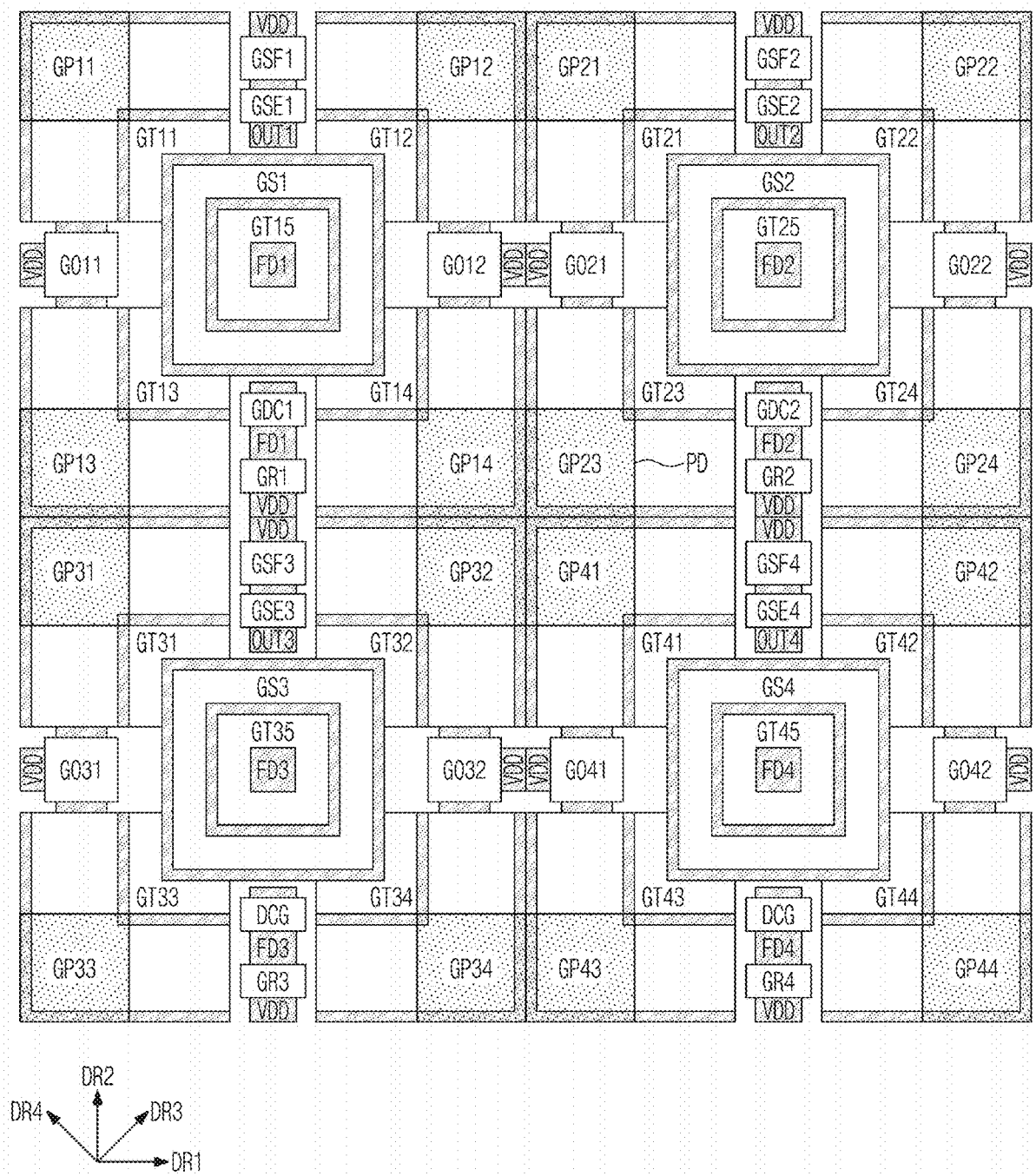

FIG. 12B illustrates a circuit diagram of a pixel array including a pixel of FIG. 12A according to at least one example embodiment. A pixel array 221i may include pixels 1T_PXi1 to 1T_PXi4, and may operate in a similar manner to the pixel array 221a. FIG. 12C illustrates a layout of a pixel of FIG. 12A according to at least one example embodiment. A description will be focused on the differences between a layout of the pixel 1T_PXi and the layout of the pixel 1T_PXa of FIG. 4C. A gate electrode GDC1 of the dual conversion transistor DC1 may be disposed adjacent to the floating diffusion region FD1. The gate electrode GR1 of the reset transistor R1 and the gate electrode GDC1 of the dual conversion transistor DC1 may be interposed between the gate electrodes GP13 and GP14. The gate electrode GSF1 of the source follower transistor SF1 and the gate electrode GSE1 of the selection transistor SE1 may be interposed between the gate electrodes GP11 and GP12. FIG. 12D illustrates a layout of a pixel array of FIG. 12B according to at least one example embodiment. Each of the layouts of the pixels 1T_PXi1 to 1T_PXi4 of the pixel array 221i may be substantially the same as the layout of the pixel 1T_PXi of FIG. 12C, but are not limited thereto.

Figure 12E:
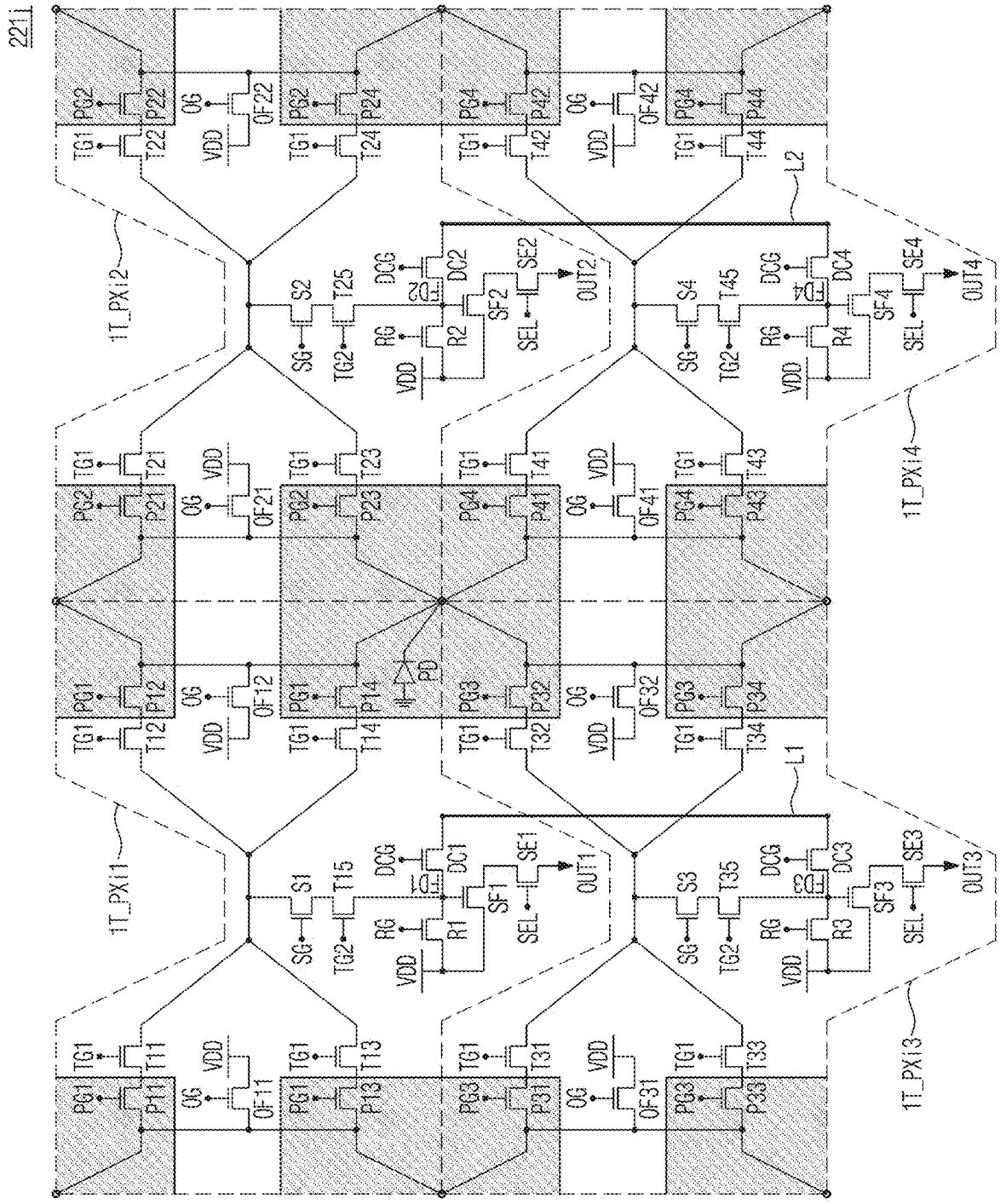
Figure 12F:
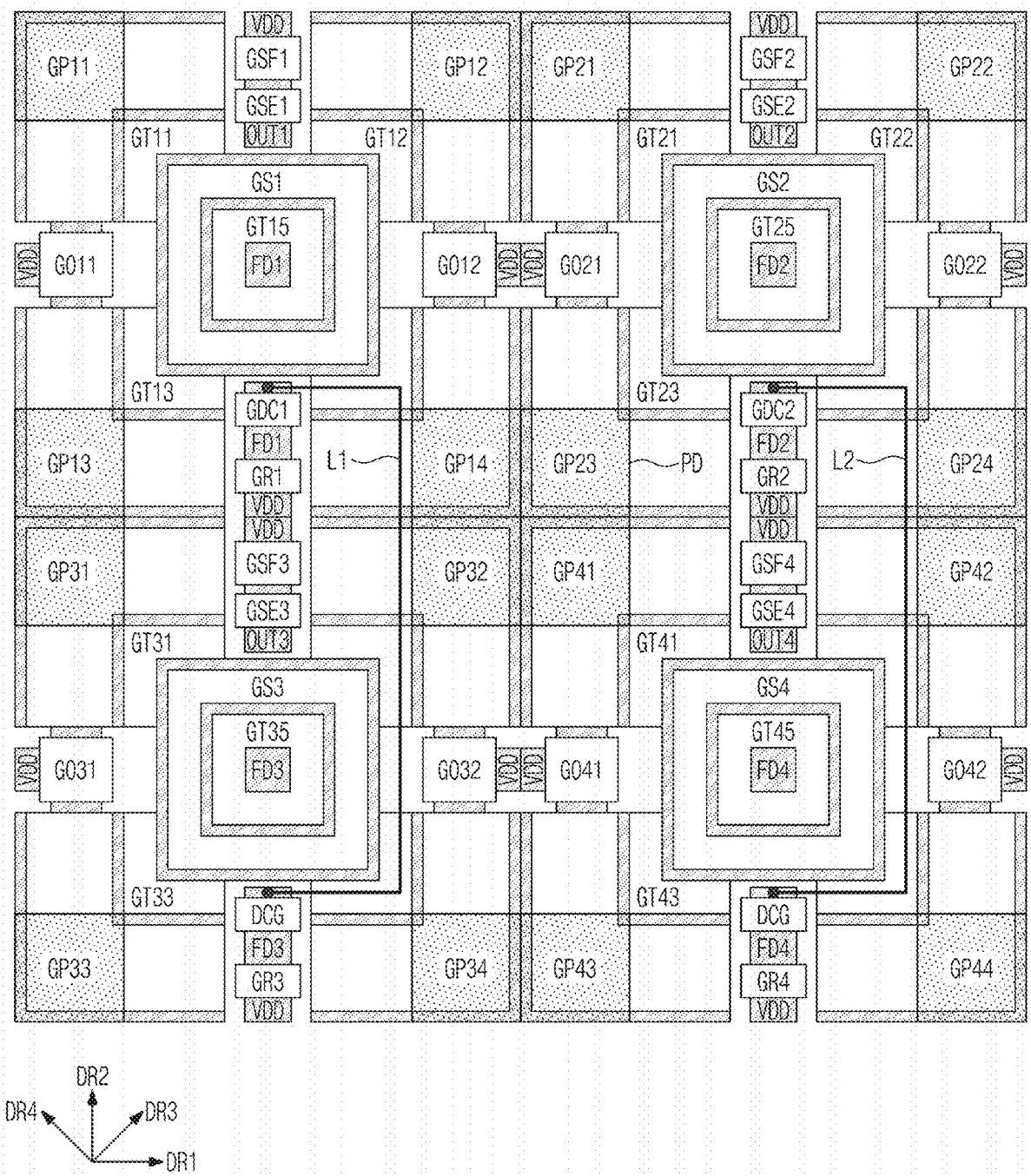

FIG. 12E illustrates a circuit diagram of a pixel array including a pixel of FIG. 12A according to at least one example embodiment. A description will be focused on the differences between a pixel array 221j and the pixel array 221i. First ends of the dual conversion transistors DC1 and DC3 of the pixels 1T_PXi1 and 1T_PXi3 may be electrically connected through a metal wire L1. First ends of the dual conversion transistors DC2 and DC4 of the pixels 1T_PXi2 and 1T_PXi4 may be electrically connected through a metal wire L2. The floating diffusion regions FD1 and FD3 of the pixels 1T_PXi1 and 1T_PXi3 may be electrically connected through a metal wire (not illustrated). Floating diffusion regions FD2 and FD4 of the pixels 1T_PXi2 and 1T_PXi4 may be electrically connected through a metal wire (not illustrated). FIG. 12F illustrates a layout of a pixel array of FIG. 12E according to at least one example embodiment. Unlike the layout of the pixel array 221$i$, the metal wires L1 and L2 may be provided on/above the pixel array 221$j$, but are not limited thereto.

Figure 12G:
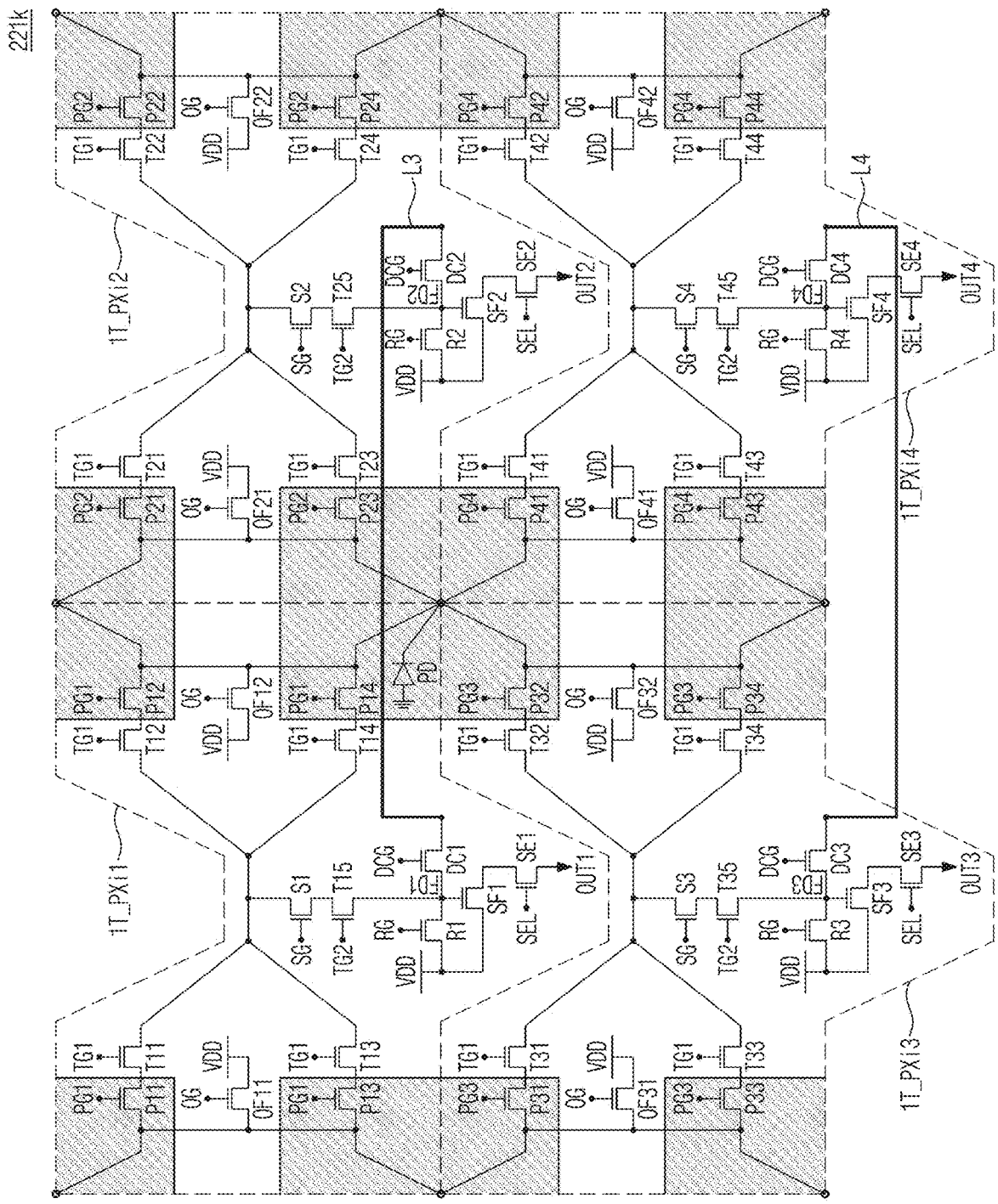
Figure 12H:
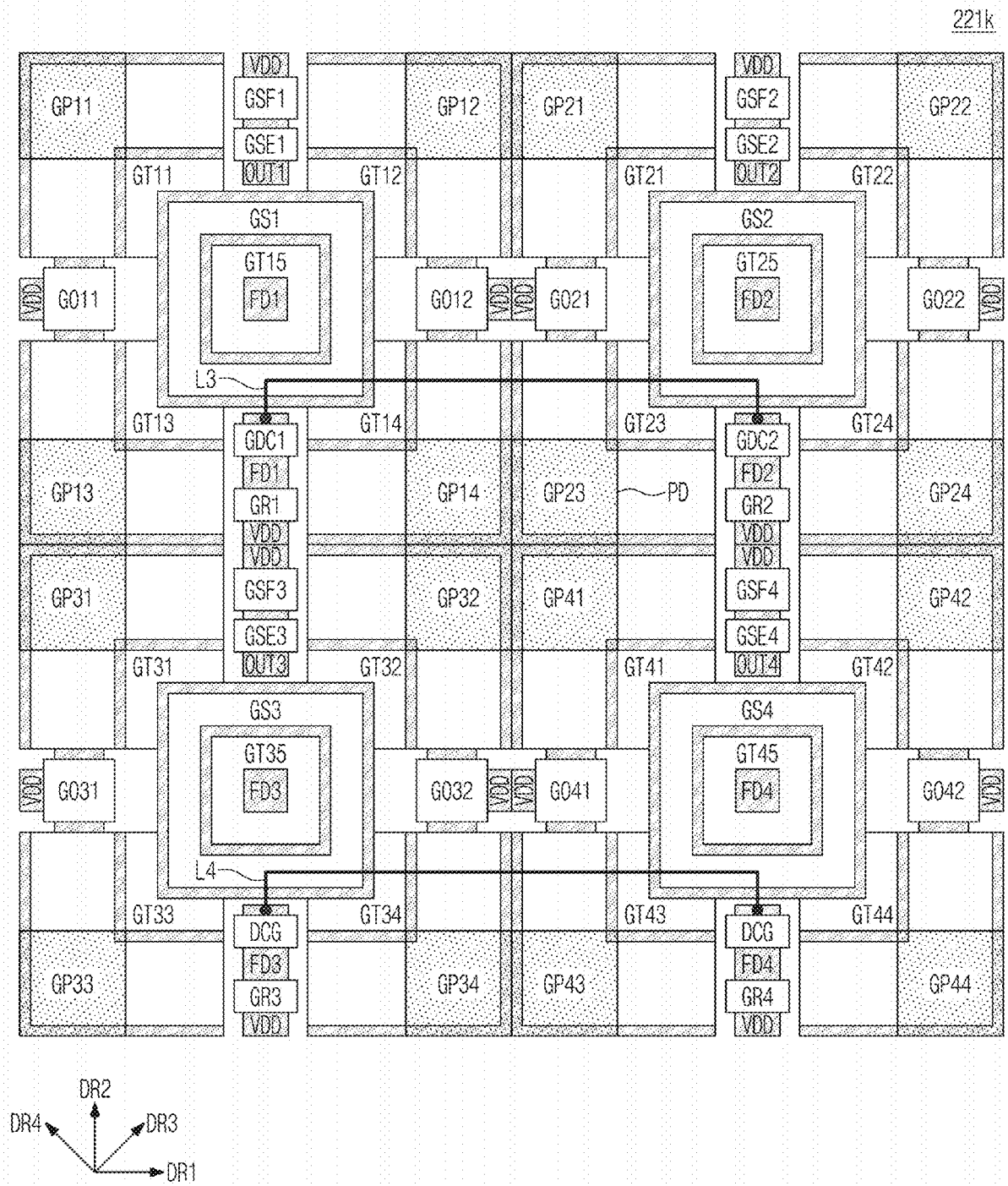

FIG. 12G illustrates a circuit diagram of a pixel array of FIGS. 3A to 3C according to some example embodiments. A description will be focused on the differences between a pixel array 221$k$ and the pixel array 221$i$. The first ends of the dual conversion transistors DC1 and DC2 of the pixels 1T_PXi1 and 1T_PXi2 may be electrically connected through a metal wire L3. The first ends of the dual conversion transistors DC3 and DC4 of the pixels 1T_PXi3 and 1T_PXi4 may be electrically connected through a metal wire L4. The floating diffusion regions FD1 and FD2 of the pixels 1T_PXi1 and 1T_PXi2 may be electrically connected through a metal wire (not illustrated). The floating diffusion regions FD3 and FD4 of the pixels 1T_PXi3 and 1T_PXi4 may be electrically connected through a metal wire (not illustrated). FIG. 12H illustrates a layout of a pixel array of FIG. 12G according to at least one example embodiment. Unlike the layout of the pixel array 221$i$, the metal wires L3 and L4 may be provided on/above the pixel array 221$k$, but are not limited thereto.

Figure 12I:
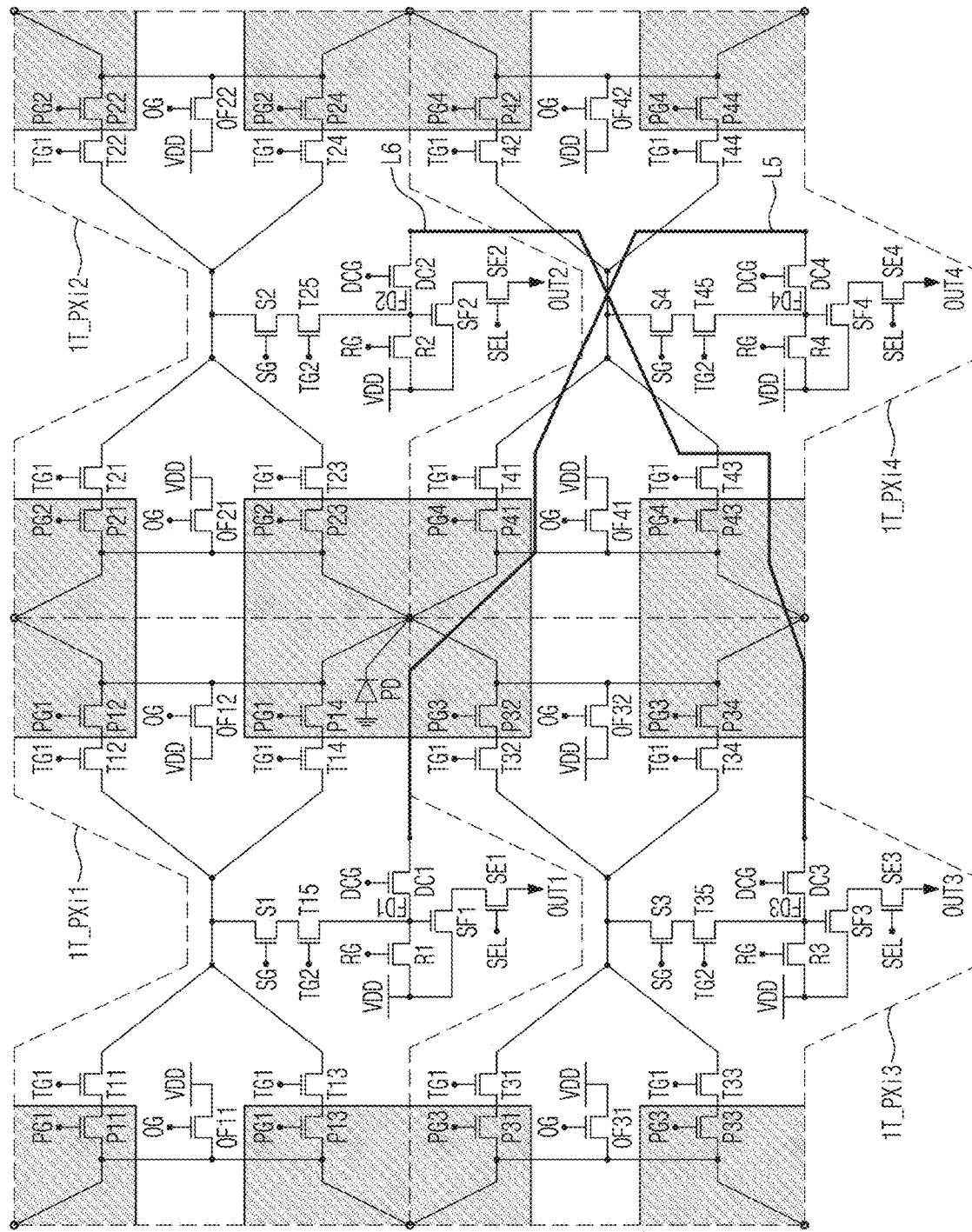
Figure 12J:
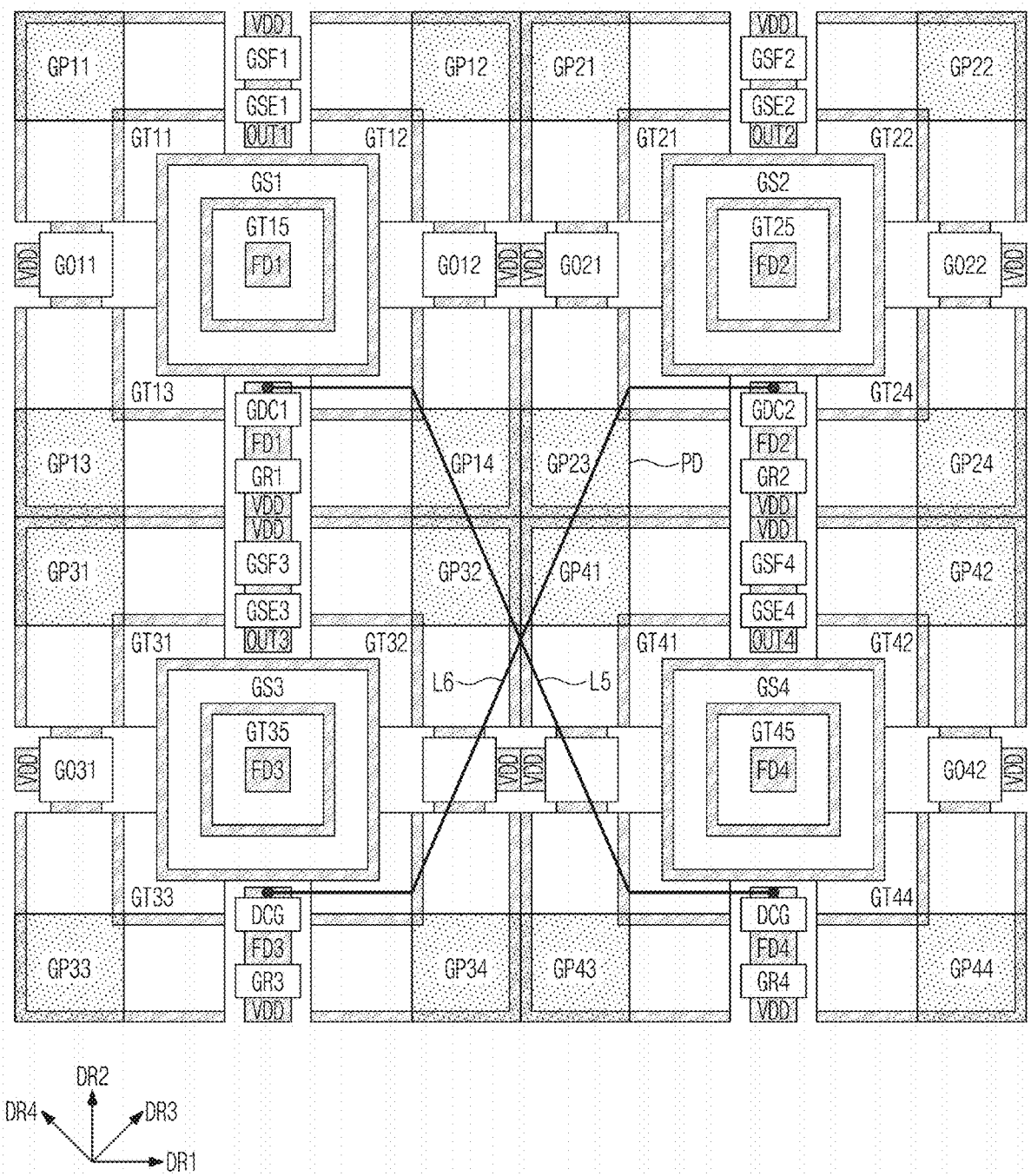

FIG. 12I illustrates a circuit diagram of a pixel array of FIGS. 3A to 3C according to some example embodiments. A description will be focused on the differences between a pixel array 221$l$ and the pixel array 221$i$. The first ends of the dual conversion transistors DC1 and DC4 of the pixels 1T_PXi1 and 1T_PXi4 may be electrically connected through a metal wire L5. The first ends of the dual conversion transistors DC2 and DC3 of the pixels 1T_PXi2 and 1T_PXi3 may be electrically connected through a metal wire L6. The floating diffusion regions FD1 and FD4 of the pixels 1T_PXi1 and 1T_PXi4 may be electrically connected through a metal wire (not illustrated). The floating diffusion regions FD2 and FD3 of the pixels 1T_PXi2 and 1T_PXi3 may be electrically connected through a metal wire (not illustrated). FIG. 12J illustrates a layout of a pixel array of FIG. 12I according to at least one example embodiment. Unlike the layout of the pixel array 221$i$, the metal wires L5 and L6 may be provided on/above the pixel array 221$l$, but is not limited thereto.

Figure 13A:
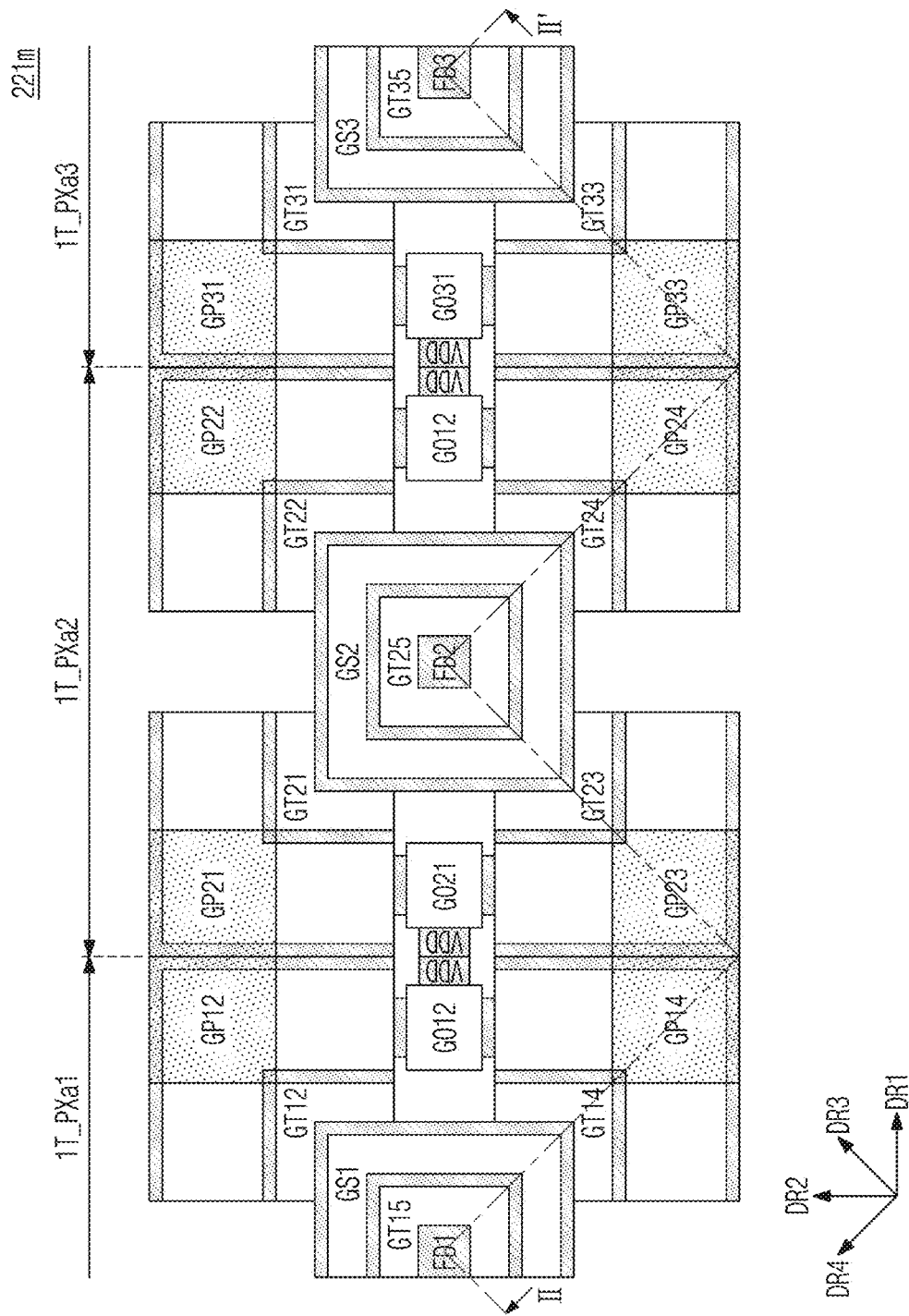

FIG. 13A illustrates a layout of a pixel array of FIG. 4B according to at least one example embodiment. Layouts of the pixels 1T_PXa1 to 1T_PXa3 of a pixel array 221$m$ arranged along the direction DR1 are illustrated in FIG. 13A. Each of the layers of the pixels 1T_PXa1 to 1T_PXa3 may be substantially the same as the layout of the pixel 1T_PXa of FIG. 4C, but are not limited thereto. A portion of each of the layouts of the pixels 1T_PXa1 and 1T_PXa3 is omitted.

Figure 13B:
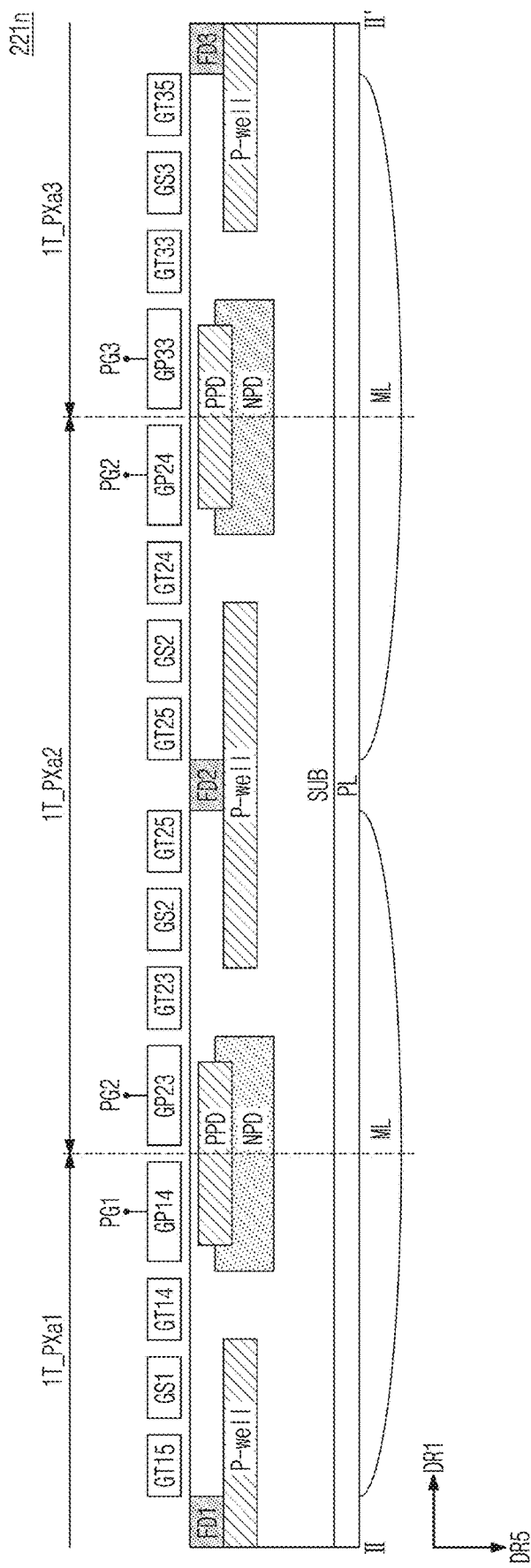
Figure 13C:
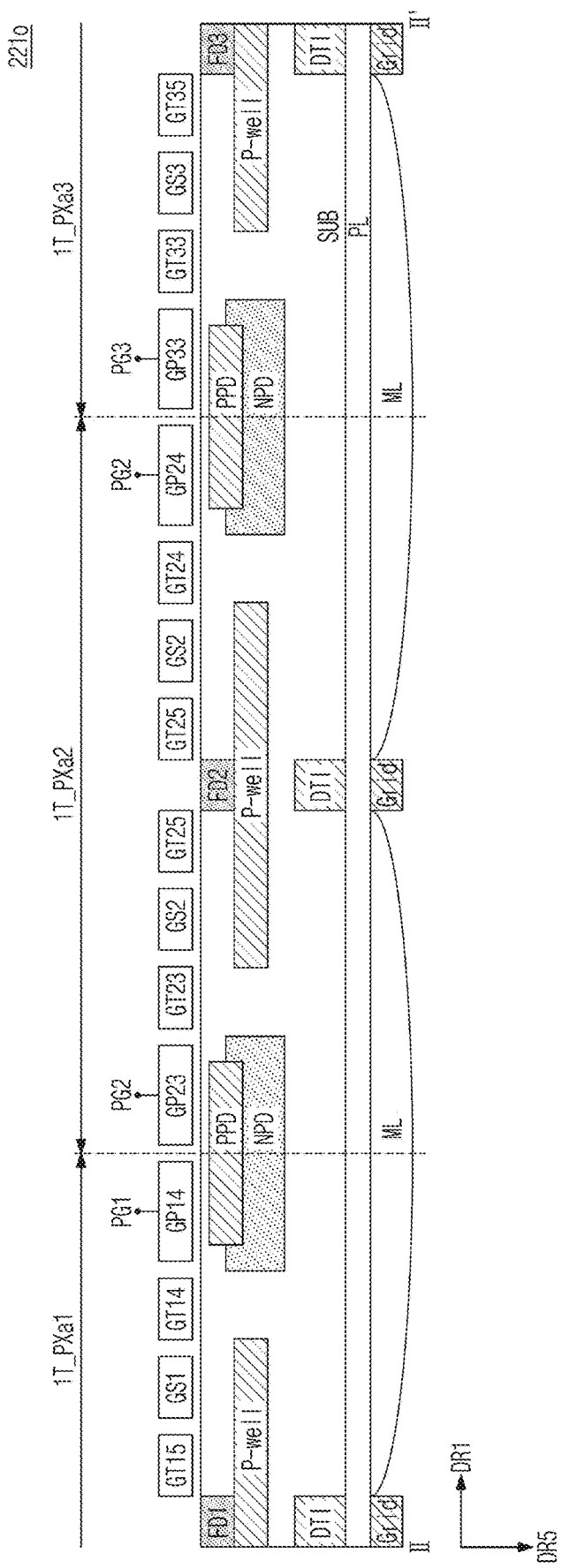

FIG. 13B illustrates a cross-sectional view 220$n$ of a pixel array taken along a line II-IF of FIG. 13A, according to at least one example embodiment. FIG. 13C illustrates a cross-sectional view 220$o$ of a pixel array taken along a line II-IF of FIG. 13A, according to another example embodiment. As in the substrate SUB of FIG. 2C, the substrate SUB of FIGS. 13B and 13C may include light detecting regions (each including an NPD region and a PPD region) of the pixels 1T_PXa1 to 1T_PXa3, a plurality of floating diffusion regions FD1 to FD3, and P-well regions, but are not limited thereto. As in the substrate SUB of FIG. 2C, a plurality of gate electrodes, such as GT15, GS1, GT14, GP14, GP23, GT23, GS2, GT25, GT25, GS2, GT24, GP24, GP33, GT33, GS3, and GT35, etc., may be formed on one surface of the substrate SUB of FIGS. 13B and 13C, and the planarization layer PL may be formed on an opposite surface of the substrate SUB, but the example embodiments are not limited thereto. Micro lenses ML may be formed on the planarization layer PL along the direction DR5. The micro lenses ML may condense the light signal RL incident onto the back surface of the substrate SUB and may provide the light signal RL to the substrate SUB. In a plan view, the center of one micro lens ML may not be aligned with any one of the centers of the pixels 1T_PXa1 to 1T_PXa3 and may be placed on a boundary between the pixels 1T_PXa1 and 1T_PXa2 or on a boundary between the pixels 1T_PXa2 and 1T_PXa3, etc.

Referring to FIG. 13C, according to at least one example embodiment, the substrate SUB may include deep trench isolation (DTI) regions. The DTI regions may decrease and/or prevent the light signal RL incident onto each of the pixels 1T_PXa1 to 1T_PXa3 from being leaked out to any other pixel(s) or charges generated by the light signal RL from being transferred to any other pixel(s). For example, the DTI regions may include an oxide, a dielectric, a metal, or the like. Metal grid regions may be further formed on/above the substrate SUB. The metal grid regions may separate the micro lenses ML and may decrease and/or prevent the light signal RL or an external light from being incident directly onto the plurality of floating diffusion regions FD1, FD2, and FD3, etc. For example, the metal grid regions may include tungsten, but is not limited thereto. In a plan view, the DTI regions and the metal grid regions may be placed on the centers of the plurality of pixels, such as 1T_PXa1 to 1T_PXa3, but is not limited thereto.

As illustrated in FIG. 13C, in a plan view, the DTI regions and the floating diffusion regions FD1 to FD3 may overlap each other, or the metal grid regions and the floating diffusion regions FD1 to FD3 may overlap each other. Unlike the example illustrated in FIG. 13C, according to at least one other example embodiment, in the case where the storage transistors S1 to S3 are placed on the centers of the pixels 1T_PXa1 to 1T_PXa3 in a plan view (refer to FIGS. 4E, 4F, 7E, and 7F), the DTI regions and the storage transistors S1 to S3 may overlap each other in a plan view, or the metal grid regions and the storage transistors S1 to S3 may overlap each other in a plan view. Unlike the example illustrated in FIG. 13C, according to at least one other example embodiment, in the case where the storage transistors S12, S22, S32, and S42 described with reference to FIGS. 5A to 5D and 8A to 8D are placed on the centers of the pixels 1T_PXb and 1T_PXe, the DTI regions and the storage transistors S12, S22, S32, and S42 may overlap each other in a plan view, or the metal grid regions and the storage transistors S12, S22, S32, and S42 may overlap each other in a plan view.

Figure 14A:
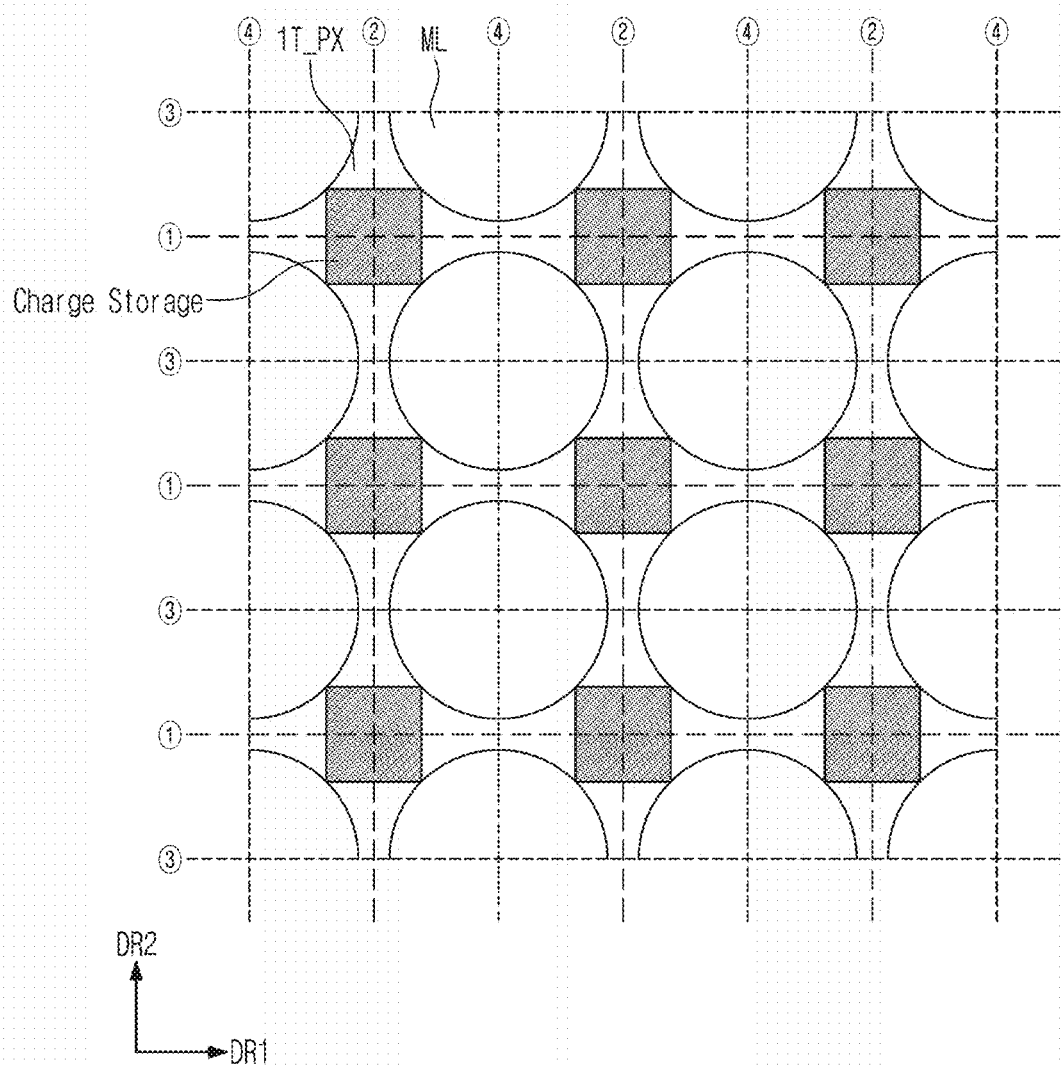
Figure 14C:
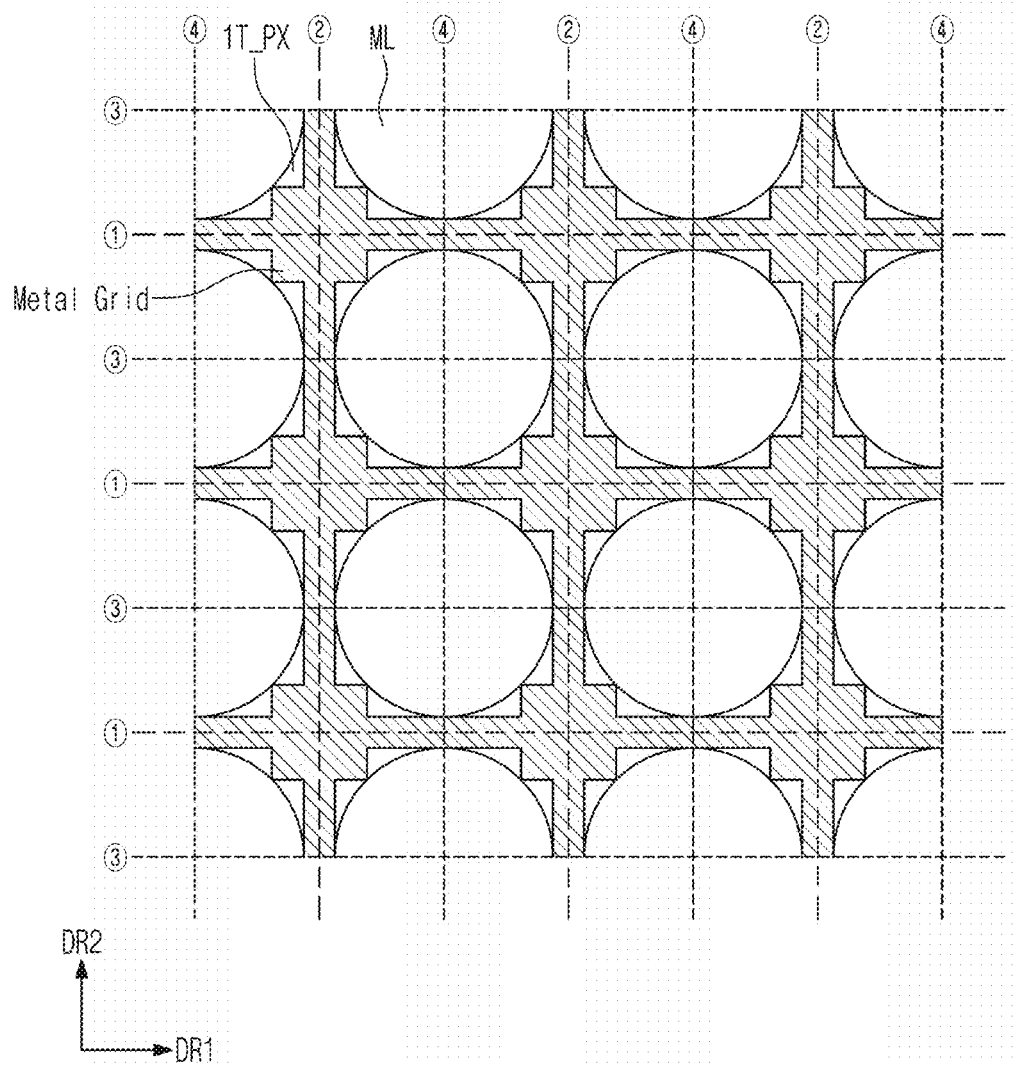

FIGS. 14A to 14C illustrate a pixel array of FIGS. 3A to 3C in a plan view according to some example embodiments. A pixel array 221$p$ may include pixels 1T_PX. Centers of the pixels 1T_PX are respectively placed at intersections of the imaginary lines ① and ②. The pixels 1T_PX may include charge storages including the floating diffusion region FD1 or the storage transistors S1, S11, and S12 of the pixels 1T_PXa to 1T_PXi described above. The charge storages may be placed on the centers of the pixels 1T_PX.

Micro lenses ML may be disposed on/above the pixel array 221p. The centers of the micro lenses ML may be at intersections of imaginary lines ① and ②. In a plan view, the imaginary lines ③ and ④ do not overlap the imaginary lines ① and ②. The pixels 1T_PX may be separated with respect to the imaginary lines ③ and ④. In a plan view, the micro lenses ML may not overlap the charge storages of the pixels 1T_PX.

Referring to FIG. 14B, according to at least one example embodiment, a pixel array 221q may include the DTI region unlike the pixel array 221p. In a plan view, the DTI region may be disposed or formed along the imaginary lines ① and ②. Referring to FIG. 14C, the metal grid region may be formed on/above a pixel array 221r, unlike the pixel arrays 221p and 221q. In a plan view, the metal grid region may be disposed or formed along the imaginary lines ① and ②. In a plan view, the metal grid region may overlap the charge storages, but is not limited thereto.

Figure 15:
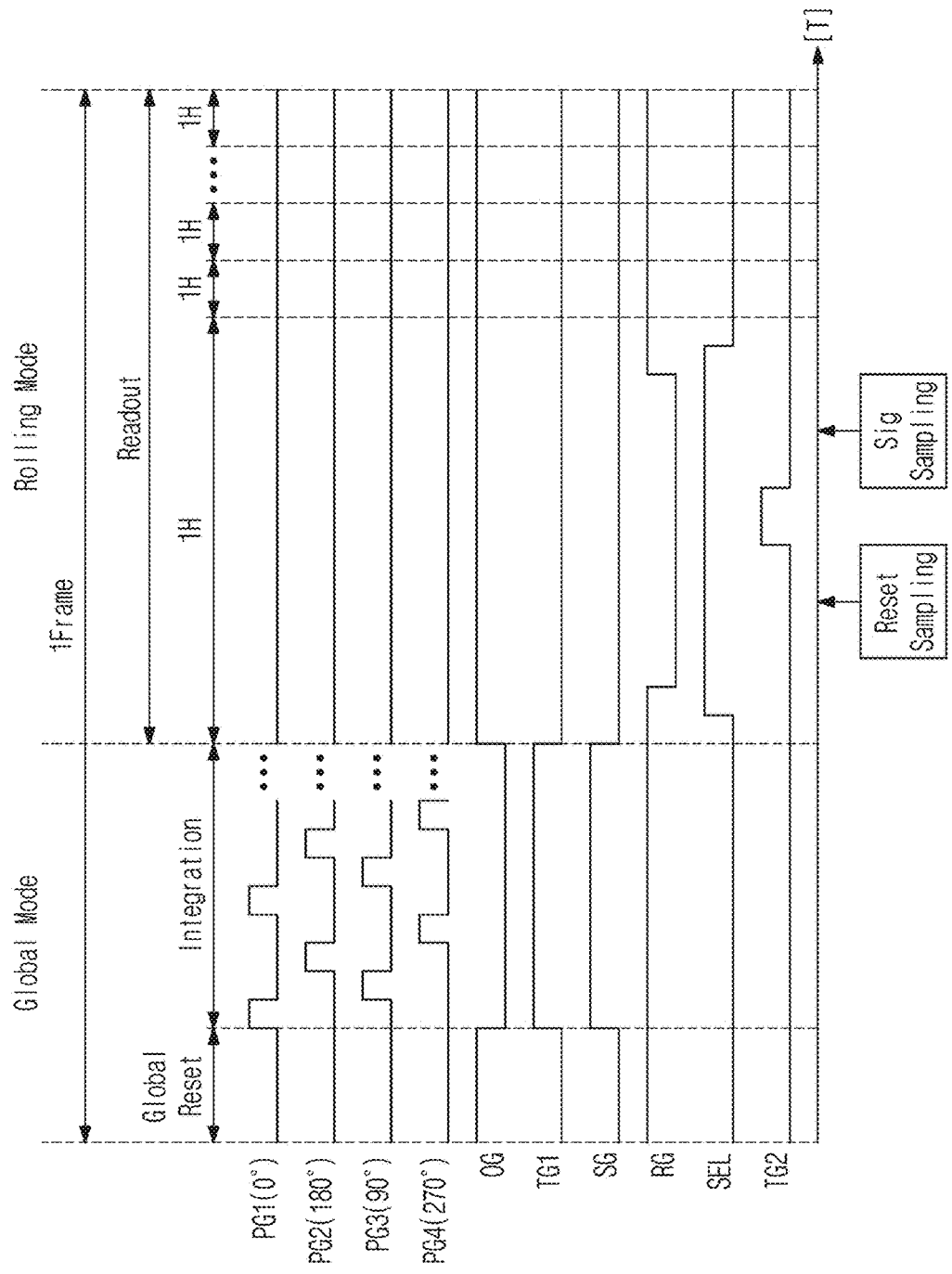
FIG. 15 illustrates a timing diagram of a pixel array of FIG. 1 according to some example embodiments.

FIG. 15 illustrates a timing diagram of signals applied to pixels of FIG. 4B according to at least one example embodiment. FIG. 15 will be described with reference to the pixel 1T_PXa, but the signals of FIG. 15 may be also used to control the remaining pixels, such as 1T_PXb to 1T_PXi described above, as well as the pixel 1T_PXa. The timing diagram of the signals of FIG. 15 may indicate a period (e.g., time period, clock cycle, etc.) for reading one frame and may be repeated. A period for reading one frame may be divided into an interval of a global mode where all of the pixels 1T_PXa of the pixel array 221a operate at the same time, and an interval of a rolling mode where the pixels 1T_PXa operate in the units of row (e.g., each pixel in a row of pixels operates at the same time, etc.).

During a global reset period of the global mode, all the pixels 1T_PXa of the pixel array 221a may be reset. As the overflow gate signal OG is activated, the overflow transistors OF11 to OF42 may remove charges integrated by the photo transistors P11 to P44. As the transfer gate signal TG1 is deactivated, the transfer transistors T11 to T44 may decrease and/or prevent charges from being transferred from the plurality of photo transistors, e.g., P11 to P44, to the plurality of floating diffusion regions, e.g., FD1 to FD4.

During an integration period of the global mode, the plurality of photo transistors, e.g., P11 to P44, may integrate charges based on the plurality of photo gate signals, e.g., PG1 to PG4. The overflow gate signal OG may be deactivated, and the transfer gate signal TG1 may be activated. The charges integrated by the plurality of photo transistors P11 to P14 may be stored in the floating diffusion region FD1 of the pixel 1T_PXa1 through the plurality of transfer transistors T11 to T14. The plurality of pixels 1T_PXa2 to 1T_PXa4 may operate in a similar manner as the pixel 1T_PXa1, but are not limited thereto.

A readout period of the rolling mode may be divided into a plurality of 1 H times. The 1 H time may indicate a time and/or interval for reading pixels arranged along one row of the pixel array. The plurality of pixels, e.g., 1T_PXa1 to 1T_PXa4, etc., may be arranged along at least one or more rows. For ease of illustration, an example is illustrated in FIG. 15 as the signals TG1, TG2, SG, RG, and SEL are applied in common to the pixels 1T_PXa1 to 1T_PXa4, but the example embodiments are not limited thereto, and for example, the signals TG1, TG2, SG, RG, and SEL that are applied to the pixels 1T_PXa1 to 1T_PXa4 may be divided depending on a row, etc.

After the integration period, the readout circuits of the plurality of pixels, e.g., 1T_PXa1 to 1T_PXa4, may each output a respective output signals, e.g., OUT1 to OUT4, corresponding to reset levels of the plurality of floating diffusion regions, e.g., FD1 to FD4 (Reset Sampling). After the output signals OUT1 to OUT4 corresponding to the reset levels are output, as the transfer gate signal TG2 is activated and is deactivated, the plurality of transfer transistors, e.g., T15, T25, T35, and T45, may be turned on and may be turned off, and thus, charges stored in the plurality of storage transistors, e.g., S1 to S4, may be transmitted to the plurality of floating diffusion regions FD1 to FD4. For example, the readout circuits of the pixels 1T_PXa1 to 1T_PXa4 may respectively output the output signals OUT1 to OUT4 corresponding to signal levels of the floating diffusion regions FD1 to FD4, which are respectively determined by charges integrated by the respective photo transistors P11 to P14, P21 to P24, P31 to P34, and P41 to P44 (Sig Sampling), etc.

The pixel 1T_PX according to at least one example embodiment of the inventive concepts may include a single tap, and therefore may have a smaller size than a conventional pixel 4T_PX which includes 4 taps, etc. An FPN of a pixel array including the single-tap pixel 1T_PX may be lower than an FPN of a conventional pixel array including the 4-tap pixels 4T_PX. A conventional pixel including a single tap may store only a part of the charges integrated by a photoelectric conversion element and may discard the remaining charges. Advantageously, the single-tap pixels 1T_PX of the example embodiments share the photoelectric conversion element, and therefore may store all of the charges integrated by the photoelectric conversion element without discarding any charges. Additionally, the sensitivity of the pixel 1T_PX of at least one example embodiment may be higher than that of a conventional pixel including a single tap due to the pixel 1T_PX's ability to store all of the integrated charges without discarding any charges. Moreover, the components of the above-described pixels 1T_PXa to 1T_PXi may be mutually combined. Reference symbols/numbers are repeatedly used in drawings to indicating components of the same or similar pixels.

According to at least one example embodiment of the inventive concepts, a pixel may include one tap and the pixel may be miniaturized and/or may be reduced in size in comparison to conventional pixels. An FPN of a pixel array including the pixel may decrease. The pixel may integrate charges from a photoelectric conversion element shared with adjacent pixels, and therefore may have a higher sensitivity.

While the inventive concepts has been described with reference to example embodiments thereof, it will be apparent to those of ordinary skill in the art that various changes and modifications may be made thereto without departing from the spirit and scope of the inventive concepts as set forth in the following claims.

What is claimed is:

1. A depth sensor comprising:
   a first pixel including a plurality of first photo transistors, each of the plurality of first photo transistors configured to receive a first photo gate signal;
   a second pixel including a plurality of second photo transistors, each of the plurality of second photo transistors configured to receive a second photo gate signal;
   a third pixel including a plurality of third photo transistors, each of the plurality of third photo transistors configured to receive a third photo gate signal;
   a fourth pixel including a plurality of fourth photo transistors, each of the plurality of fourth photo transistors configured to receive a fourth photo gate signal; and
   a first photoelectric conversion element configured to be shared by at least one first photo transistor of the plurality of first photo transistors, at least one second photo transistor of the plurality of second photo transistors, at least one third photo transistor of the plurality of third photo transistors, and at least one fourth photo transistor of the plurality of fourth photo transistors.

2. The depth sensor of claim 1, wherein
the at least one first to fourth photo transistors are adjacent to each other; and
the first photoelectric conversion element and the at least one first to fourth photo transistors overlap each other in a plan view.

3. The depth sensor of claim 1, further comprising:
a micro lens overlapping the first to fourth pixels in a plan view,
wherein a center of the micro lens is at an intersection of the first to fourth pixels in the plan view.

4. The depth sensor of claim 1, further comprising:
a substrate including the first to fourth pixels and a deep trench isolation; and
the deep trench isolation passing through centers of the first to fourth pixels in a plan view.

5. The depth sensor of claim 1, wherein
the first pixel further includes a first floating diffusion region configured to store charges integrated by the at least one first photo transistor;
the second pixel further includes a second floating diffusion region configured to store charges integrated by the at least one second photo transistor;
the third pixel further includes a third floating diffusion region configured to store charges integrated by the at least one third photo transistor;
the fourth pixel further includes a fourth floating diffusion region configured to store charges integrated by the at least one fourth photo transistor; and
the depth sensor further comprises,
a metal grid region passing through centers of the first to fourth pixels in a plan view, and the metal grid region overlapping the first to fourth floating diffusion regions in the plan view.

6. The depth sensor of claim 1, wherein a phase of the first photo gate signal is different from at least one phase of phases of the second to fourth photo gate signals.

7. The depth sensor of claim 1, wherein the first pixel further includes:
a first floating diffusion region configured to store charges integrated by the plurality of first photo transistors; and
readout circuitry connected to the first floating diffusion region.

8. The depth sensor of claim 7, further comprising:
fifth to ninth pixels adjacent to the first pixel;
the first photoelectric conversion element is configured to be shared by the first to fourth pixels;
a second photoelectric conversion element configured to be shared by the first, fifth, sixth, and eighth pixels;
a third photoelectric conversion element configured to be shared by the first, second, sixth, and seventh pixels; and
a fourth photoelectric conversion element configured to be shared by the first, third, eighth, and ninth pixels.

9. The depth sensor of claim 1, wherein
the first pixel further includes a first floating diffusion region and a first dual conversion transistor connected to the first floating diffusion region, the first floating diffusion region configured to store charges integrated by the first photo transistor;
the second pixel further includes a second floating diffusion region and a second dual conversion transistor connected to the second floating diffusion region, the second floating diffusion region configured to store charges integrated by the second photo transistor;
the third pixel further includes a third floating diffusion region and a third dual conversion transistor connected to the third floating diffusion region, the third floating diffusion region configured to store charges integrated by the third photo transistor; and
the fourth pixel further includes a fourth floating diffusion region and a fourth dual conversion transistor connected to the fourth floating diffusion region, the fourth floating diffusion region configured to store charges integrated by the fourth photo transistor.

10. The depth sensor of claim 9, wherein
the first to fourth pixels are adjacent to each other along first and second directions perpendicular to each other in a plan view; and
one end of the first dual conversion transistor is electrically connected to one end of one of the second to fourth dual conversion transistors.

11. A depth sensor comprising:
a first pixel including a first photo transistor and a second photo transistor, the first photo transistor and the second photo transistor each configured to receive a first photo gate signal;
a second pixel including a third photo transistor and a fourth photo transistor, the third photo transistor and the fourth photo transistor each configured to receive a second photo gate signal;
a third pixel including a fifth photo transistor and a sixth photo transistor, the fifth photo transistor and the sixth photo transistor each configured to receive a third photo gate signal;
a first photoelectric conversion element configured to,
generate first charges corresponding to a received light signal,
transfer the first charges to the second and third photo transistors, and
be shared by the first and second pixels; and
a second photoelectric conversion element configured to,
generate second charges corresponding to the received light signal,
transfer the second charges to the fourth and fifth photo transistors, and
be shared by the second and third pixels.

12. The depth sensor of claim 11, wherein
the first photoelectric conversion element overlaps the second and third photo transistors of the first and second pixels in a plan view; and
the second photoelectric conversion element overlaps the fourth and fifth photo transistors of the second and third pixels in the plan view.

13. The depth sensor of claim 11, wherein
the first to third pixels are arranged along a first direction in a plan view; and
the first and second photoelectric conversion elements are arranged along the first direction in the plan view.

* * * * *